US012751194B2

(12) United States Patent
Kubota et al.

(10) Patent No.: US 12,751,194 B2
(45) Date of Patent: Sep. 29, 2026

(54) DISPLAY APPARATUS HAVING LIGHT-EMITTING ELEMENT AND LIGHT-RECEIVING ELEMENT

(71) Applicant: SEMICONDUCTOR ENERGY LABORATORY CO., LTD., Atsugi (JP)

(72) Inventors: Daisuke Kubota, Atsugi (JP); Ryo Hatsumi, Hadano (JP); Rai Sato, Tochigi (JP); Masataka Nakada, Tochigi (JP); Yasutaka Nakazawa, Tochigi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 338 days.

(21) Appl. No.: 18/692,873

(22) PCT Filed: Sep. 22, 2022

(86) PCT No.: PCT/IB2022/058946
§ 371 (c)(1),
(2) Date: Mar. 18, 2024

(87) PCT Pub. No.: WO2023/052913
PCT Pub. Date: Apr. 6, 2023

(65) Prior Publication Data
US 2024/0389441 A1 Nov. 21, 2024

(30) Foreign Application Priority Data
Sep. 30, 2021 (JP) ................................ 2021-161385

(51) Int. Cl.
*H10K 59/80* (2023.01)
*H10K 39/34* (2026.01)

(52) U.S. Cl.
CPC ......... *H10K 59/8792* (2023.02); *H10K 39/34* (2023.02); *H10K 59/879* (2023.02)

(58) Field of Classification Search
CPC ............. H10K 59/8792; H10K 59/879; H10K 59/121; H10K 59/122; H10K 59/8051;
(Continued)

(56) References Cited

U.S. PATENT DOCUMENTS 8,314,782 B2 11/2012 Ino et al.
8,884,509 B2 11/2014 Matsukura
(Continued)

FOREIGN PATENT DOCUMENTS

CN 101452137 A 6/2009
CN 108962951 A 12/2018
(Continued)

OTHER PUBLICATIONS

International Search Report (Application No. PCT/IB2022/058946) Dated Dec. 20, 2022.
(Continued)

*Primary Examiner* — William B Partridge
*Assistant Examiner* — Chevy J Boegel
(74) *Attorney, Agent, or Firm* — NIXON PEABODY LLP; Jeffrey L. Costellia

(57) ABSTRACT

A display apparatus having an image capturing function is provided. Noise in image capturing is reduced. The display apparatus includes a first pixel electrode, a second pixel electrode, a first organic layer, a second organic layer, a common electrode, a spacer, a protective layer, and a light-blocking layer. The first organic layer is provided over the first pixel electrode. The second organic layer is provided over the second pixel electrode. The common electrode includes a portion overlapping with the first pixel electrode with the first organic layer positioned therebetween and a
(Continued)

portion overlapping with the second pixel electrode with the second organic layer positioned therebetween. The protective layer is provided to cover the common electrode. The spacer has a light-transmitting property with respect to visible light and includes a portion overlapping with the first pixel electrode with the protective layer, the common electrode, and the first organic layer positioned therebetween. The light-blocking layer is provided over the spacer and includes an opening overlapping with the second pixel electrode. The first organic layer includes a photoelectric conversion layer, and the second organic layer includes a light-emitting layer.

13 Claims, 25 Drawing Sheets

(58) Field of Classification Search
CPC .. H10K 59/8052; H10K 59/00; H10K 59/126; H10K 59/65; H10K 39/34; H10K 50/00; H10K 30/81; G09F 9/30; H05B 33/02; H05B 33/04; H05B 33/12; H05B 33/22
See application file for complete search history.

(56) References Cited

U.S. PATENT DOCUMENTS

| | | | | |
|---|---|---|---|---|
| 9,088,006 | B2 | 7/2015 | Yamazaki et al. | |
| 9,370,074 | B2 | 6/2016 | Kurokawa | |
| 9,450,133 | B2 | 9/2016 | Nakamura et al. | |
| 9,627,648 | B2 | 4/2017 | Yamazaki et al. | |
| 9,817,520 | B2 | 11/2017 | Ikeda et al. | |
| 10,003,047 | B2 | 6/2018 | Yamazaki et al. | |
| 10,032,834 | B2 * | 7/2018 | Udaka | H10K 39/34 |
| 10,115,777 | B2 | 10/2018 | Tanaka et al. | |
| 10,381,599 | B2 | 8/2019 | Yamazaki et al. | |
| 10,579,855 | B2 | 3/2020 | Zeng et al. | |
| 10,636,931 | B1 | 4/2020 | Shibata et al. | |
| 10,903,453 | B2 | 1/2021 | Yamazaki et al. | |
| 11,487,373 | B2 | 11/2022 | Kubota et al. | |
| 11,621,407 | B2 | 4/2023 | Yamazaki et al. | |
| 11,839,106 | B2 | 12/2023 | Yamazaki et al. | |
| 2006/0262242 | A1 | 11/2006 | Koma | |
| 2008/0309850 | A1 | 12/2008 | Tanase et al. | |
| 2009/0146967 | A1 | 6/2009 | Ino et al. | |
| 2014/0340363 | A1 | 11/2014 | Ikeda et al. | |
| 2017/0125506 | A1 | 5/2017 | Kim | |
| 2017/0288001 | A1 | 10/2017 | Ito | |
| 2018/0089491 | A1 | 3/2018 | Kim et al. | |
| 2019/0013368 | A1 | 1/2019 | Chung et al. | |
| 2019/0123120 | A1 | 4/2019 | Oh et al. | |
| 2020/0083302 | A1 | 3/2020 | Park et al. | |
| 2020/0135959 | A1 * | 4/2020 | Shibata | H10F 77/953 |
| 2021/0096678 | A1 | 4/2021 | Kubota et al. | |
| 2021/0327979 | A1 | 10/2021 | Kamada et al. | |
| 2022/0157902 | A1 | 5/2022 | Park et al. | |
| 2022/0173174 | A1 | 6/2022 | Hatsumi et al. | |
| 2023/0032743 | A1 | 2/2023 | Kubota et al. | |
| 2023/0117024 | A1 | 4/2023 | Kubota et al. | |
| 2024/0099054 | A1 | 3/2024 | Yamazaki et al. | |

FOREIGN PATENT DOCUMENTS

| | | | |
|---|---|---|---|
| CN | 111129204 | A | 5/2020 |
| CN | 112366217 | A | 2/2021 |
| CN | 112578933 | A | 3/2021 |
| CN | 112673488 | A | 4/2021 |
| EP | 3624194 | A | 3/2020 |
| JP | 2009-139597 | A | 6/2009 |
| JP | 2011-039125 | A | 2/2011 |
| JP | 2014-197522 | A | 10/2014 |
| JP | 2015-005280 | A | 1/2015 |
| JP | 2018-049042 | A | 3/2018 |
| JP | 2018-206410 | A | 12/2018 |
| JP | 2020-122968 | A | 8/2020 |
| JP | 2021-057039 | A | 4/2021 |
| KR | 2020-0030222 | A | 3/2020 |
| KR | 2021-0037556 | A | 4/2021 |
| KR | 2021-0055699 | A | 5/2021 |
| TW | 202013783 | | 4/2020 |
| TW | 202117694 | | 5/2021 |
| WO | WO-2015/144298 | | 10/2015 |
| WO | WO-2020/053692 | | 3/2020 |

OTHER PUBLICATIONS

Written Opinion (Application No. PCT/IB2022/058946) Dated Dec. 20, 2022.

* cited by examiner

9101

9102

9200

9201

9201

9201

DISPLAY APPARATUS HAVING LIGHT-EMITTING ELEMENT AND LIGHT-RECEIVING ELEMENT

TECHNICAL FIELD

One embodiment of the present invention relates to a display apparatus. One embodiment of the present invention relates to an image capturing device. One embodiment of the present invention relates to a display apparatus having an image capturing function.

Note that one embodiment of the present invention is not limited to the above technical field. Examples of the technical field of one embodiment of the present invention disclosed in this specification and the like include a semiconductor device, a display apparatus, a light-emitting apparatus, a power storage device, a memory device, an electronic device, a lighting device, an input device, an input/output device, a driving method thereof, and a manufacturing method thereof. A semiconductor device refers to any device that can function by utilizing semiconductor characteristics.

BACKGROUND ART

In recent years, display apparatuses have been required to have higher resolution in order to display high-definition images. In addition, display apparatuses used in information terminal devices such as smartphones, tablet terminals, or laptop PCs (personal computers) have been required to have lower power consumption as well as higher resolution. Furthermore, display apparatuses have been required to have a variety of functions such as a touch panel function and a function of capturing images of fingerprints for authentication, in addition to a function of displaying images.

Light-emitting apparatuses including light-emitting elements have been developed as display apparatuses, for example. Light-emitting elements (also referred to as EL elements) utilizing an electroluminescence (also referred to as EL) phenomenon have features such as ease of reduction in thickness and weight, high-speed response to an input signal, and driving with a direct-constant voltage source, and have been used in display apparatuses. For example, Patent Document 1 discloses a flexible light-emitting apparatus including an organic EL element.

REFERENCE

Patent Document

[Patent Document 1] Japanese Published Patent Application No. 2014-197522

SUMMARY OF THE INVENTION

Problems to be Solved by the Invention

An object of one embodiment of the present invention is to provide a display apparatus having an image capturing function. Another object is to provide a high-resolution image capturing device or a high-resolution display apparatus. Another object is to reduce noise in image capturing. Another object is to provide an image capturing device or a display apparatus capable of image capturing with high sensitivity. Another object is to provide a display apparatus or an image capturing device with a high aperture ratio. Another object is to provide a display apparatus capable of obtaining biological information such as fingerprints. Another object is to provide a display apparatus that functions as a touch panel.

An object of one embodiment of the present invention is to provide a highly reliable display apparatus, a highly reliable image capturing device, or a highly reliable electronic device. An object of one embodiment of the present invention is to provide a display apparatus, an image capturing device, an electronic device, or the like that has a novel structure. An object of one embodiment of the present invention is to at least alleviate at least one of problems of the conventional technique.

Note that the description of these objects does not preclude the presence of other objects. In one embodiment of the present invention, there is no need to achieve all of these objects. Note that objects other than these can be derived from the description of the specification, the drawings, the claims, and the like.

Means for Solving the Problems

One embodiment of the present invention is a display apparatus including a first pixel electrode, a second pixel electrode, a first organic layer, a second organic layer, a common electrode, a spacer, a protective layer, and a light-blocking layer. The first organic layer is provided over the first pixel electrode. The second organic layer is provided over the second pixel electrode. The common electrode includes a portion overlapping with the first pixel electrode with the first organic layer positioned therebetween and a portion overlapping with the second pixel electrode with the second organic layer positioned therebetween. The protective layer is provided to cover the common electrode. The spacer has a light-transmitting property with respect to visible light and includes a portion overlapping with the first pixel electrode with the protective layer, the common electrode, and the first organic layer positioned therebetween. The light-blocking layer is provided over the spacer and includes an opening overlapping with the second pixel electrode. The first organic layer includes a photoelectric conversion layer, and the second organic layer includes a light-emitting layer.

In the above, the spacer preferably has an island-shaped top surface shape. The light-blocking layer is preferably provided to cover part of a top surface of the spacer and a side surface of the spacer.

In any of the above, in a plan view, the opening of the light-blocking layer is preferably positioned on an inner side than an outline of the first pixel electrode and positioned on an inner side than an outline of the first organic layer.

In any of the above, a lens is preferably further included. The lens is preferably provided in a position that is over the spacer and overlaps with the first pixel electrode. Furthermore, the lens preferably overlaps with the opening of the light-blocking layer, and the light-blocking layer preferably covers an end portion of the lens.

In any of the above, the spacer preferably has a function of transmitting light of a first color and absorbing light of a second color. Furthermore, the light-blocking layer preferably has a function of absorbing light of the first color and transmitting light of the second color. In the above, the light-blocking layer preferably includes a portion overlapping with the second organic layer. Furthermore, the second organic layer preferably has a function of emitting light including light of the second color.

In the above, the second organic layer preferably has a function of emitting white light.

In any of the above, a first insulating layer is preferably further included. The first insulating layer is preferably provided to cover an end portion of the first pixel electrode and an end portion of the second pixel electrode. Furthermore, the first organic layer and the second organic layer each preferably include a portion positioned over the first insulating layer.

In any of the above, a first side surface of the first organic layer and a second side surface of the second organic layer are preferably provided to face each other. The first organic layer preferably includes a portion where an angle formed by the first side surface and a bottom surface is greater than or equal to 45 degrees and less than or equal to 100 degrees. The second organic layer preferably includes a portion where an angle formed by the second side surface and a bottom surface is greater than or equal to 45 degrees and less than or equal to 100 degrees.

In the above, a second insulating layer is preferably further included. The second insulating layer preferably includes a portion in contact with the first side surface and a portion in contact with the second side surface. Furthermore, the second insulating layer preferably includes an inorganic insulating film.

In the above, a resin layer is preferably further included. The resin layer preferably includes a portion overlapping with the first organic layer with the second insulating layer positioned therebetween and a portion overlapping with the second organic layer with the second insulating layer positioned therebetween. The common electrode preferably includes a portion positioned over the resin layer. At this time, the spacer preferably includes a portion positioned over the resin layer.

Effect of the Invention

With one embodiment of the present invention, a display apparatus having an image capturing function can be provided. A high-resolution image capturing device or a high-resolution display apparatus can be provided. Noise in image capturing can be reduced. A display apparatus or an image capturing device with a high aperture ratio can be provided. An image capturing device or a display apparatus capable of image capturing with high sensitivity can be provided. A display apparatus capable of obtaining biological information such as fingerprints can be provided. A display apparatus that functions as a touch panel can be provided.

With one embodiment of the present invention, a highly reliable display apparatus, a highly reliable image capturing device, or a highly reliable electronic device can be provided. A display apparatus, an image capturing device, an electronic device, or the like that has a novel structure can be provided. At least one of problems of the conventional technique can at least be alleviated.

Note that the description of these effects does not preclude the presence of other effects. Note that one embodiment of the present invention does not need to have all of these effects. Note that effects other than these can be derived from the description of the specification, the drawings, the claims, and the like.

MODE FOR CARRYING OUT THE INVENTION

Figure 1A:
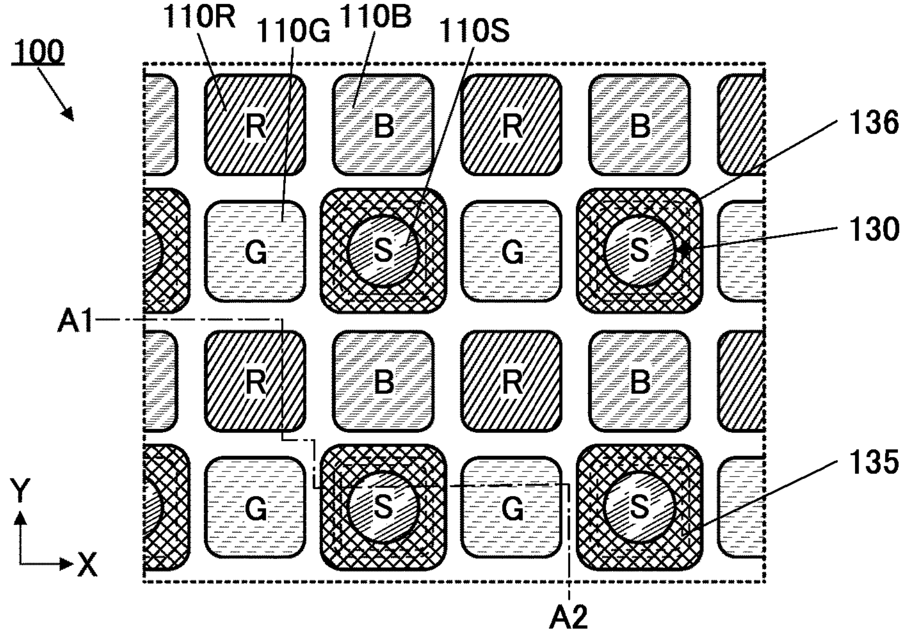
FIG. 1A and FIG. 1B are diagrams illustrating a structure example of a display apparatus.

Embodiments are described below with reference to the drawings. Note that the embodiments can be implemented with many different modes, and it will be readily understood by those skilled in the art that modes and details thereof can be changed in various ways without departing from the spirit and scope thereof. Thus, the present invention should not be interpreted as being limited to the following description of the embodiments.

Note that in structures of the invention described below, the same portions or portions having similar functions are denoted by the same reference numerals in different drawings, and description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that ordinal numbers such as "first" and "second" in this specification and the like are used in order to avoid confusion among components and do not limit the number of components.

In this specification and the like, the term "film" and the term "layer" can be interchanged with each other. For example, in some cases, the term "conductive layer" and the term "insulating layer" can be interchanged with the term "conductive film" and the term "insulating film", respectively.

Note that in this specification and the like, a top surface shape of a component means the outline of the component in a plan view. A plan view means a view to observe the component from a normal direction of a surface where the component is formed or from a normal direction of a surface of a support (e.g., a substrate) where the component is formed.

Note that in this specification, an EL layer means a layer containing at least a light-emitting substance (also referred to as a light-emitting layer) or a stack including the light-emitting layer provided between a pair of electrodes of a light-emitting element.

In this specification and the like, a display panel that is one embodiment of a display apparatus has a function of displaying (outputting) an image or the like on (to) a display surface. Therefore, the display panel is one mode of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

In this embodiment, structure examples of a display apparatus of one embodiment of the present invention and an example of a method for manufacturing the display apparatus will be described.

One embodiment of the present invention is a display apparatus including a light-emitting element (also referred to as a light-emitting device) and a light-receiving element (also referred to as a light-receiving device). The light-emitting element includes a pair of electrodes and an EL layer therebetween. The light-receiving element includes a pair of electrodes and an active layer therebetween. The light-emitting element is preferably an organic EL element (organic electroluminescent element). The light-receiving element is preferably an organic photodiode (an organic photoelectric conversion element).

Furthermore, the display apparatus preferably includes two or more light-emitting elements with different emission colors. The light-emitting elements with different emission colors include their respective EL layers containing different materials. For example, when three kinds of light-emitting elements that emit red (R), green (G), and blue (B) light are included, a full-color display apparatus can be achieved.

One embodiment of the present invention is capable of image capturing by a plurality of light-receiving elements and thus functions as an image capturing device. In this case, the light-emitting elements can be used as a light source for image capturing. Moreover, one embodiment of the present invention is capable of displaying an image with the plurality of light-emitting elements and thus functions as a display apparatus. Accordingly, one embodiment of the present invention can be regarded as a display apparatus that has an image capturing function or an image capturing device that has a display function.

For example, in the display apparatus of one embodiment of the present invention, light-emitting elements are arranged in a matrix in a display portion, and light-receiving elements are also arranged in a matrix in the display portion. Hence, the display portion has a function of displaying an image and a function of a light-receiving portion. An image can be captured by the plurality of light-receiving elements provided in the display portion, so that the display apparatus can function as an image sensor, a touch panel, or the like. That is, the display portion can capture an image or detect an approach or touch of an object, for example. Furthermore, since the light-emitting elements provided in the display portion can be used as a light source at the time of receiving light, a light source does not need to be provided separately from the display apparatus; thus, a highly functional display apparatus can be provided without increasing the number of electronic components.

In one embodiment of the present invention, when an object reflects light emitted by the light-emitting element included in the display portion, the light-receiving element can detect the reflected light; thus, image capturing, touch (including non-contact touch) detecting, or the like can be performed even in a dark environment.

Furthermore, when a finger, a palm, or the like touches the display portion of the display apparatus of one embodiment of the present invention, an image of the fingerprint or the palm print can be captured. Thus, an electronic device including the display apparatus of one embodiment of the present invention can perform personal authentication by using the captured image of the fingerprint, the palm print, or the like. Accordingly, an image capturing device for the fingerprint authentication, the palm print authentication, or the like does not need to be additionally provided, and the number of components of the electronic device can be reduced. Since the light-receiving elements are arranged in a matrix in the display portion, an image of the fingerprint, the palm print, or the like can be captured in any position in the display portion, which can provide a highly convenient electronic device.

Another biometric authentication method is face authentication. However, the accuracy of face authentication might vary depending on the circumstances; for example, the authentication accuracy is significantly lowered with a mask on the face. On the other hand, the authentication method using a fingerprint, a palm print, or a vein, for example, has little variation in the authentication accuracy due to the measurement environment or the like, and thus can be said as the authentication method with higher accuracy.

When image capturing such as fingerprint capturing is performed with the light-receiving elements, light emitted by the light-emitting elements included in the display portion can be used as a light source. At this time, the light-emitting elements preferably emit light instantaneously (e.g., greater than or equal to 100 us and less than or equal to 100 ms). By shortening the light emission time, deterioration of the light-emitting elements can be inhibited even when the light-emitting elements emit light at high luminance. Furthermore, when image capturing is performed using instantaneous light with high luminance, an image having an emphasized contrast (shadow) can be obtained; thus, an image of an uneven shape such as a fingerprint can be more clearly captured.

A light-blocking layer that defines a range where light enters the light-receiving element (an image capturing range) is preferably provided on the light-receiving surface side of the light-receiving element. As the image capturing range of the light-receiving element is narrower, a clearer image can be captured. The light-blocking layer prevents entry of light from the oblique direction into the light-receiving element and has a function of a pinhole for clear images. For example, a thin film having a light-blocking property and having an opening in a position overlapping with the light-receiving element can be used for the light-blocking layer.

In the case where the diameter of the opening of the light-blocking layer is fixed, the image capturing range can be more narrowed and a clearer image can be captured with a longer distance between the light-receiving surface of the light-receiving element and the light-blocking layer. Thus, a light-transmitting spacer (also referred to as a light-transmitting layer) is provided between the light-receiving element and the light-blocking layer. The spacer is stacked over the light-receiving element with a barrier layer positioned therebetween. As the spacer is thicker, the distance between the light-blocking layer and the light-receiving element can be increased and a clearer image can be captured.

It is preferable that the spacer positioned over the light-receiving element be formed to have an island-shaped pattern, and the light-blocking layer be provided to cover part of a top surface and a side surface of the spacer. When the light-blocking layer is provided along the side surface of the spacer, the light-receiving surface of the light-receiving element can be surrounded by the light-blocking layer. Thus, the light-blocking layer can block the path of light that is emitted by the light-emitting element and diffused into the display apparatus (also referred to as stray light), so that entry of the stray light into the light-receiving element can be inhibited. Since the stray light is a factor of noise in image capturing with the light-receiving element, image capturing sensitivity (a signal-noise ratio (an S/N ratio)) can be improved by employing the structure of blocking stray light.

Note that a display apparatus combining a light-emitting element of white light emission and a color filter can also be obtained. In that case, light-emitting elements having the same structure can be employed as light-emitting elements provided in pixels (subpixels) that exhibit light of different colors, which allows the EL layer to be shared by all the light-emitting elements and simplifies the manufacturing process.

More specific examples are described below with reference to drawings.

Structure Example 1

Structure Example 1-1

FIG. 1A illustrates a schematic top view of a display apparatus 100. The display apparatus includes a plurality of light-emitting elements 110R exhibiting red, a plurality of light-emitting elements 110G exhibiting green, a plurality of light-emitting elements 110B exhibiting blue, and a plurality of light-receiving elements 110S. In FIG. 1A, light-emitting regions of the light-emitting elements and a light-receiving region of the light-receiving element are denoted by R, G, B, and S to easily differentiate the light-emitting elements and the light-receiving element.

The light-emitting elements 110R, the light-emitting elements 110G, the light-emitting elements 110B, and the light-receiving elements 110S are arranged in a matrix. FIG. 1A illustrates a structure in which two elements are alternately arranged in one direction. Note that the arrangement method of the light-emitting elements and the light-receiving element is not limited thereto; another arrangement method such as a stripe arrangement, an S-stripe arrangement, a delta arrangement, a Bayer arrangement, or a zigzag arrangement may be employed, or a PenTile arrangement, a diamond arrangement, or the like may also be used.

FIG. 1A illustrates an example in which the light-emitting elements and the light-receiving elements are arranged with the same cycle. That is, FIG. 1A illustrates an example in which the resolution (density) of the light-emitting elements and the resolution (density) of the light-receiving elements are the same. Note that the arrangement cycle of the light-emitting elements and the arrangement cycle of the light-receiving elements may be different from each other. For example, the arrangement cycle of the light-emitting elements may be shorter than the arrangement cycle of the light-receiving elements, or the arrangement cycle of the light-emitting elements may be longer than the arrangement cycle of the light-receiving elements.

As the light-emitting element 110R, the light-emitting element 110G, and the light-emitting element 110B, EL elements such as OLEDs (Organic Light Emitting Diodes) or QLEDs (Quantum-dot Light Emitting Diodes) are preferably used. As light-emitting substances contained in the EL elements, a substance that emits fluorescent light (a fluorescent material), a substance that emits phosphorescent light (a phosphorescent material), a substance that exhibits thermally activated delayed fluorescence (a thermally activated delayed fluorescent (TADF) material), an inorganic compound (e.g., a quantum dot material), and the like can be given.

As the light-receiving element 110S, a pn photodiode or a pin photodiode can be used, for example. The light-receiving element 110S functions as a photoelectric conversion element that detects light incident on the light-receiving element 110S and generates charge. The amount of generated charge in the photoelectric conversion element is determined depending on the amount of incident light. It is particularly preferable to use an organic photodiode including a layer containing an organic compound as the light-receiving element 110S. An organic photodiode, which is easily made thin, lightweight, and large in area and has a high degree of freedom for shape and design, can be used in a variety of devices.

Figure 1B:
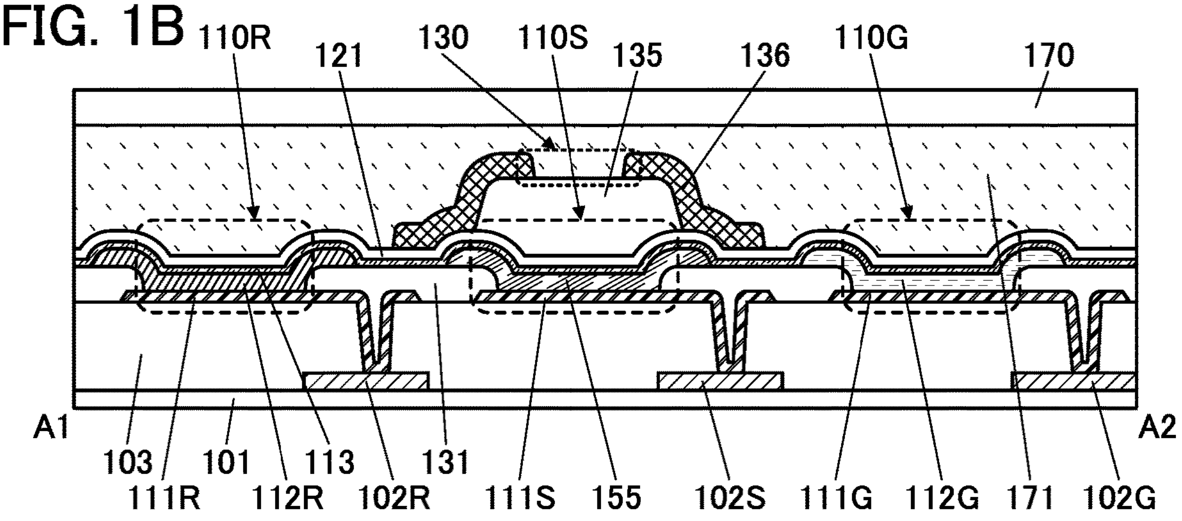

FIG. 1B illustrates a schematic cross-sectional view taken along dashed-dotted line A1-A2 in FIG. 1A. FIG. 1B illustrates a cross-sectional view of the light-emitting element 110R, the light-receiving element 110S, and the light-emitting element 110G.

The light-emitting element 110R, the light-emitting element 110G, the light-emitting element 110B (not illustrated), and the light-receiving element 110S are provided over a substrate 101. An adhesive layer 171 and a substrate 170 are provided to cover the light-emitting element 110R, the light-emitting element 110G, the light-emitting element 110B, and the light-receiving element 110S.

The light-emitting element 110R includes a pixel electrode 111R, an organic layer 112R, and a common electrode 113. The light-emitting element 110G includes a pixel electrode 111G, an organic layer 112G, and the common electrode 113. The light-receiving element 110S includes a pixel electrode 111S, an organic layer 155, and the common electrode 113. The common electrode 113 is provided to be shared by the light-emitting element 110R, the light-emitting element 110G, the light-emitting element 110B (not illustrated), and the light-receiving element 110S. Here, the pixel electrode 111S of the light-receiving element 110S can also be referred to as a sensor electrode, a light-receiving electrode, an image capturing electrode, or the like.

The organic layer 112R included in the light-emitting element 110R contains at least a light-emitting organic compound that emits red light. The organic layer 112G included in the light-emitting element 110G contains at least a light-emitting organic compound that emits green light. An organic layer 112B included in the light-emitting element 110B (not illustrated) contains at least a light-emitting organic compound that emits blue light. The layers containing the light-emitting organic compounds included in the organic layer 112R, the organic layer 112G, and the organic layer 112B can each also be referred to as a light-emitting layer.

The organic layer 155 included in the light-receiving element 110S contains a photoelectric conversion material having sensitivity in a wavelength range of visible light or infrared light. A wavelength range to which the photoelectric conversion material contained in the organic layer 155 is sensitive preferably includes one or more of the wavelength range of light emitted from the light-emitting element 110R, the wavelength range of light emitted from the light-emitting element 110G, and the wavelength range of light emitted from the light-emitting element 110B. Alternatively, a photoelectric conversion material having sensitivity to infrared light, which has a longer wavelength than light emitted from the light-emitting element 110R, may be used. The layer containing the photoelectric conversion material included in the organic layer 155 can also be referred to as an active layer or a photoelectric conversion layer.

Hereinafter, matters common to the light-emitting element 110R, the light-emitting element 110G, and the light-emitting element 110B are sometimes described using the term "light-emitting element 110" without any letter of the alphabet distinguishing these light-emitting elements. Similarly, in the description of matters common to components that are distinguished from each other using alphabets, such as the organic layer 112R, the organic layer 112G, and the organic layer 112B, reference numerals without alphabets are sometimes used.

The organic layer 112 can include one or more of an electron-injection layer, an electron-transport layer, a hole-injection layer, and a hole-transport layer in addition to the light-emitting layer. For example, it is possible to employ a structure in which the organic layer 112 has a stacked-layer structure of a hole-injection layer, a hole-transport layer, a light-emitting layer, an electron-transport layer, and an electron-injection layer from the pixel electrode 111 side. As one or more of the hole-injection layer, the hole-transport layer, the light-emitting layer, the electron-transport layer, and the electron-injection layer, a film containing only an inorganic compound or an inorganic substance without containing an organic compound can also be used.

The pixel electrode 111R, the pixel electrode 111G, and a pixel electrode 111B (not illustrated) are provided for the respective light-emitting elements 110. The common electrode 113 is provided as a continuous layer shared by the light-emitting elements 110 and the light-receiving element 110S. A conductive film having a light-transmitting property with respect to visible light is used for either the pixel electrodes or the common electrode 113, and a conductive film having a reflective property is used for the other. For example, when the pixel electrodes have light-transmitting properties and the common electrode 113 has a reflective property, a bottom-emission display apparatus can be obtained. In contrast, when the pixel electrodes have reflective properties and the common electrode 113 has a light-transmitting property, a top-emission display apparatus can be obtained. Note that when both the pixel electrodes and the common electrode 113 have light-transmitting properties, a dual-emission display apparatus can be obtained. One embodiment of the present invention preferably has a top-emission structure or a dual-emission structure.

The pixel electrode 111 can have a stacked-layer structure of a conductive film having a reflective property and a conductive film having a light-transmitting property. In that case, the organic layer 112 is preferably provided over the conductive film having a reflective property with the conductive film having a light-transmitting property positioned therebetween. In this case, the thicknesses of the conductive films having a light-transmitting property may vary among the light-emitting elements.

A transistor 102R, a transistor 102S, a transistor 102G, and the like are provided over the substrate 101. An insulating layer 103 is provided to cover the transistors 102, and the pixel electrodes 111 are provided over the insulating layer 103. The pixel electrode 111R is electrically connected to the transistor 102R through an opening provided in the insulating layer 103. Similarly, the pixel electrode 111S is electrically connected to the transistor 102S, the pixel electrode 111G is electrically connected to the transistor 102G, and the pixel electrode 111B (not illustrated) is electrically connected to the transistor 102B (not illustrated).

An insulating layer 131 is provided to cover end portions of the pixel electrode 111R, the pixel electrode 111G, the pixel electrode 111B (not illustrated), and the pixel electrode 111S. End portions of the insulating layer 131 are preferably tapered.

Note that in this specification and the like, a tapered shape indicates a shape in which at least part of a side surface of a structure is inclined to a substrate surface. For example, a tapered shape preferably includes a region where the angle formed by the inclined side surface and the formation surface (such an angle is also referred to as a taper angle) is less than 90°.

The insulating layer 131 preferably contains an organic resin. Using an organic resin for the insulating layer 131 can increase adhesion between the insulating layer 131 and each of the organic layer 112 and the organic layer 155, so that the manufacturing yield can be improved.

When an organic resin is used for the insulating layer 131, a surface of the insulating layer 131 can be moderately curved. Thus, coverage with a film formed over the insulating layer 131 can be improved.

Examples of the material that can be used for the insulating layer 131 include an acrylic resin, a polyimide resin, an epoxy resin, a polyamide resin, a polyimide-amide resin, a siloxane resin, a benzocyclobutene-based resin, a phenol resin, and precursors of these resins.

The insulating layer 131 can also be formed using an inorganic insulating film. The use of an inorganic insulating film for the insulating layer 131 is suitable for microfabrication rather than the case where an organic resin is used and thus is particularly suitable for the case of manufacturing a high-resolution display apparatus.

Examples of inorganic insulating material that can be used for the insulating layer 131 include oxides and nitrides such as silicon oxide, silicon oxynitride, silicon nitride oxide, silicon nitride, aluminum oxide, aluminum oxynitride, and hafnium oxide. Yttrium oxide, zirconium oxide, gallium oxide, tantalum oxide, magnesium oxide, lanthanum oxide, cerium oxide, neodymium oxide, or the like may be used. In the insulating layer 131, films containing the above inorganic insulating materials may be stacked.

The organic layer 112 and the organic layer 155 each include a region in contact with the top surface of the pixel electrode and a region in contact with the surface of the insulating layer 131. End portions of the organic layer 112 and the organic layer 155 are each positioned over the insulating layer 131.

A protective layer 121 is provided over the common electrode 113 so as to cover the light-emitting element 110R, the light-emitting element 110G, the light-receiving element 110S, and the light-emitting element 110B (not illustrated). The protective layer 121 has a function of preventing diffusion of impurities such as water into the light-emitting elements 110 from above.

The protective layer 121 can have, for example, a single-layer structure or a stacked-layer structure including at least an inorganic insulating film. Examples of the inorganic insulating film include an oxide film and a nitride film, such as a silicon oxide film, a silicon oxynitride film, a silicon nitride oxide film, a silicon nitride film, an aluminum oxide film, an aluminum oxynitride film, and a hafnium oxide film. Alternatively, a semiconductor material or a conductive material such as indium gallium oxide, indium zinc oxide, indium tin oxide, or indium gallium zinc oxide may be used for the protective layer 121.

A spacer 135 is provided over the protective layer 121. The spacer 135 is provided in a portion that is over the protective layer 121 and overlaps with the light-receiving element 110S.

The spacer 135 is preferably formed using a material having a light-transmitting property with respect to at least light with a wavelength to which the light-receiving element 110S has sensitivity. The spacer 135 preferably has a light-transmitting property with respect to visible light. For the spacer 135, an organic resin or an inorganic insulating film can be used. It is particularly preferable to use an organic resin for the spacer 135 to facilitate thickness increase.

FIG. 1B illustrates an example in which the spacer 135 is processed into an island shape. The spacer 135 is provided to overlap with the pixel electrode 111S with the protective layer 121, the common electrode 113, and the organic layer 155 positioned therebetween. An end portion of the spacer 135 is provided to overlap with the insulating layer 131. In FIG. 1A, the shape of the outer edge of the spacer 135 is indicated by a dashed line.

Note that in this specification and the like, the term "island shape" refers to a state where two or more layers formed using the same material in the same step are physically separated from each other. For example, the term "island-shaped light-emitting layer" refers to a state where the light-emitting layer and its adjacent light-emitting layer are physically separated from each other.

A light-blocking layer 136 is provided over the spacer 135. As illustrated in FIG. 1A and FIG. 1B, the light-blocking layer 136 includes an opening 130 overlapping with the light-receiving element 110S. The opening 130 is positioned on an inner side than the outline of the pixel electrode 111S in a plan view. Furthermore, the opening 130 is positioned on an inner side than the outline of the organic layer 155 in a plan view.

The light-blocking layer 136 is provided to cover not only a top surface of the spacer 135 but also a side surface thereof. An end portion of the light-blocking layer 136 on the side opposite to the opening 130 is provided to overlap with the insulating layer 131 with the protective layer 121 positioned therebetween.

The light-blocking layer 136 contains a material that absorbs at least part of visible light. For example, the light-blocking layer 136 contains a material that absorbs at least one of light out of light emitted from the light-emitting element 110R, light emitted from the light-emitting element 110G, and light emitted from the light-emitting element 110B. For example, the light-blocking layer 136 itself may be formed of a material that absorbs visible light (e.g., a colored organic material or a colored inorganic material), or the light-blocking layer 136 may contain a pigment that absorbs visible light. As the light-blocking layer 136, a resin that contains carbon black as a pigment and functions as a black matrix or a black thin film such as a chromium film can be used. Alternatively, a resin that can be used as a color filter that transmits red, blue, or green light and absorbs light of the other colors can be used, for example.

Figure 2A:
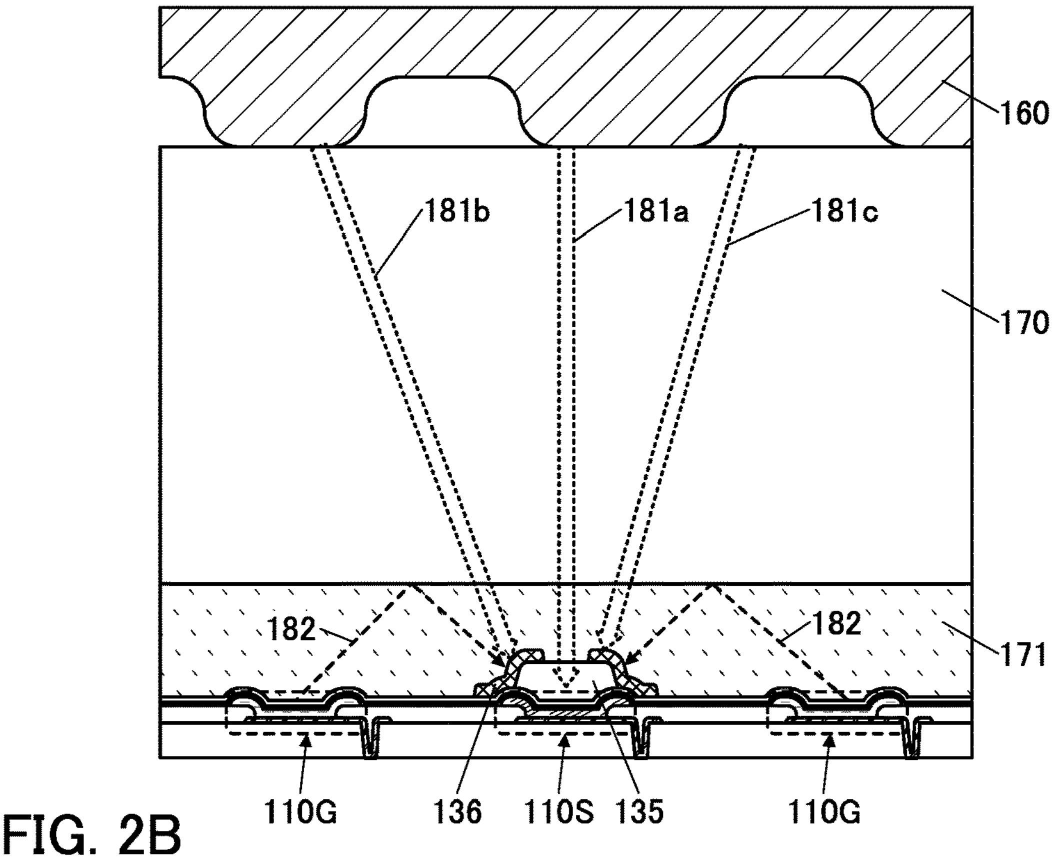
FIG. 2A and FIG. 2B are diagrams illustrating structure examples of a display apparatus.
Figure 2B:
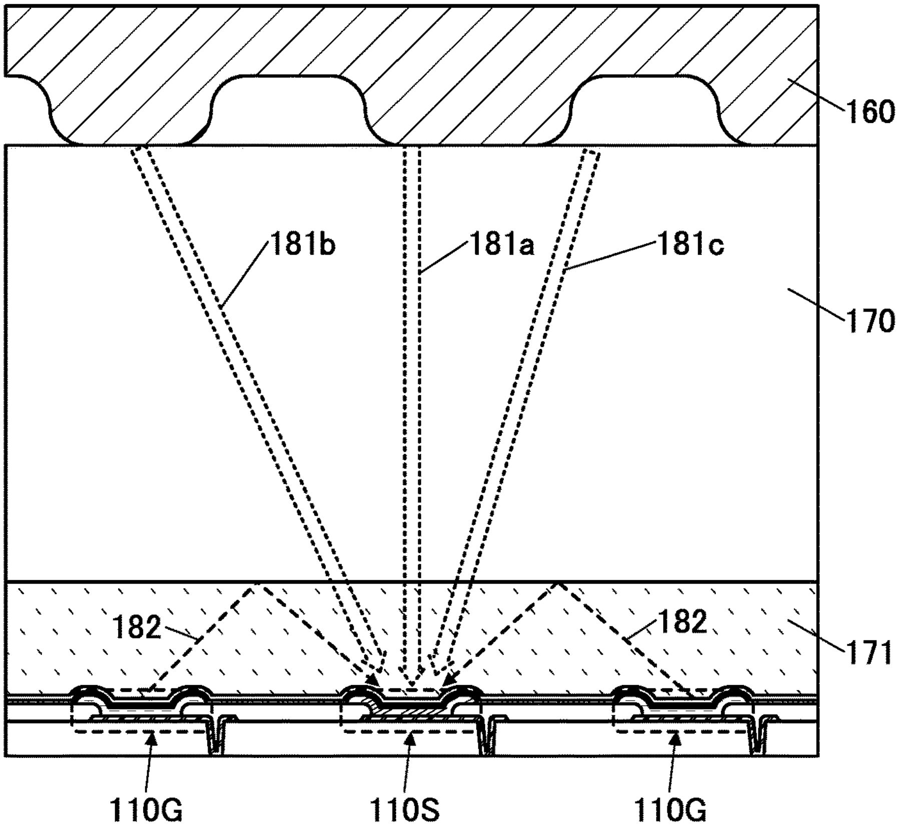

Here, the functions of the spacer 135 and the light-blocking layer 136 are described with reference to FIG. 2A and FIG. 2B. FIG. 2A and FIG. 2B illustrate the light-receiving element 110S in the center and the light-emitting elements 110G adjacent thereto on both sides. An image-capture target 160 is on and in contact with the substrate 170. The image-capture target 160 has unevenness on the surface. Projecting portions of the image-capture target 160 are in contact with the substrate 170, and depressed portions of the image-capture target 160 are not in contact with the substrate 170. For example, the image-capture target 160 is a fingertip, and the uneven shape of the surface can be rephrased as a fingerprint. Reflected light 181*a*, reflected light 181*b*, and reflected light 181*c* are each reflected light that originates from a light source such as the light-emitting element 110G, is reflected by the image-capture target 160 or the like, and travels toward the light-receiving element 110S.

FIG. 2B is a schematic cross-sectional view of the case where neither the spacer 135 nor the light-blocking layer 136 is provided. In FIG. 2B, not only the reflected light 181*a*, which has been reflected by the image-capture target 160 right above the light-receiving element 110S, but also the reflected light 181*b* from a portion corresponding to a different projection portion, the reflected light 181*c* from a portion corresponding to a depressed portion of the image-capture target 160, and the like enter the light-receiving element 110S. Thus, a blur might occur in a captured image.

In contrast, by providing the spacer 135 and the light-blocking layer 136 as illustrated in FIG. 2A, the reflected light 181*b* and the reflected light 181*c* that have been reflected and travel toward the light-receiving element 110S from the oblique directions are blocked by the light-blocking layer 136, and only the reflected light 181*a* from right above the light-receiving element 110S can reach the light-receiving region of the light-receiving element 110S. Accordingly, a clear image of an image-capture target in the vicinity of the surface of the substrate 170 can be taken. With a larger thickness of the spacer 135 and a smaller diameter of the opening of the light-blocking layer 136, the solid angle of the image capturing range can be smaller and a clearer image can be captured.

Moreover, light 182 that travels inside the adhesive layer 171 or the like can also enter the light-receiving element 110S. Examples of the light 182 include light emitted from the light-emitting element 110G and totally reflected at the interface between the adhesive layer 171 and the substrate 170. Such light can be referred to as stray light. Thus, stray light that diffuses inside the display apparatus is a factor of noise when image capturing is performed with the light-receiving element 110S. That is, image capturing sensitivity (a signal-noise ratio (an S/N ratio)) decreases.

By providing the spacer 135 and the light-blocking layer 136 as illustrated in FIG. 2A, the light 182 that travels inside the adhesive layer 171 is blocked by the light-blocking layer 136 and does not reach the light-receiving region of the light-receiving element 110S. Thus, image capturing sensitivity can be increased.

Furthermore, as illustrated in FIG. 2A, the spacer 135 is processed into an island shape and the side surface thereof is covered with the light-blocking layer 136, whereby light that comes from the adhesive layer 171, passes through the spacer 135, and reaches the light-receiving element 110S and light that travels inside the spacer 135 and reaches the light-receiving element 110S can be effectively blocked.

Figure 3A:
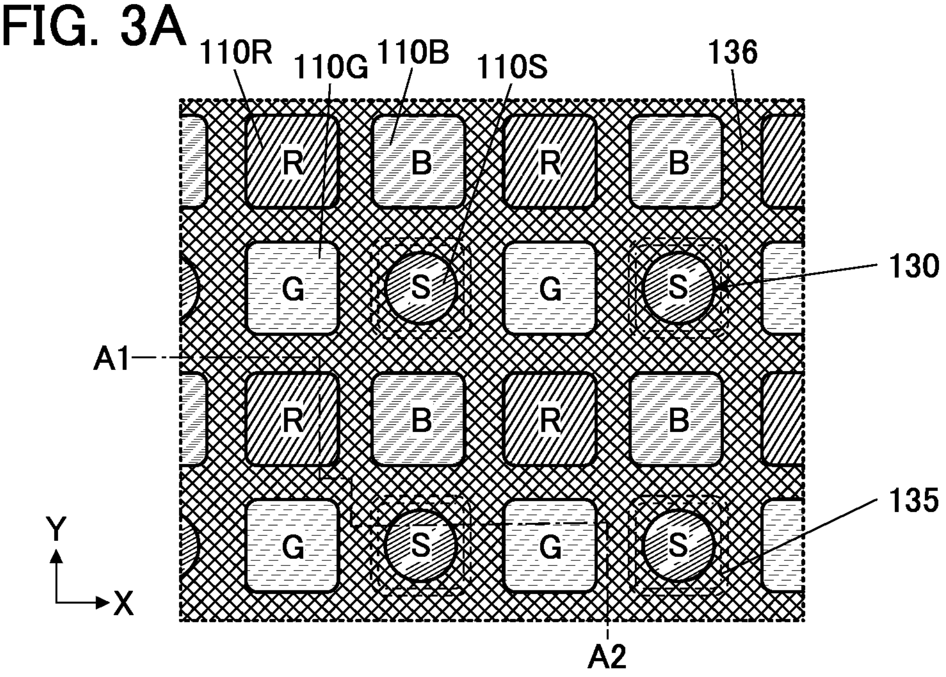
FIG. 3A and FIG. 3B are diagrams illustrating a structure example of a display apparatus.
Figure 3B:
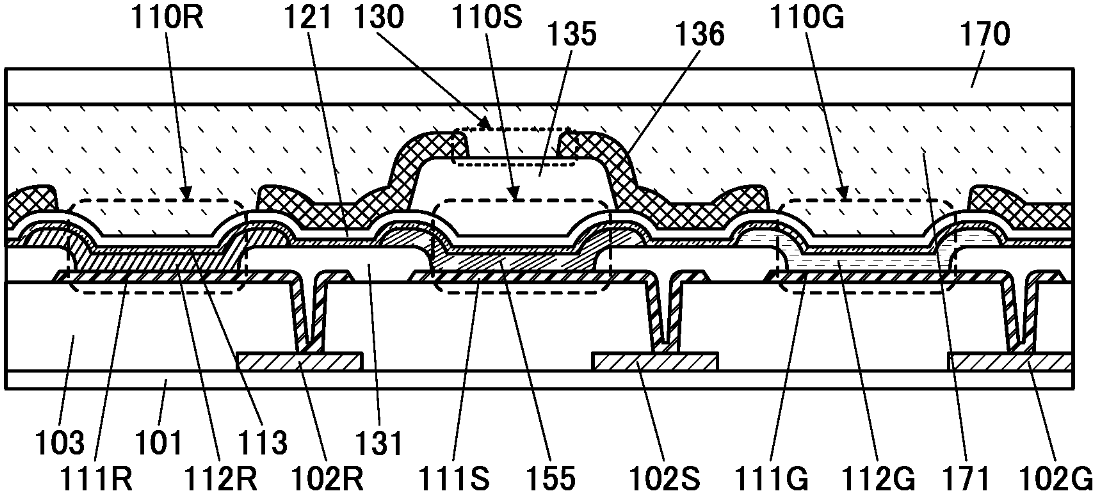

Although an example in which the light-blocking layer 136 is provided for only the light-receiving element 110S is described above, the light-blocking layer 136 may be provided over the light-emitting element as illustrated in FIG. 3A and FIG. 3B.

In FIG. 3A and FIG. 3B, the light-blocking layer 136 is provided between the light-emitting element 110 and the light-receiving element 110S and between adjacent light-emitting elements 110. In other words, the light-blocking layer 136 includes openings overlapping with the light-emitting elements 110 and the opening 130 overlapping with the light-receiving element 110S. At this time, the diameters (or areas) of the openings overlapping with the light-emitting elements 110 are each preferably larger than the diameter (or area) of the opening overlapping with the light-receiving element 110S.

Structure examples of a display apparatus whose structure is partly different from that of the above are described below. Hereinafter, portions overlapping with those in Structure Example 1-1 above are denoted by the same reference numerals as those in Structure Example 1 for reference to the above description, and the description thereof is not repeated in some cases.

Structure Example 1-2

Figure 4A:
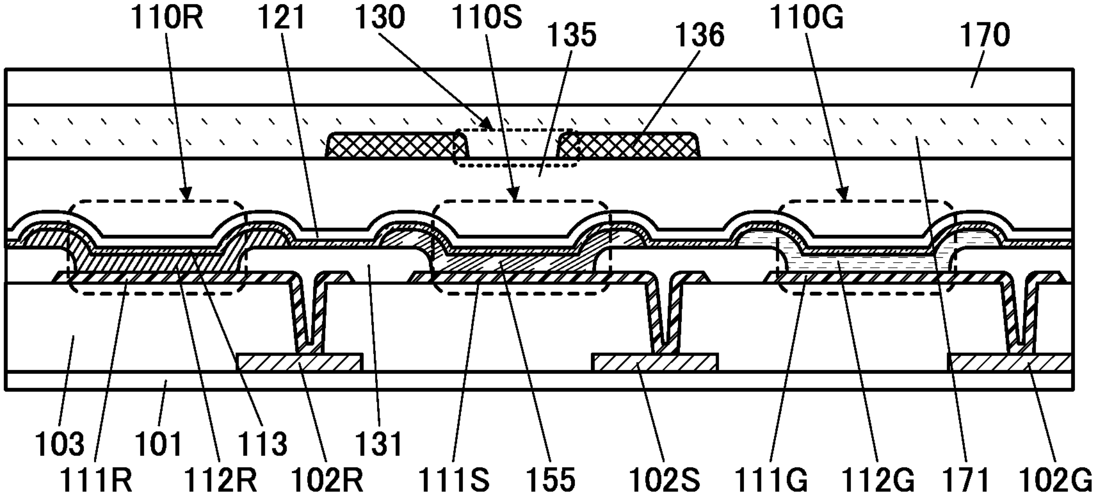
FIG. 4A and FIG. 4B are diagrams illustrating structure examples of a display apparatus.

FIG. 4A illustrates an example in which the spacer 135 is not processed into an island shape. The spacer 135 is provided to cover not only the light-receiving element 110S but also the light-emitting element 110R, the light-emitting element 110G, and the light-emitting element 110B (not illustrated).

With this structure, the formation process of the spacer 135 can be simplified, so that the manufacturing cost can be reduced.

Figure 4B:
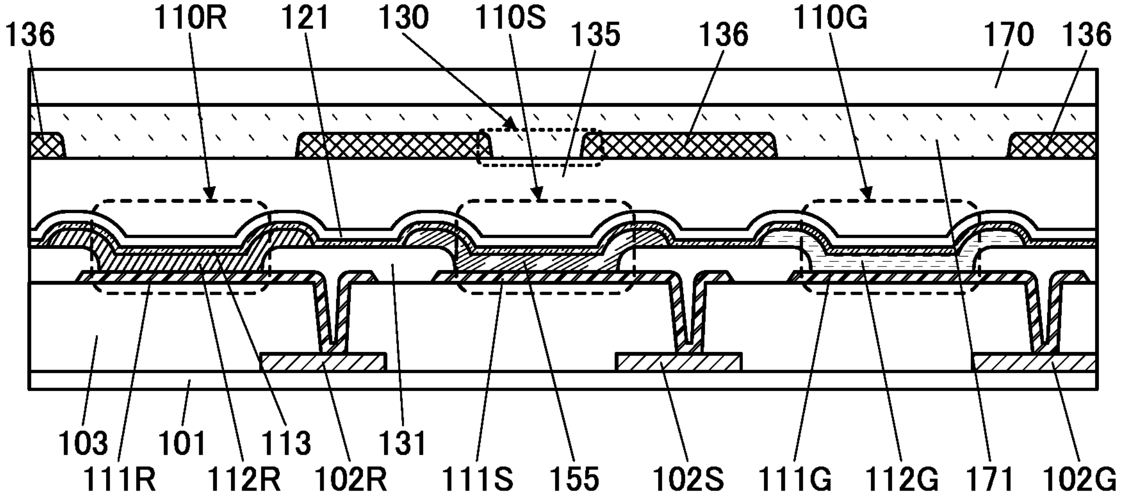

FIG. 4B illustrates an example in which, as in FIG. 3B, the light-blocking layer 136 is provided also in the vicinity of the light-emitting element.

Structure Example 1-3

Figure 5A:
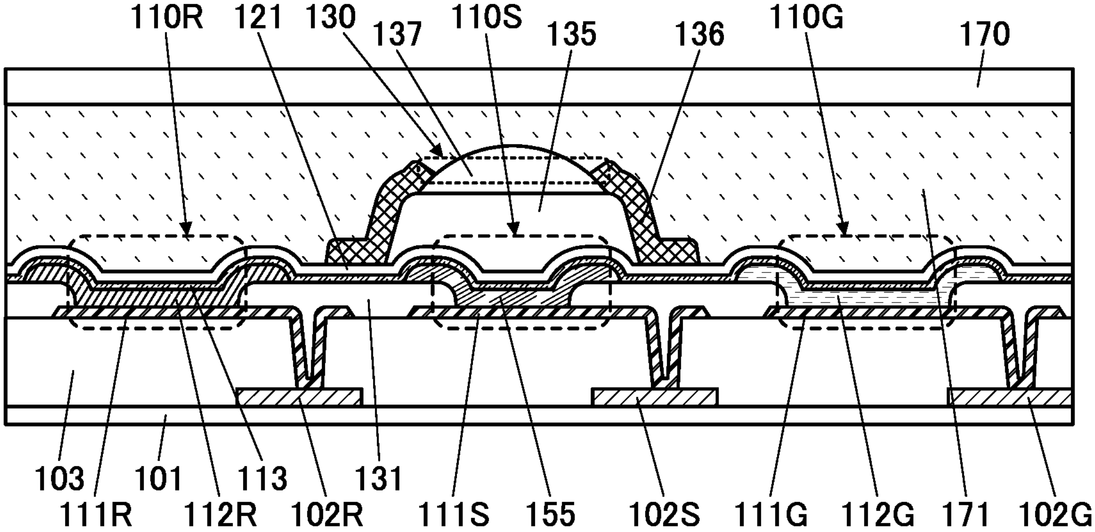
FIG. 5A and FIG. 5B are diagrams illustrating structure examples of a display apparatus.

FIG. 5A illustrates an example in which a lens 137 is used. The lens 137 is a convex lens and is provided over the spacer 135. The lens 137 is provided in a position that overlaps with the opening of the light-blocking layer 136. Part of the light-blocking layer 136 is provided to cover an end portion of the lens 137.

The lens 137 has a function of condensing rays of light that have passed through the opening 130 of the light-blocking layer 136 and thus increasing the amount of light received by the light-receiving element 110S. Accordingly, image capturing sensitivity can be improved.

In the case of using the lens 137, the diameter of the opening 130 of the light-blocking layer 136 is preferably larger than the diameter of the light-receiving region of the light-receiving element 110S, in which case the amount of light received by the light-receiving element 110S can be increased effectively. In FIG. 5A, the diameter (or width) of the light-receiving region of the light-receiving element 110S corresponds to the diameter of the opening (or the width of the opening) of the insulating layer 131 over the pixel electrode 111S.

The lens 137 has a light-transmitting property with respect to at least light with a wavelength that is received by the light-receiving element 110S. The lens 137 can be formed using a material whose refractive index with respect to light with a wavelength that is received by the light-receiving element 110S is higher than that of the adhesive layer 171. As the lens 137, an organic resin such as an acrylic resin can be used.

Figure 5B:
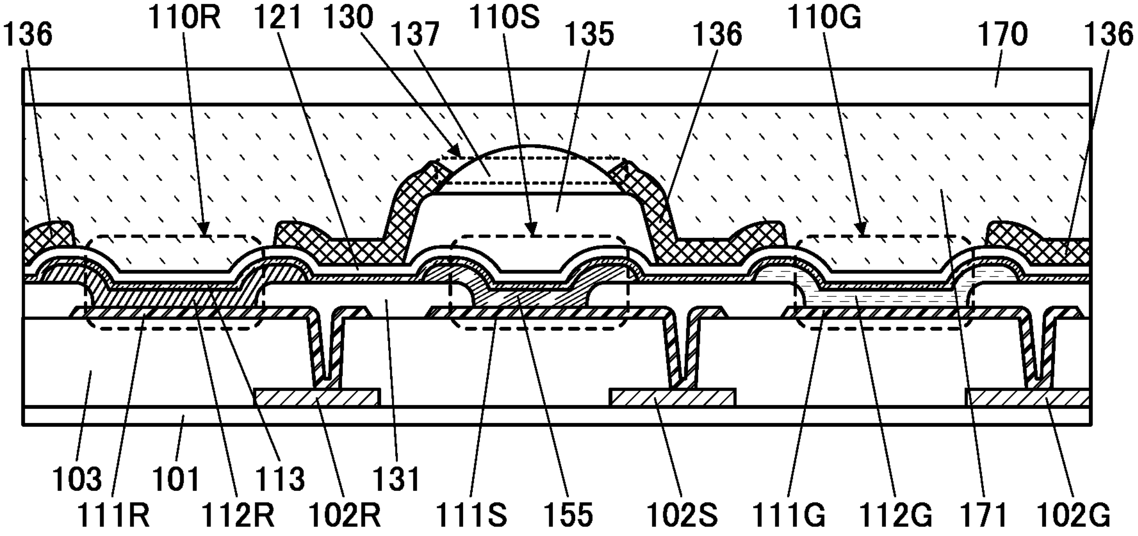

FIG. 5B illustrates an example in which, as in FIG. 3B, the light-blocking layer 136 is provided also in the vicinity of the light-emitting element.

Structure Example 1-4

Figure 6A:
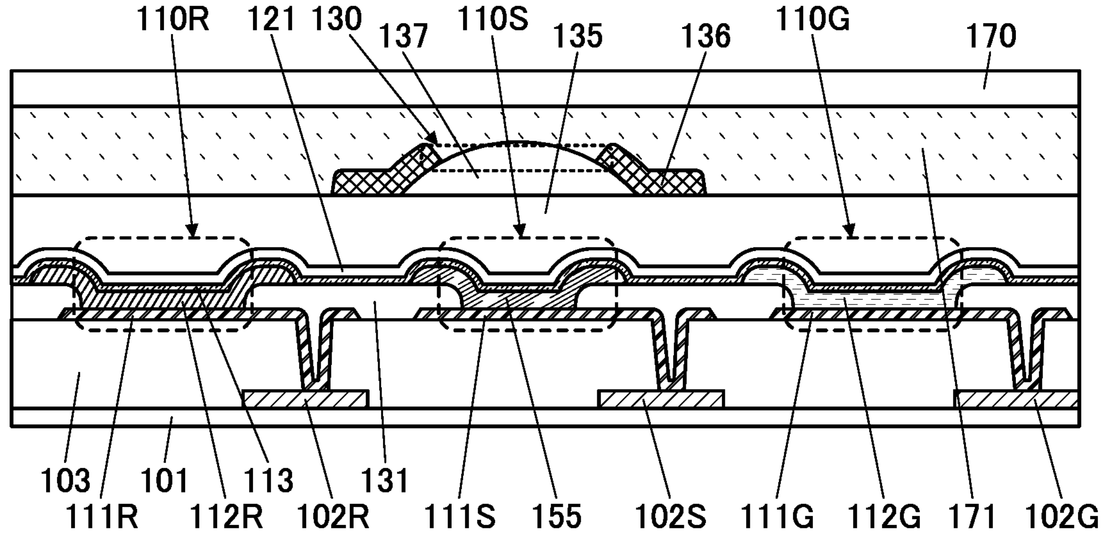
FIG. 6A and FIG. 6B are diagrams illustrating structure examples of a display apparatus.

FIG. 6A illustrates an example in which the lens 137 is used in the above-described structure example 1-2.

Figure 6B:
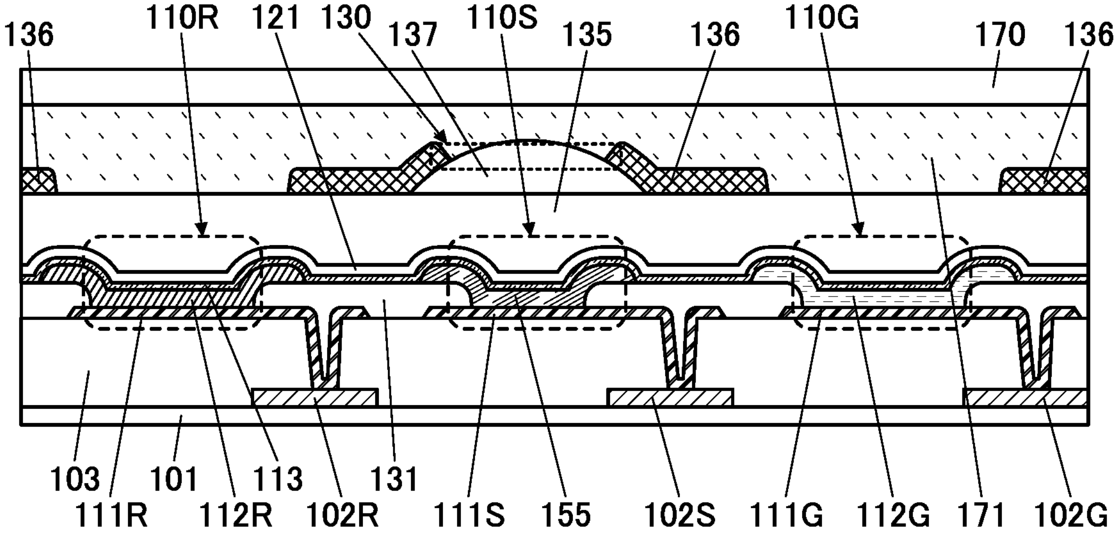

FIG. 6B illustrates an example in which, as in FIG. 3B, the light-blocking layer 136 is provided also in the vicinity of the light-emitting element.

Structure Example 1-5

Figure 7A:
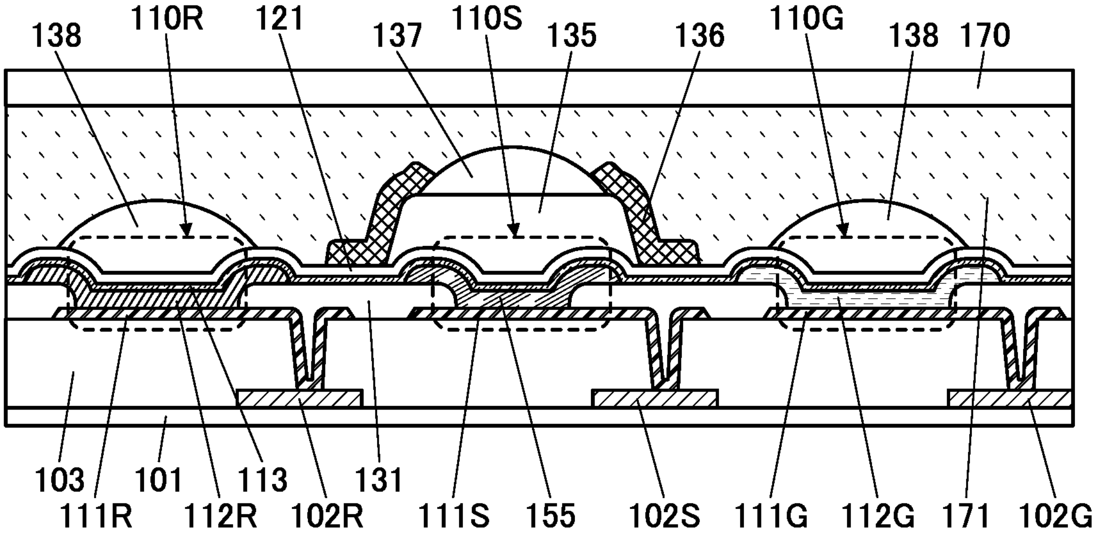
FIG. 7A and FIG. 7B are diagrams illustrating structure examples of a display apparatus.

FIG. 7A illustrates an example in which lenses 138 are provided for not only the light-receiving element 110S but also the light-emitting elements.

The lenses 138 are provided to overlap with the light-emitting elements. With the use of the lenses 138, light extraction efficiency of the light-emitting elements can be increased, and power consumption can be reduced.

The lens 137 overlaps with the light-receiving element 110S with the spacer 135 and the protective layer 121 positioned therebetween; in contrast, the spacer 135 is not provided between the lens 138 and the protective layer 121. Thus, the distance between the lens 138 and the light-emitting element 110 is smaller than the distance between the lens 137 and the light-receiving element 110S by the thickness of the spacer 135.

The lens 138 can be formed by processing the same film as the lens 137. A convex lens or a concave lens may be used as the lens 138. In the case where a concave lens is used, a material having a lower refractive index than the adhesive layer 171 is used for the lens 138.

Figure 7B:
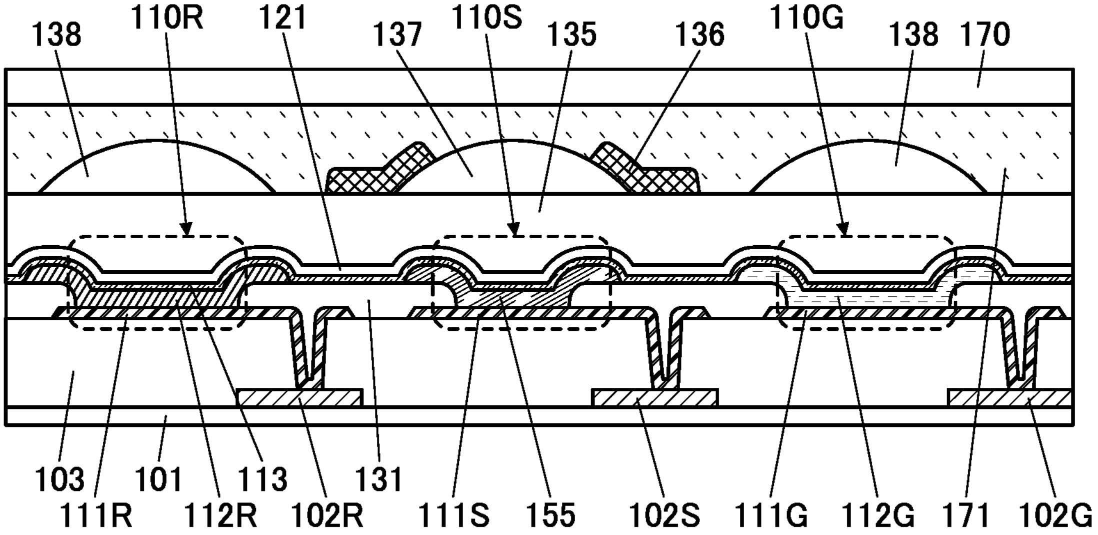

FIG. 7B illustrates an example in which the spacer 135 is not processed into an island shape as in FIG. 6A. Like the lens 137, the lens 138 is provided over the spacer 135.

Structure Example 1-6

Figure 8A:
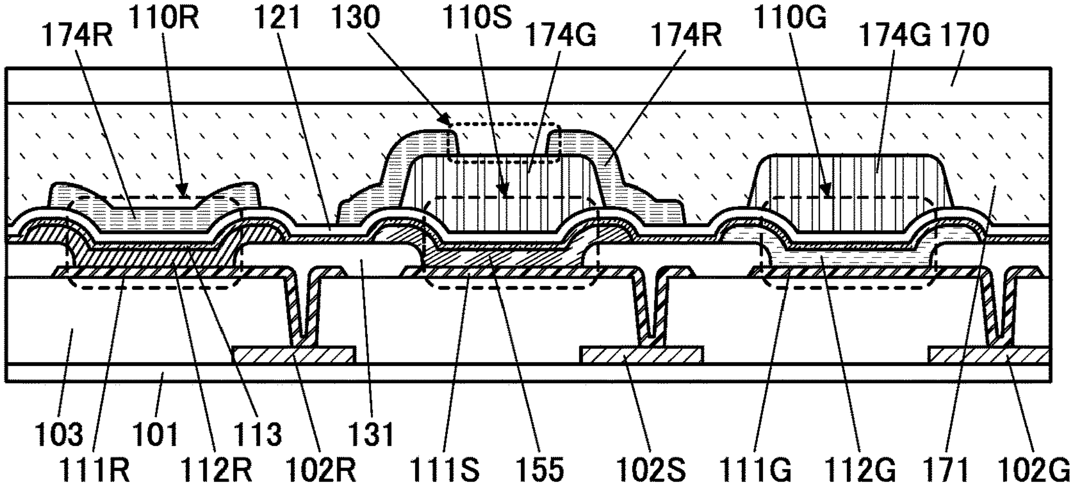
FIG. 8A to FIG. 8C are diagrams illustrating structure examples of a display apparatus.

FIG. 8A illustrates an example of the case in which the spacer 135 and the light-blocking layer 136 are formed using coloring layers.

The structure illustrated in FIG. 8A includes a coloring layer 174G instead of the spacer 135 and 174R instead of the light-blocking layer 136.

The coloring layer 174G has a function of a color filter that transmits green light and absorbs light of the other colors. The coloring layer 174R has a function of a color filter that transmits red light and absorbs light of the other colors.

Most of the light entering from the direction perpendicular to the light-receiving surface of the light-receiving element 110S except for green light is absorbed when passing through the coloring layer 174G. As a result, green light enters the light-receiving element 110S.

The coloring layer used as the spacer can be determined in accordance with the wavelength of light used as a light source in image capturing, the sensitivity characteristics of the light-receiving element 110S, and the like. Although an example using the coloring layer 174G serving as a green color filter is described here, the coloring layer 174R serving as a red color filter or a coloring layer serving as a blue color filter may be used, or a color filter that transmits light (infrared light or ultraviolet light) other than visible light may be used.

Most of the light entering from an oblique direction with respect to the light-receiving surface of the light-receiving element 110S except for red light is absorbed when passing through the coloring layer 174R, and the remaining red light is absorbed by the coloring layer 174G. Thus, coloring layers of different colors can be combined to function as a light-blocking layer.

As the coloring layer used instead of the light-blocking layer 136, a color filter different in color from the coloring layer used as the spacer can be used. For example, in the example illustrated in FIG. 8A, since the coloring layer 174G is used as the spacer, a color filter that transmits blue light and absorbs light of the other colors may be used instead of the coloring layer 174R.

As illustrated in FIG. 8A, each coloring layer is preferably provided to overlap with the light-emitting element 110 that corresponds to the color of the coloring layer. The coloring layer 174R is provided over the light-emitting element 110R, and the coloring layer 174G is provided over the light-emitting element 110G. Providing the coloring layers for the light-emitting elements can further increase the color purity, so that a display apparatus with high color reproducibility can be achieved. Furthermore, when a coloring layer is used, reflection of external light can be inhibited, so that a circularly polarizing plate for preventing reflection can be omitted. Therefore, light extraction efficiency is increased, which is preferable because it not only increases luminance but also reduces power consumption.

Figure 8B:
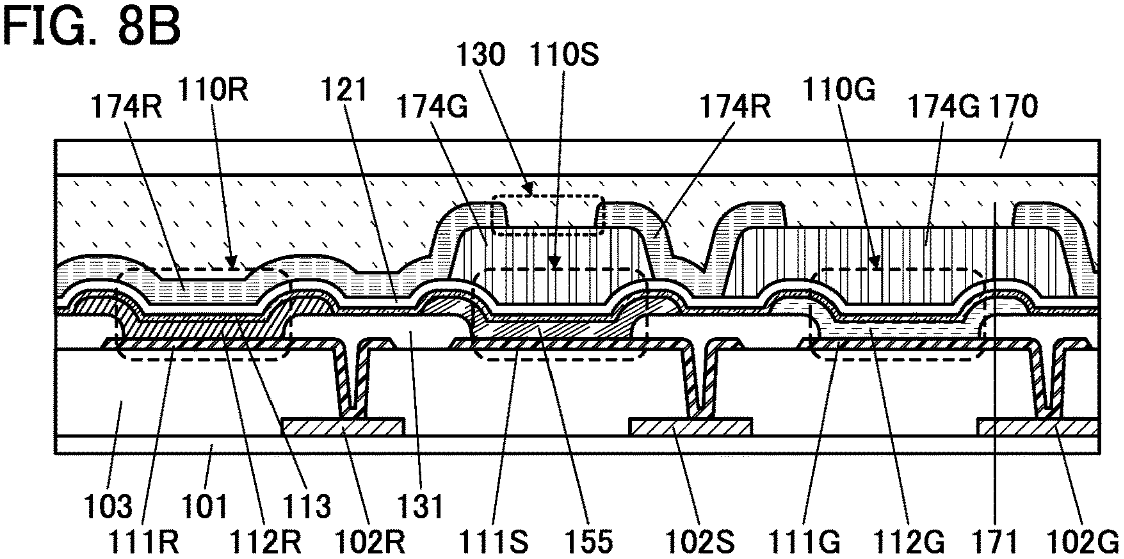
Figure 8C:
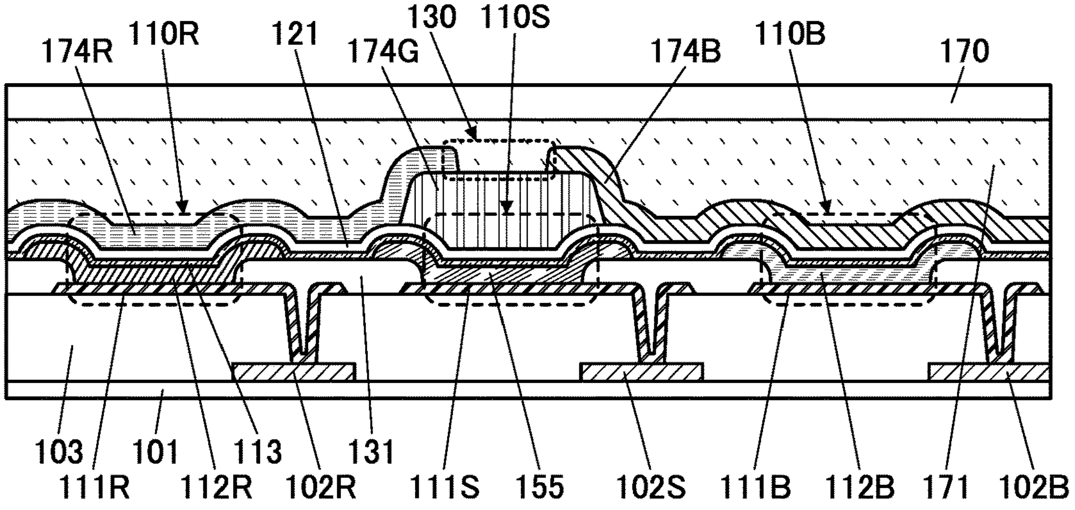

FIG. 8B and FIG. 8C illustrate examples in which the coloring layer is continuously formed and is not cut between each light-emitting element and the light-receiving element 110S.

As illustrated in FIG. 8B, the coloring layer 174G used as the spacer is preferably cut between the light-receiving element 110S and the light-emitting element 110B. In the case where the coloring layer 174G is provided continuously between the light-receiving element 110S and the light-emitting element 110B, light emitted by the light-emitting element 110B might travel inside the coloring layer 174G and reach the light-receiving element 110S. Meanwhile, the coloring layer 174R is not necessarily cut between the light-emitting element 110R and the light-receiving element 110S because light emitted by the light-emitting element 110R is, even if it travels inside the coloring layer 174R, absorbed by the coloring layer 174G over the light-receiving element 110S.

FIG. 8C illustrates a cross section of the light-emitting element 110B that exhibits blue light emission. The light-emitting element 110B includes the pixel electrode 111B, the organic layer 112B, and the common electrode 113. The pixel electrode 111B is electrically connected to the transistor 102B through an opening provided in the insulating layer 103. A coloring layer 174B functioning as a blue color filter is provided over the light-emitting element 110B.

As illustrated in FIG. 8C, over the coloring layer 174G over the light-receiving element 110S, the coloring layer 174R and the coloring layer 174B may be provided to face each other with the opening 130 positioned therebetween.

Structure Example 1-7

Figure 9A:
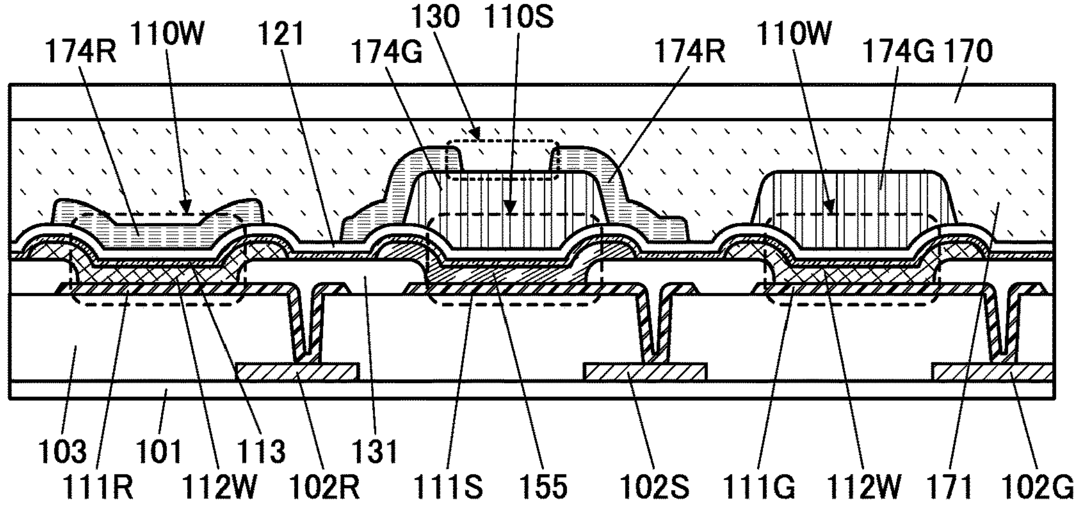
FIG. 9A to FIG. 9C are diagrams illustrating structure examples of a display apparatus.
Figure 9B:
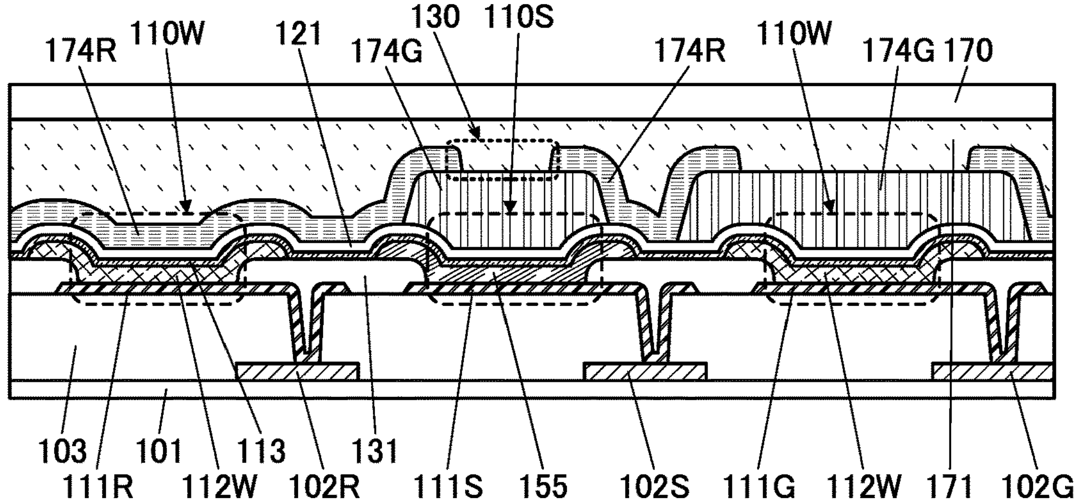
Figure 9C:
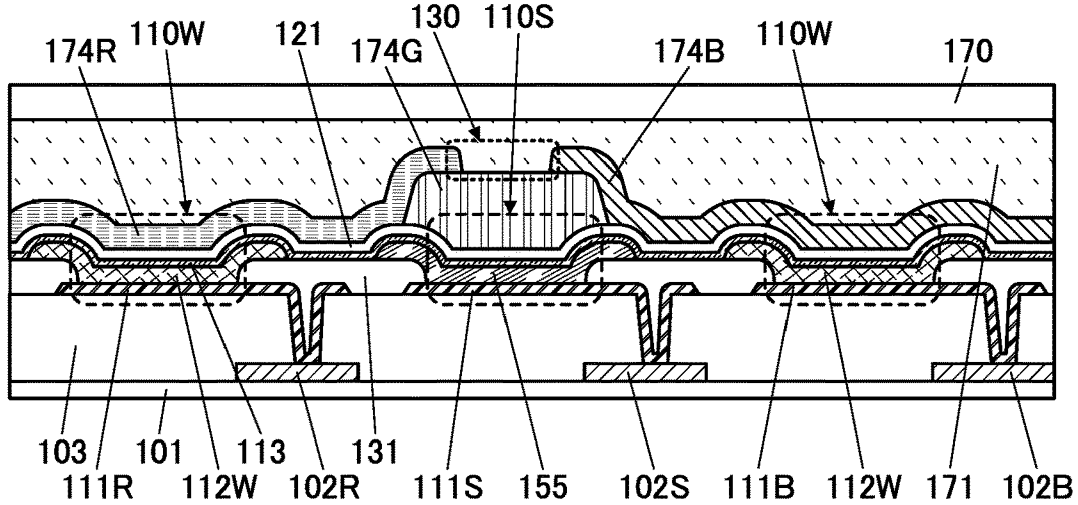

FIG. 9A, FIG. 9B, and FIG. 9C illustrate examples in which light-emitting elements emitting white light are used in the above-described structure example 1-6.

A light-emitting element 110W includes an organic layer 112W between the pixel electrode and the common electrode 113. The organic layer 112W exhibits white light. For example, the organic layer 112 can contain two or more kinds of light-emitting materials emitting light of complementary colors.

The coloring layer 174R, the coloring layer 174G, or the coloring layer 174B is included in a region overlapping with the light-emitting element 110W. Thus, full-color display can be performed.

Structure Example 2

Examples of a structure obtained by processing organic layers by a photolithography method are described below.

It is known that in the case where some or all of EL layers are separately formed for light-emitting elements with different emission colors, the EL layers are formed by an evaporation method using a shadow mask such as a fine metal mask (hereinafter, also referred to as an FMM). However, this method has difficulty in achieving high resolution and a high aperture ratio of a display apparatus because in this method, a deviation from the designed shape and position of the island-shaped organic film is caused by various influences such as the accuracy of the FMM, the positional deviation between the FMM and a substrate, a warp of the FMM, and the vapor-scattering-induced expansion of the outline of the deposited film. Thus, a measure has been taken for pseudo improvement in resolution (also referred to as pixel density) by employing a unique pixel arrangement method such as a PenTile arrangement.

In the manufacturing method using an FMM, two adjacent island-shaped organic films can be formed to partly overlap with each other in order to achieve higher resolution and a higher aperture ratio as much as possible. Thus, the distance between light-emitting regions can be significantly shortened compared with the case where the two island-shaped organic films do not overlap with each other. However, when the two adjacent island-shaped organic films are formed to overlap with each other, a leakage current might be generated through the organic films formed to overlap with each other between the two adjacent light-emitting elements and unintentional light emission might occur. This causes a decrease in luminance, a decrease in contrast, or the like, leading to a reduction in display quality. Furthermore, power efficiency, power consumption, or the like is adversely affected by the leakage current.

In addition, in the case where the leakage current is also generated between the light-emitting element and the light-receiving element, the leakage current is a factor of noise in image capturing by the light-receiving element; thus, image capturing sensitivity (an S/N ratio) might be reduced.

In view of the above, in one embodiment of the present invention, some or all of the organic layers positioned between the pair of electrodes of the light-emitting element and some or all of the organic layers positioned between the pair of electrodes of the light-receiving element are processed by a photolithography method. At this time, processing is preferably performed so that the organic layers are separated and are not in contact with each other between the adjacent light-emitting elements and between the adjacent light-emitting element and light-receiving element. Accordingly, a current leakage path (leakage path) through the organic layers between the light-emitting elements and between the light-emitting element and the light-receiving element can be cut off.

In this manner, a leakage current (also referred to as side leakage or a side leakage current) between the light-emitting element and the light-receiving element can be inhibited and an image can be captured with a high S/N ratio and high accuracy. Therefore, a clear image can be captured even with weak light. Thus, the luminance of the light-emitting element used as a light source can be reduced in image capturing, leading to a reduction in power consumption.

Moreover, a current leakage path between two adjacent light-emitting elements can be cut off. Thus, it is possible to increase luminance, contrast, and power efficiency or to reduce power consumption, for example.

Furthermore, an insulating layer is preferably formed to protect a side surface of the organic stacked film that is exposed by etching. Thus, the reliability of the display apparatus can be improved.

Between two adjacent light-emitting elements and between the adjacent light-emitting element and light-receiving element, there is a region (a depressed portion) where an organic layer of the light-receiving element and the light-emitting element is not provided. In the case where a common electrode or a common electrode and a common layer are formed to cover the depressed portion, a phenomenon where the common electrode is cut by a step at an end portion of the EL layer (such a phenomenon is also referred to as disconnection) might occur, which might cause insulation of the common electrode over the EL layer. In view of this, a local gap between the two adjacent light-emitting elements is preferably filled with a resin layer functioning as a planarization film (this structure is also referred to as local filling planarization, or LFP). The resin layer has a function of a planarization film. This structure can inhibit disconnection of the common layer or the common electrode and enables a highly reliable display apparatus.

In the case where the resin layer is provided in contact with the EL layer, the EL layer might be dissolved by a solvent or the like used in formation of the resin layer. Thus, it is preferable that an insulating layer for protecting a side surface of the EL layer be provided between the EL layer and the resin layer. That is, in the end portion of the EL layer, it is preferable that an inorganic insulating layer be provided in contact with the side and top surfaces of the EL layer, and that the resin layer be provided over the inorganic insulating layer.

Here, it is preferable that a partition covering an end portion of the pixel electrode be not provided. When such a partition is used, a region of the pixel electrode that is covered with the partition is to be a non-light-emitting region, reducing the aperture ratio accordingly. In one embodiment of the present invention, when the end portion of the pixel electrode has a tapered shape, step coverage with an EL film formed over the pixel electrode is improved; thus, the EL layer can be prevented from being cut by a step of the end portion of the pixel electrode without using the partition. As a result, the aperture ratio can be significantly increased.

Note that a display apparatus combining a light-emitting element emitting white light and a color filter can also be obtained. In that case, light-emitting elements having the same structure can be employed as light-emitting elements provided in pixels (subpixels) that exhibit light of different colors, which allows all the layers to be common layers. In addition, some or all of the EL layers are cut by photolithography. Thus, a leakage current through the common layer is suppressed; accordingly, a high-contrast display apparatus can be achieved. In particular, when an element has a tandem structure in which a plurality of light-emitting layers are stacked with an intermediate layer having high conductivity therebetween, a leakage current through the intermediate layer can be effectively prevented, achieving a display apparatus with high luminance, high resolution, and high contrast.

Structure Example 2-1

Figure 10A:
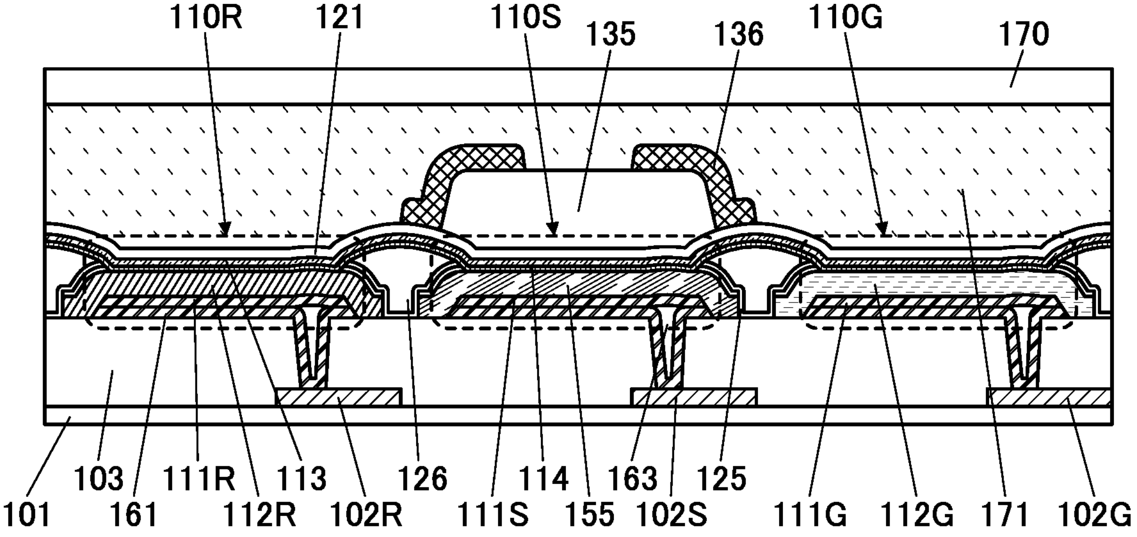
FIG. 10A and FIG. 10B are diagrams illustrating a structure example of a display apparatus.

FIG. 10A is a schematic cross-sectional view of a display apparatus described below as an example. FIG. 10A illustrates a cross-sectional view of the area including the light-emitting element 110R, the light-emitting element 110G, and the light-receiving element 110S.

The light-emitting element 110R includes the pixel electrode 111R, the organic layer 112R, a common layer 114, and the common electrode 113. The light-emitting element 110G includes the pixel electrode 111G, the organic layer 112G, the common layer 114, and the common electrode 113. The light-receiving element 110S includes the pixel electrode 111S, the organic layer 155, the common layer 114, and the common electrode 113. The common layer 114 and the common electrode 113 are provided as continuous layers shared by the light-emitting element 110R, the light-emitting element 110G, the light-receiving element 110S, and the light-emitting element 110B (not illustrated).

Conductive layers 161 are provided over the insulating layer 103, and the pixel electrodes 111 of the light-emitting elements 110 and the light-receiving element 110S are provided over the conductive layers 161. The conductive layers 161 are electrically connected to the transistors through openings provided in the insulating layer 103. In a connection portion between the conductive layer 161 and the transistor 102, a depressed portion is formed on a top surface of the conductive layer 161, and a planarization layer 163 is provided to fill the depressed portion. Since the planarization layer 163 allows a portion of the pixel electrode 111 overlapping with the connection portion to be flat, usage as the light-emitting region of the light-emitting element or the light-receiving region of the light-receiving element is possible.

The organic layer 112 and the common layer 114 can each independently include one or more of an electron-injection layer, an electron-transport layer, a hole-injection layer, and a hole-transport layer. For example, it is possible to employ a structure in which the organic layer 112 includes a stacked-layer structure of a hole-injection layer, a hole-transport layer, a light-emitting layer, and an electron-transport layer from the pixel electrode 111 side and the common layer 114 includes an electron-injection layer. For example, a film not containing an organic compound but containing only an inorganic compound or an inorganic substance can also be used as the common layer 114.

FIG. 10A illustrates an example of the case in which the insulating layer 131 covering an end portion of the pixel electrode 111 is not provided. Since the organic layer 112 or the organic layer 155 includes a portion that covers the end portion of the pixel electrode 111, the end portion of the pixel electrode 111 preferably has a tapered shape.

The organic layer 112 and the organic layer 155 are processed into an island shape by a photolithography method. Thus, the end portion of each of the organic layer 112 and the organic layer 155 has a shape in which the angle formed by the top surface and the side surface is close to 90 degrees. In contrast, an organic film formed using an FMM (Fine Metal Mask) or the like has a thickness that tends to gradually decrease with decreasing the distance from an end portion, and has a top surface forming a slope in an area extending greater than or equal to 1 μm and less than or equal to 10 μm from the end portion, for example. Thus, such an organic film has a shape whose top surface and side surface are difficult to distinguish from each other. Preferably, the organic layer 112 and the organic layer 155 are processed to have a region where the angle formed by the side surface and the bottom surface (the taper angle) is greater than or equal to 10 degrees and less than or equal to 120 degrees, further preferably greater than or equal to 30 degrees and less than or equal to 110 degrees, still further preferably greater than or equal to 45 degrees and less than or equal to 100 degrees, yet still further preferably greater than or equal to 60 degrees and less than or equal to 95 degrees. A smaller taper angle can reduce the length from the end of the pixel electrode 111 to the end of the organic layer 112 or the organic layer 155 and thus enables a higher-resolution display apparatus.

Figure 10B:
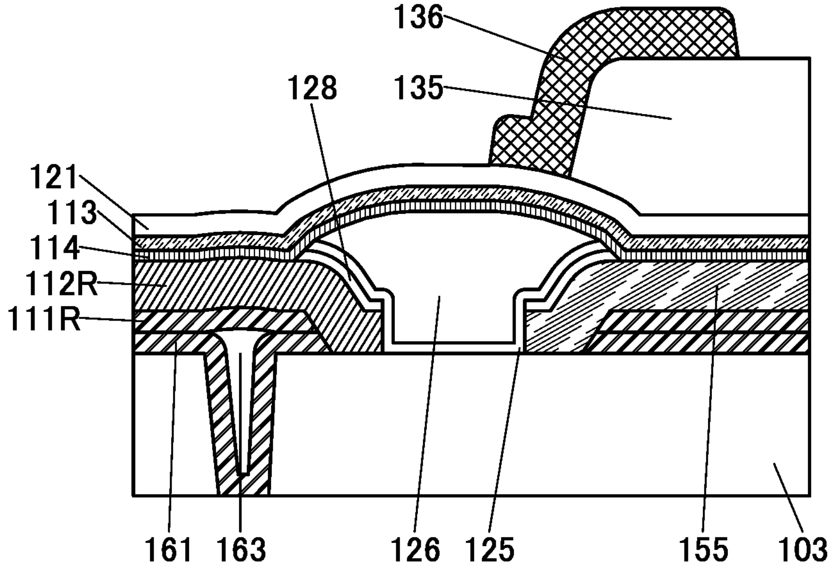

Between the adjacent light-emitting element 110 and light-receiving element 110S, an insulating layer 125 and a resin layer 126 are included. FIG. 10B illustrates an enlarged view of part of the light-emitting element 110R, part of the light-receiving element 110S, and a region therebetween.

Between the adjacent light-emitting element 110 and light-receiving element 110S, a side surface of the organic layer 112 and a side surface of the organic layer 155 are provided to face each other with the resin layers 126 positioned therebetween. The resin layer 126 has a smooth top surface shape, and the common layer 114 and the common electrode 113 are provided to cover a top surface of the resin layer 126.

The resin layer 126 functions as a planarization film for relieving a step of the end portion of the organic layer 112 or the end portion of the organic layer 155. Providing the resin layer 126 can prevent a phenomenon in which the common electrode 113 is divided by the step of the organic layer 112 or the organic layer 155 (also referred to as disconnection) from occurring and the common electrode over the organic layer 112 or the organic layer 155 from being insulated. The resin layer 126 can also be referred to as an LFP (Local Filling Planarization) layer.

An insulating layer containing an organic material can be suitably used as the resin layer 126. For the resin layer 126, an acrylic resin, a polyimide resin, an epoxy resin, an imide resin, a polyamide resin, a polyimide-amide resin, a silicone resin, a siloxane resin, a benzocyclobutene-based resin, a phenol resin, a precursor of these resins, or the like can be used, for example. For the resin layer 126, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin may be used.

Alternatively, a photosensitive resin can be used for the resin layer 126. A photoresist may be used for the photosensitive resin. As the photosensitive resin, a positive photosensitive material or a negative photosensitive material can be used.

The resin layer 126 may contain a material that absorbs visible light. For example, the resin layer 126 itself may be made of a material that absorbs visible light, or the resin layer 126 may contain a pigment that absorbs visible light. For example, for the resin layer 126, it is possible to use a resin that can be used as a color filter transmitting red, blue, or green light and absorbing other light, a resin that contains carbon black as a pigment and functions as a black matrix, or the like.

The insulating layer 125 is provided in contact with the side surface of the organic layer 112 and the side surface of the organic layer 155. Moreover, the insulating layer 125 is provided to cover an upper end portion of the organic layer 112 and an upper end portion of the organic layer 155. Furthermore, part of the insulating layer 125 is provided in contact with a top surface of the insulating layer 103.

The insulating layer 125 is positioned between the resin layer 126 and the organic layer 112 or the organic layer 155, and functions as a protective layer preventing the resin layer 126 from being in contact with the organic layer 112 or the organic layer 155. When the resin layer 126 is in contact with the organic layer 112 or the organic layer 155, the organic layer 112 or the organic layer 155 might be dissolved by an organic solvent or the like used in formation of the resin layer 126. Thus, by providing the insulating layer 125, the side surface of the organic layer can be protected. Furthermore, the insulating layer 125 can prevent the side surface of the organic layer 112 or the side surface of organic layer 155 from being exposed to the air. Accordingly, the light-emitting elements and the light-receiving element with high reliability can be manufactured.

An insulating layer containing an inorganic material can be used for the insulating layer 125. For the insulating layer 125, an inorganic insulating film such as an oxide insulating film, a nitride insulating film, an oxynitride insulating film, or a nitride oxide insulating film can be used, for example. The insulating layer 125 may have either a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, when a metal oxide film such as an aluminum oxide film or a hafnium oxide film or an inorganic insulating film such as a silicon oxide film that is formed by an ALD method is employed for the insulating layer 125, it is possible to form the insulating layer 125 that has a small number of pinholes and has an excellent function of protecting the EL layer.

Note that in this specification and the like, oxynitride refers to a material that contains more oxygen than nitrogen in its composition, and nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

For the formation of the insulating layer 125, a sputtering method, a CVD method, a PLD method, an ALD method, or the like can be used. The insulating layer 125 is preferably formed by an ALD method achieving good coverage.

At the upper end portion of the organic layer 112 or the upper end portion of the organic layer 155, the resin layer 126 is provided to cover a top surface of the organic layer 112 or a top surface of the organic layer 155. A layer 128 and the insulating layer 125 are stacked in this order between the resin layer 126 and the top surface of the organic layer 112 or the top surface of the organic layer 155. The layer 128 is provided in contact with the top surface of the organic layer 112.

The layer 128 is a part of a protective layer (also referred to as a mask layer or a sacrificial layer) for protecting the organic layer 112 or the organic layer 155, which remains even after the etching of the organic layer 112 or the organic layer 155. For the layer 128, a material that can be used for the insulating layer 125 can be used. It is particularly preferable to use the same material for the layer 128 and the insulating layer 125 because an apparatus or the like for processing can be used in common.

In particular, since a metal oxide film such as an aluminum oxide film or a hafnium oxide film or an inorganic insulating film such as a silicon oxide film that is formed by an ALD method has few pinholes, by using any of the films as the layer 128, the insulating layer 125 having an excellent function of protecting the EL layer can be formed.

In particular, an insulating film capable of being processed by wet etching is preferably used as the layer 128. Since the layer 128 is a film in contact with the top surface of the organic layer 112, wet etching that gives less damage to a formation surface is employed for processing the layer 128, in which case the reliability of the light-emitting elements 110 and the light-receiving element 110S can be improved.

The protective layer 121 is provided to cover the common electrode 113, and the spacer 135 and the light-blocking layer 136 are provided over the protective layer 121. For the protective layer 121, the spacer 135, the light-blocking layer 136, and the like, the description in Structure example 1 can be referred to.

Structure Example 2-2

Figure 11A:
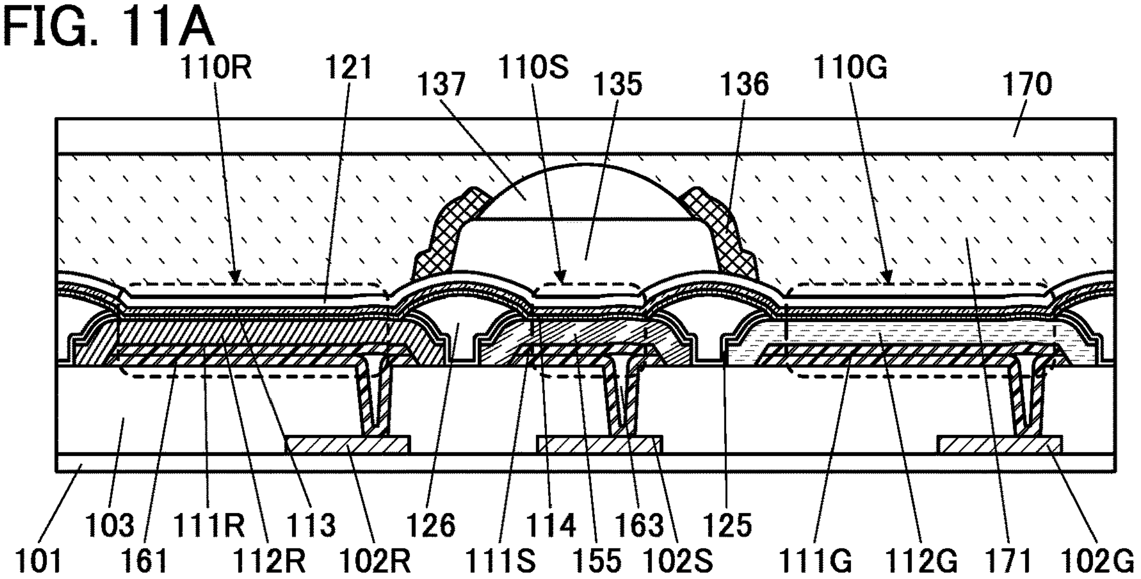
FIG. 11A to FIG. 11C are diagrams illustrating structure examples of a display apparatus.
Figure 11B:
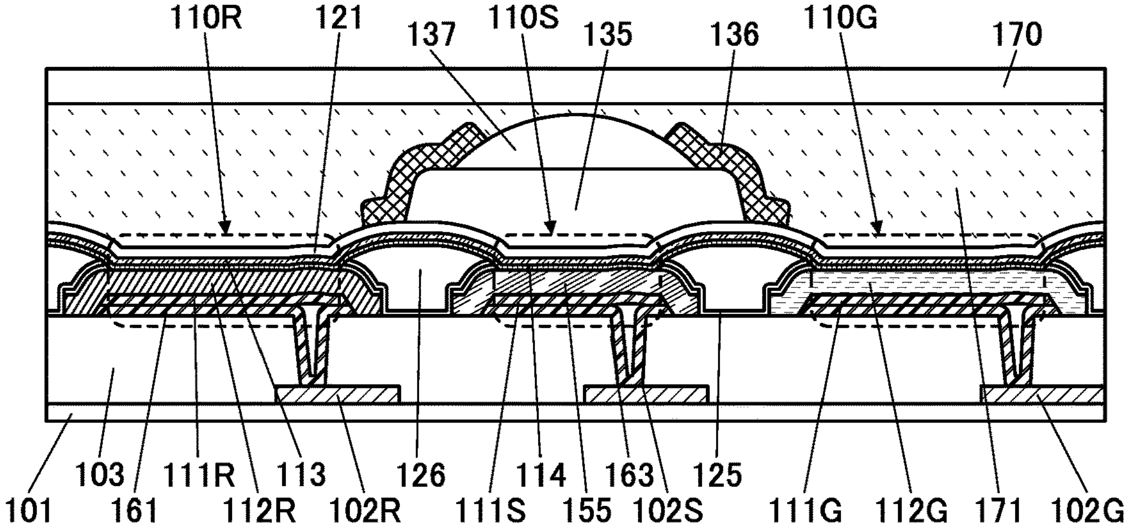

FIG. 11A and FIG. 11B each illustrate an example in which the lens 137 is used in the structure illustrated as an example in FIG. 10A.

As described in the structure example 1-3, in the case where the lens 137 is used, the diameter of the opening 130 of the light-blocking layer 136 is preferably larger than the diameter of the light-receiving region of the light-receiving element 110S. In the structure example 1-3, the diameter of the opening in the light-receiving element 110S can be controlled with the diameter of the opening of the insulating layer 131. However, since the insulating layer 131 is not used in this structure, the light-receiving region of the light-receiving element 110S corresponds to the diameter of the pixel electrode 111S or the diameter of the opening of the resin layer 126, the insulating layer 125, or the layer 128.

FIG. 11A illustrates an example in which the light-receiving region of the light-receiving element 110S is smaller than the light-emitting region of the light-emitting element 110. This can increase the aperture ratio (effective light-emitting area ratio) of the light-emitting element and improve reliability.

FIG. 11B illustrates an example in which the diameter of the light-receiving region of the light-receiving element 110S is smaller and the width of the resin layer 126 is larger than those in FIG. 10A. This can increase the distance between the light-receiving element 110S and the adjacent light-emitting element and can increase the diameter of the lens 137 accordingly. Therefore, the amount of light received by the light-receiving element 110S can be further increased.

Figure 11C:
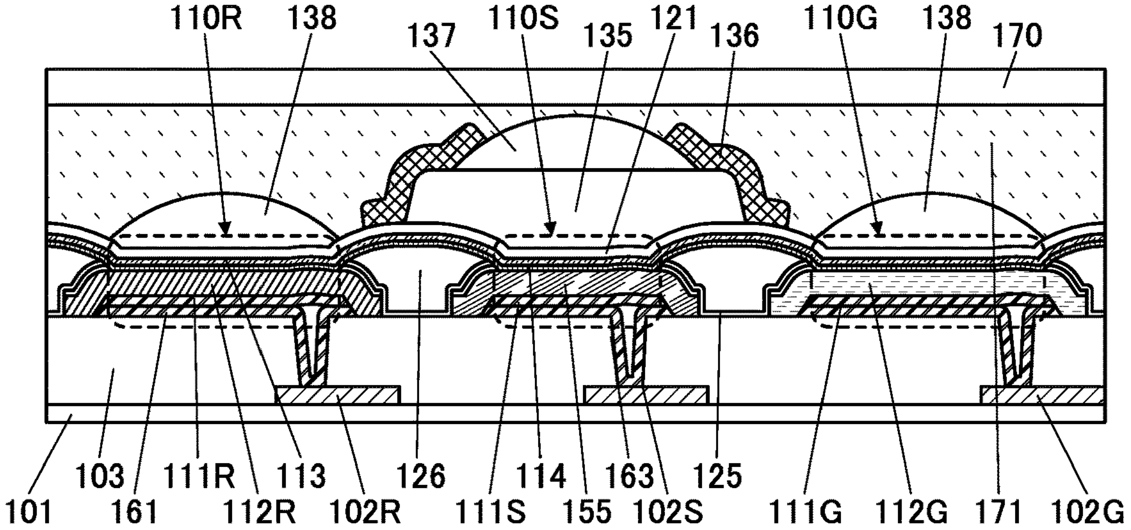

FIG. 11C illustrates an example in which the lens 138 is further provided also for the light-emitting element 110 in the structure illustrated in FIG. 11B.

Structure Example 2-3

Figure 12A:
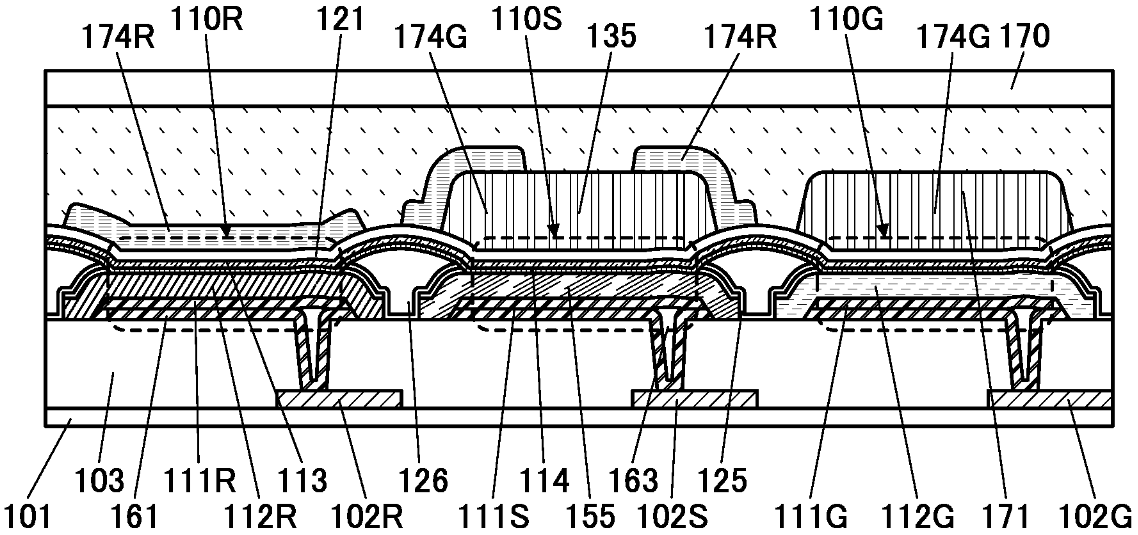
FIG. 12A and FIG. 12B are diagrams illustrating structure examples of a display apparatus.

FIG. 12A illustrates an example in which the spacer 135 and the light-blocking layer 136 are formed of the coloring layer 174R, the coloring layer 174G, and the like.

Figure 12B:
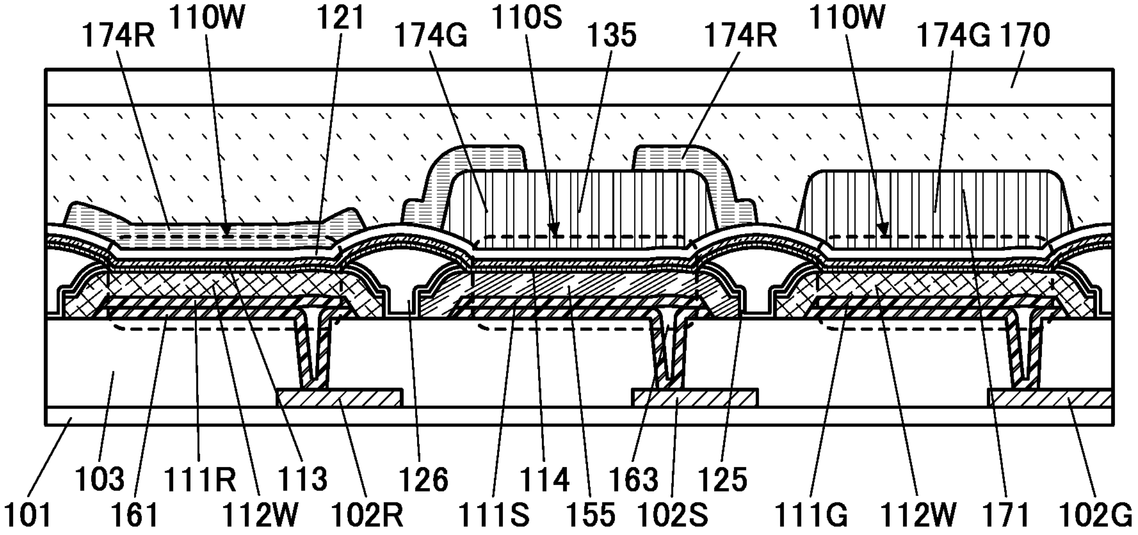

FIG. 12B illustrates an example in which the white-light-emitting elements 110W are used as the light-emitting elements in FIG. 12A.

Formation of the spacer 135 and the light-blocking layer 136 using coloring layers in this manner is preferable to prevent stray light into the light-receiving element 110S and make the captured image clear without increasing the number of steps.

The above is the description of the structure examples.

At least part of the structure examples, the drawings corresponding thereto, and the like described in this embodiment can be combined with the other structure examples, the other drawings, and the like as appropriate.

At least part of this embodiment can be implemented in appropriate combination with the other embodiments described in this specification.

Embodiment 2

In this embodiment, a structure example of a display apparatus of one embodiment of the present invention will be described. Although a display apparatus capable of displaying an image is described here, when a light-emitting element is used as a light source, the display apparatus can be used as an image capturing device.

The display apparatus of this embodiment can be a high-definition display apparatus or a large-sized display apparatus. Accordingly, the display apparatus of this embodiment can also be used for display portions of a digital camera, a digital video camera, a digital photo frame, a mobile phone, a portable game console, a smartphone, a wristwatch terminal, a tablet terminal, a portable information terminal, and an audio reproducing device, in addition to display portions of electronic devices with a relatively large screen, such as a television device, a desktop or notebook personal computer, a monitor of a computer or the like, digital signage, and a large game machine such as a pachinko machine.

[Display Apparatus 400]

Figure 13:
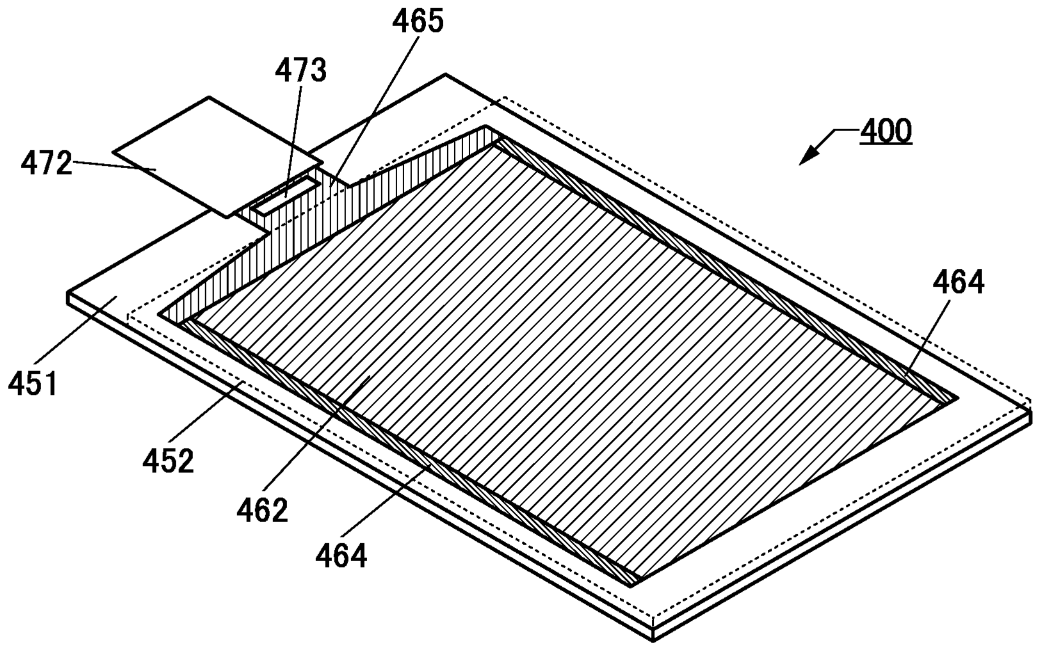
FIG. 13 is a diagram illustrating a structure example of a display apparatus.
Figure 14A:
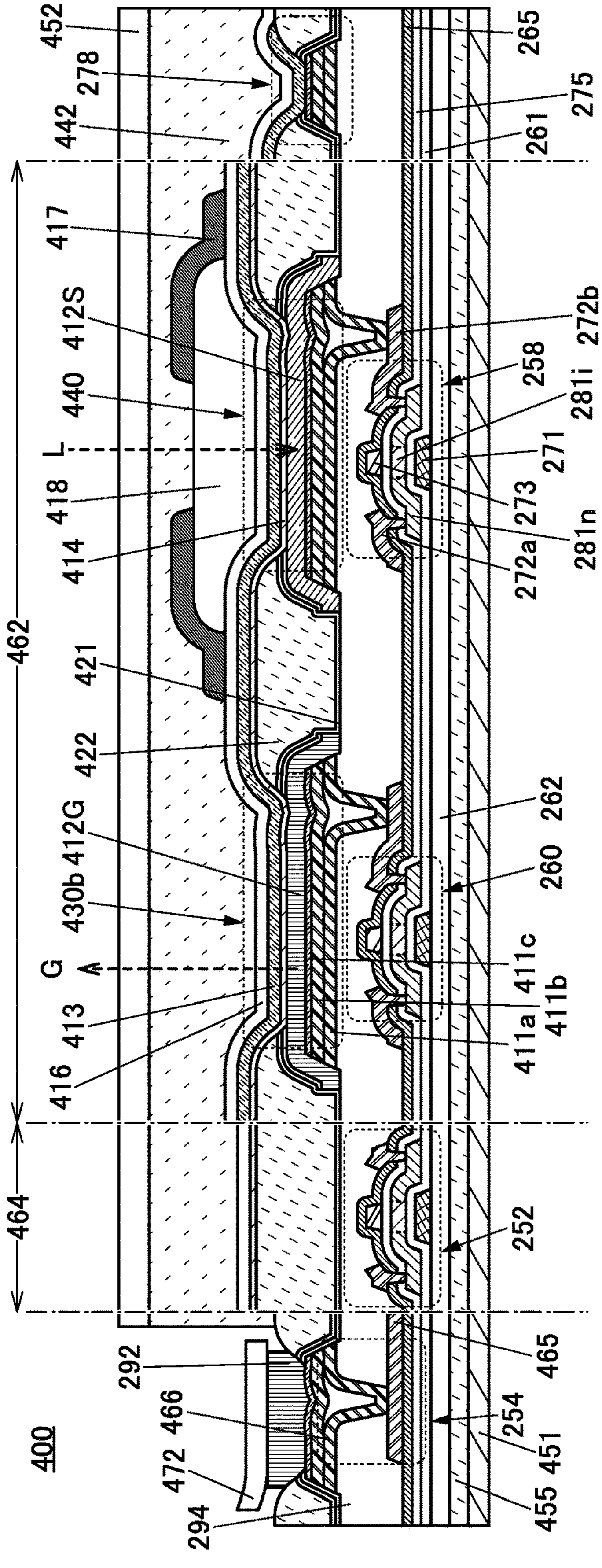
FIG. 14A is a diagram illustrating a structure example of a display apparatus.

FIG. 13 illustrates a perspective view of a display apparatus 400, and FIG. 14A illustrates a cross-sectional view of the display apparatus 400.

The display apparatus 400 has a structure in which a substrate 452 and a substrate 451 are bonded to each other. In FIG. 13, the substrate 452 is denoted by a dashed line.

The display apparatus 400 includes a display portion 462, a circuit 464, a wiring 465, and the like. FIG. 13 illustrates an example in which an IC 473 and an FPC 472 are integrated on the display apparatus 400. Thus, the structure illustrated in FIG. 14 can also be regarded as a display module including the display apparatus 400, the IC (integrated circuit), and the FPC.

As the circuit 464, for example, a scan line driver circuit can be used.

The wiring 465 has a function of supplying a signal and power to the display portion 462 and the circuit 464. The signal and power are input to the wiring 465 from the outside through the FPC 472 or input to the wiring 465 from the IC 473.

FIG. 13 illustrates an example in which the IC 473 is provided over the substrate 451 by a COG (Chip On Glass) method, a COF (Chip on Film) method, or the like. An IC including a scan line driver circuit, a signal line driver circuit, or the like can be used as the IC 473, for example. Note that the display apparatus 400 and the display module are not necessarily provided with an IC. The IC may be mounted on the FPC by a COF method or the like.

FIG. 14A illustrates an example of cross sections of part of a region including the FPC 472, part of the circuit 464, part of the display portion 462, and part of a region including a connection portion in the display apparatus 400. FIG. 14A specifically illustrates an example of a cross section of a region including a light-emitting element 430*b* that emits green light (G) and a light-receiving element 440 that receives reflected light (L) of the display portion 462.

The display apparatus 400 illustrated in FIG. 14A includes a transistor 252, a transistor 260, a transistor 258, the light-emitting element 430*b*, the light-receiving element 440, and the like between the substrate 451 and the substrate 452.

The light-emitting element or the light-receiving element that are described above as examples can be applied to the light-emitting element 430*b* and the light-receiving element 440, respectively.

Here, in the case where a pixel of the display apparatus includes three kinds of subpixels including light-emitting elements with different emission colors, as the three subpixels, subpixels of three colors of red (R), green (G), and blue (B), subpixels of three colors of yellow (Y), cyan (C), and magenta (M), and the like can be given. In the case where four subpixels are included, as the four subpixels, subpixels of four colors of R, G, B, and white (W), subpixels of four colors of R, G, B, and Y, and the like can be given. Alternatively, the subpixel may include a light-emitting element emitting infrared light.

As the light-receiving element 440, a photoelectric conversion element having sensitivity to light in a red, green, or blue wavelength range or a photoelectric conversion element having sensitivity to light in an infrared wavelength range can be used.

The substrate 452 and a protective layer 416 are bonded to each other with an adhesive layer 442. The adhesive layer 442 is provided so as to overlap with each of the light-emitting element 430*b* and the light-receiving element 440, and the display apparatus 400 employs a solid sealing structure.

The light-emitting element 430*b* and the light-receiving element 440 each include a conductive layer 411*a*, a conductive layer 411*b*, and a conductive layer 411*c* as pixel electrodes. The conductive layer 411*b* has a reflective property with respect to visible light and functions as a reflective electrode. The conductive layer 411*c* has a transmitting property with respect to visible light and functions as an optical adjustment layer.

The conductive layer 411*a* included in the light-emitting element 430*b* is connected to a conductive layer 272*b* included in the transistor 260 through an opening provided in an insulating layer 294. The transistor 260 has a function of controlling the driving of the light-emitting element. In contrast, the conductive layer 411*a* included in the light-receiving element 440 is electrically connected to the conductive layer 272*b* included in the transistor 258. The transistor 258 has a function of controlling the timing of light exposure using the light-receiving element 440.

An organic layer 412G or an organic layer 412S is provided to cover the pixel electrode. An insulating layer 421 is provided in contact with a side surface of the organic layer 412G and a side surface of the organic layer 412S, and a resin layer 422 is provided over the insulating layer 421. An organic layer 414, a common electrode 413, and the protective layer 416 are provided to cover the organic layer 412G and the organic layer 412S. With the protective layer 416 covering the light-emitting element, entry of impurities such as water into the light-emitting element can be inhibited, leading to higher reliability of the light-emitting element. A spacer 418 is provided over the protective layer 416 to cover the light-receiving element 440, and a light-blocking layer 417 including an opening is provided to cover a top surface and a side surface of the spacer 418.

Light G emitted from the light-emitting element 430*b* is emitted toward the substrate 452 side. The light-receiving element 440 receives light L incident through the substrate 452 and converts the light L into an electric signal. For the substrate 452, a material having a high transmitting property with respect to visible light is preferably used.

The transistor 252, the transistor 260, and the transistor 258 are all formed over the substrate 451. These transistors can be manufactured using the same materials in the same process.

Note that the transistor 252, the transistor 260, and the transistor 258 may be separately formed to have different structures. For example, it is possible to separately form a transistor having a back gate and a transistor having no back gate, or transistors having semiconductors, gate electrodes, gate insulating layers, source electrodes, and drain electrodes that are formed of different materials and/or have different thicknesses.

The substrate 451 and an insulating layer 262 are bonded to each other with an adhesive layer 455.

In a manufacturing method of the display apparatus 400, first, a formation substrate provided with the insulating layer 262, the transistors, the light-emitting elements, the light-receiving element, and the like is bonded to the substrate 452 provided with the light-blocking layer 417 with the adhesive layer 442. Then, the substrate 451 is bonded to a surface exposed by separation of the formation substrate, whereby the components formed over the formation substrate are transferred onto the substrate 451. The substrate 451 and the substrate 452 preferably have flexibility. This can increase the flexibility of the display apparatus 400.

A connection portion 254 is provided in a region of the substrate 451 that does not overlap with the substrate 452. In the connection portion 254, the wiring 465 is electrically connected to the FPC 472 through a conductive layer 466 and a connection layer 292. The conductive layer 466 can be obtained by processing the same conductive film as the pixel electrode. Thus, the connection portion 254 and the FPC 472 can be electrically connected to each other through the connection layer 292.

Each of the transistor 252, the transistor 260, and the transistor 258 includes a conductive layer 271 functioning as a gate, an insulating layer 261 functioning as a gate insulating layer, a semiconductor layer 281 including a channel formation region 281*i* and a pair of low-resistance regions 281*n*, a conductive layer 272*a* connected to one of the pair of low-resistance regions 281*n*, the conductive layer 272*b* connected to the other of the pair of low-resistance regions 281*n*, an insulating layer 275 functioning as a gate insulating layer, a conductive layer 273 functioning as a gate, and an insulating layer 265 covering the conductive layer 273. The insulating layer 261 is positioned between the conductive layer 271 and the channel formation region 281*i*. The insulating layer 275 is positioned between the conductive layer 273 and the channel formation region 281*i*.

The conductive layer 272*a* and the conductive layer 272*b* are connected to the corresponding low-resistance regions 281*n* through openings provided in the insulating layer 265. One of the conductive layer 272*a* and the conductive layer 272*b* functions as a source, and the other functions as a drain.

FIG. 14A illustrates an example in which the insulating layer 275 covers top and side surfaces of the semiconductor layer. The conductive layer 272*a* and the conductive layer 272*b* are connected to the corresponding low-resistance regions 281*n* through openings provided in the insulating layer 275 and the insulating layer 265.

Figure 14B:
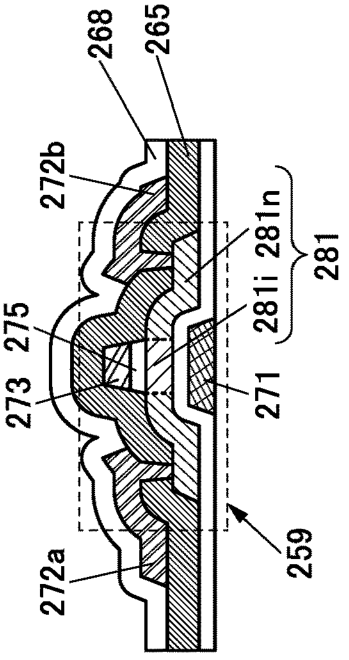
FIG. 14B is a diagram illustrating a structure example of a transistor.

Meanwhile, in a transistor 259 illustrated in FIG. 14B, the insulating layer 275 overlaps with the channel formation region 281*i* of the semiconductor layer 281 and does not overlap with the low-resistance regions 281*n*. The structure illustrated in FIG. 14B can be manufactured by processing the insulating layer 275 using the conductive layer 273 as a mask, for example. In FIG. 14B, the insulating layer 265 is provided to cover the insulating layer 275 and the conductive layer 273, and the conductive layer 272*a* and the conductive layer 272*b* are connected to the low-resistance regions 281*n* through the openings in the insulating layer 265. Furthermore, an insulating layer 268 covering the transistor may be provided.

There is no particular limitation on the structure of the transistors included in the display apparatus of this embodiment. For example, a planar transistor, a staggered transistor, an inverted staggered transistor, or the like can be used. A top-gate or a bottom-gate transistor structure may be employed. Alternatively, gates may be provided above and below the semiconductor layer in which a channel is formed.

The structure in which the semiconductor layer where a channel is formed is interposed between two gates is used for the transistor 252, the transistor 260, and the transistor 258. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the semiconductor layer of the transistor, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case deterioration of the transistor characteristics can be inhibited.

The semiconductor layer of the transistor preferably includes a metal oxide (also referred to as an oxide semiconductor). That is, a transistor including a metal oxide in its channel formation region (hereinafter, also referred to as an OS transistor) is preferably used for the display apparatus of this embodiment.

The band gap of a metal oxide used for the semiconductor layer of the transistor is preferably 2 eV or more, further preferably 2.5 eV or more. With the use of a metal oxide having a wide bandgap, the off-state current of the OS transistor can be reduced.

A metal oxide preferably contains at least indium or zinc and further preferably contains indium and zinc. A metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. In particular, M is preferably one or more kinds selected from gallium, aluminum, yttrium, and tin, and M is further preferably gallium. Hereinafter, a metal oxide containing indium, M, and zinc is referred to as In-M-Zn oxide in some cases.

For example, In—Ga—Zn oxide, In—Sn—Zn oxide, or In—Ga—Zn oxide containing Sn is preferably used.

Alternatively, the semiconductor layer of the transistor may contain silicon. Examples of silicon include amorphous silicon and crystalline silicon (e.g., low-temperature polysilicon (also referred to as LTPS) or single crystal silicon).

In particular, low-temperature polysilicon has relatively high mobility and can be formed over a glass substrate, and thus can be suitably used for a display apparatus. For example, a transistor including low-temperature polysilicon in a semiconductor layer (an LTPS transistor) can be used as the transistor 252 and the like included in the driver circuit, and a transistor including an oxide semiconductor in a semiconductor layer (an OS transistor) can be used as the transistor 260, the transistor 258, and the like provided in the pixel. When both an LTPS transistor and an OS transistor are used, the display apparatus can have low power consumption and high drive capability. A structure where an LTPS transistor and an OS transistor are used in combination is referred to as LTPO in some cases. Note that as a more favorable example, it is preferable to use an OS transistor as a transistor or the like functioning as a switch for controlling electrical continuity between wirings and an LTPS transistor as a transistor or the like for controlling current.

Note that the display apparatus illustrated in FIG. 14A includes an OS transistor and an organic layer which is divided between the light-emitting elements. With this structure, the leakage current that might flow through the transistor, the leakage current that might flow between adjacent light-emitting elements, and the leakage current that might flow between the light-emitting element and the light-receiving element adjacent to each other (also referred to as lateral leakage current, side leakage current, or the like) can become extremely low. With the structure, a viewer can notice any one or more of the image crispness, the image sharpness, a high chroma, and a high contrast ratio in an image displayed on the display apparatus. With the structure where the leakage current that might flow through the transistor and the lateral leakage current that might flow between the light-emitting elements are extremely low, display with little leakage of light or the like at the time of black display (what is called black-level degradation) (such display is also referred to as deep black display) can be achieved.

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

A material through which impurities such as water and hydrogen do not easily diffuse is preferably used for at least one of the insulating layers that cover the transistors. This allows the insulating layer to function as a barrier layer. Such a structure can effectively inhibit diffusion of impurities into the transistors from the outside and increase the reliability of the display apparatus.

An inorganic insulating film is preferably used as each of the insulating layer 261, the insulating layer 262, the insulating layer 265, the insulating layer 268, and the insulating layer 275. As the inorganic insulating film, a silicon nitride film, a silicon oxynitride film, a silicon oxide film, a silicon nitride oxide film, an aluminum oxide film, an aluminum nitride film, or the like can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above inorganic insulating films may also be used.

Here, an organic insulating film often has a lower barrier property than an inorganic insulating film. Therefore, the organic insulating film preferably has an opening in the vicinity of an end portion of the display apparatus 400. This can inhibit entry of impurities from the end portion of the display apparatus 400 through the organic insulating film. Alternatively, the organic insulating film may be formed so that an end portion of the organic insulating film is positioned on the inner side than the end portion of the display apparatus 400, to prevent the organic insulating film from being exposed at the end portion of the display apparatus 400.

An organic insulating film is suitable as the insulating layer 294 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

The light-blocking layer 417 is preferably provided on a surface of the substrate 452 on the substrate 451 side. A variety of optical members can be arranged on the outer side of the substrate 452. Examples of the optical members include a polarizing plate, a retardation plate, a light diffusion layer (a diffusion film or the like), an anti-reflective layer, and a light-condensing film. Furthermore, an antistatic film inhibiting the attachment of dust, a water repellent film inhibiting the attachment of stain, a hard coat film inhibiting generation of a scratch caused by the use, a shock absorption layer, or the like may be provided on the outer side of the substrate 452.

FIG. 14A illustrates a connection portion 278. In the connection portion 278, the common electrode 413 is electrically connected to a wiring. FIG. 14A illustrates an example of a case in which the wiring has the same stacked-layer structure as the pixel electrode.

For each of the substrate 451 and the substrate 452, glass, quartz, ceramic, sapphire, a resin, a metal, an alloy, a semiconductor, or the like can be used. For the substrate on the side where light from the light-emitting element is extracted, a material that transmits the light is used. When a flexible material is used for the substrate 451 and the substrate 452, the flexibility of the display apparatus can be increased. Furthermore, a polarizing plate may be used as the substrate 451 or the substrate 452.

For each of the substrate 451 and the substrate 452, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 451 and the substrate 452.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of a highly optically isotropic film include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of a display panel might be changed, e.g., creases are generated. Thus, for the substrate, a film with a low water absorption rate is preferably used. For example, the water absorption rate of the film is preferably lower than or equal to 1%, further preferably lower than or equal to 0.1%, still further preferably lower than or equal to 0.01%.

For the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer 292, an anisotropic conductive film (ACF), an anisotropic conductive paste (ACP), or the like can be used.

Examples of materials that can be used for a gate, a source, and a drain of a transistor and conductive layers such as a variety of wirings and electrodes included in the display apparatus include metals such as aluminum, titanium, chromium, nickel, copper, yttrium, zirconium, molybdenum, silver, tantalum, or tungsten, and an alloy containing any of these metals as its main component. A film containing any of these materials can be used in a single layer or as a stacked-layer structure.

For a conductive material having a light-transmitting property, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to enable transmission of light. A stacked film of any of the above materials can be used as a conductive layer. For example, a stacked film of indium tin oxide and an alloy of silver and magnesium, or the like is preferably used for increased conductivity. These materials can also be used, for example, for the conductive layers such as a variety of wirings and electrodes included in a display apparatus, and conductive layers (conductive layers functioning as a pixel electrode or a common electrode) included in the light-emitting element.

For an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

At least part of the structure examples, the drawings corresponding thereto, and the like described in this embodiment can be combined with the other structure examples, the other drawings, and the like as appropriate.

At least part of this embodiment can be implemented in appropriate combination with the other embodiments described in this specification.

Embodiment 3

In this embodiment, a display apparatus of one embodiment of the present invention will be described.

The display apparatus of one embodiment of the present invention includes a light-receiving element (also referred to as a light-receiving device) and a light-emitting element (also referred to as a light-emitting device). Alternatively, the display apparatus of one embodiment of the present invention may include a light-emitting and light-receiving element (also referred to as a light-emitting and light-receiving device) and a light-emitting element.

First, a display apparatus including a light-receiving element and a light-emitting element is described.

The display apparatus of one embodiment of the present invention includes a light-receiving element and a light-emitting element in a light-emitting and light-receiving portion. In the display apparatus of one embodiment of the present invention, the light-emitting elements are arranged in a matrix in the light-emitting and light-receiving portion, and an image can be displayed on the light-emitting and light-receiving portion. Furthermore, the light-receiving elements are arranged in a matrix in the light-emitting and light-receiving portion, and the light-emitting and light-receiving portion has one or both of an image capturing function and a sensing function. The light-emitting and light-receiving portion can be used as an image sensor, a touch sensor, or the like. That is, by detecting light with the light-emitting and light-receiving portion, an image can be captured and touch operation of an object (e.g., a finger or a stylus) can be detected. Furthermore, in the display apparatus of one embodiment of the present invention, the light-emitting elements can be used as a light source of the sensor. Accordingly, a light-receiving portion and a light source do not need to be provided separately from the display apparatus; hence, the number of components of an electronic device can be reduced.

In the display apparatus of one embodiment of the present invention, when an object reflects (or scatters) light emitted from the light-emitting element included in the light-emitting and light-receiving portion, the light-receiving element can detect the reflected light (or the scattered light); thus, image capturing, touch operation detection, or the like is possible even in a dark place.

The light-emitting element included in the display apparatus of one embodiment of the present invention functions as a display element (also referred to as a display device).

As the light-emitting element, an EL element (also referred to as an EL device) such as an OLED or a QLED is preferably used. Examples of a light-emitting substance contained in the EL element include a substance that emits fluorescent light (a fluorescent material), a substance that emits phosphorescent light (a phosphorescent material), and a substance exhibiting thermally activated delayed fluorescence (a thermally activated delayed fluorescent (TADF) material). As the light-emitting substance contained in the EL element, not only organic compounds but also inorganic compounds (e.g., quantum dot materials) can be used. An LED such as a micro LED can also be used as the light-emitting element.

The display apparatus of one embodiment of the present invention has a function of detecting light with the use of a light-receiving element.

When the light-receiving elements are used as an image sensor, the display apparatus can capture an image using the light-receiving elements. For example, the display apparatus can be used as a scanner.

An electronic device including the display apparatus of one embodiment of the present invention can obtain data related to biological information such as a fingerprint or a palm print by using a function of an image sensor. That is, a biometric authentication sensor can be incorporated in the display apparatus. When the display apparatus incorporates a biometric authentication sensor, the number of components of an electronic device can be reduced as compared to the case where a biometric authentication sensor is provided separately from the display apparatus; thus, the size and weight of the electronic device can be reduced.

When the light-receiving elements are used as a touch sensor, the display apparatus can detect touch operation of an object using the light-receiving elements.

As the light-receiving element, a pn photodiode or a pin photodiode can be used, for example. The light-receiving element functions as a photoelectric conversion element (also referred to as a photoelectric conversion device) that detects light entering the light-receiving element and generates charge. The amount of charge generated from the light-receiving element depends on the amount of light entering the light-receiving element.

It is particularly preferable to use an organic photodiode including a layer containing an organic compound as the light-receiving element. An organic photodiode, which is easily made thin, lightweight, and large in area and has a high degree of freedom for shape and design, can be used in a variety of devices.

In one embodiment of the present invention, organic EL elements (also referred to as organic EL devices) are used as the light-emitting elements, and organic photodiodes are used as the light-receiving elements. The organic EL elements and the organic photodiodes can be formed over the same substrate. Thus, the organic photodiodes can be incorporated in the display apparatus including the organic EL elements.

In the case where all the layers of the organic EL elements and the organic photodiodes are formed separately, the number of film formation steps becomes extremely large. However, a large number of layers of the organic photodiodes can have a structure in common with the organic EL elements; thus, concurrently forming the layers that can have a common structure can inhibit an increase in the number of film formation steps.

For example, one of a pair of electrodes (a common electrode) can be a layer shared by the light-receiving element and the light-emitting element. For example, at least one of a hole-injection layer, a hole-transport layer, an electron-transport layer, and an electron-injection layer may be a layer shared by the light-receiving element and the light-emitting element. When the light-receiving element and the light-emitting element include a common layer in such a manner, the number of film formation steps and the number of masks can be reduced, thereby reducing the number of manufacturing steps and the manufacturing cost of the display apparatus. Furthermore, the display apparatus including the light-receiving element can be manufactured using an existing manufacturing apparatus and an existing manufacturing method for the display apparatus.

Next, a display apparatus including light-emitting and light-receiving elements and light-emitting elements is described. Note that functions, behavior, effects, and the like similar to those in the above are not described in some cases.

In the display apparatus of one embodiment of the present invention, a subpixel exhibiting any color includes a light-emitting and light-receiving element instead of a light-emitting element, and subpixels exhibiting the other colors each include a light-emitting element. The light-emitting and light-receiving element has both a function of emitting light (a light-emitting function) and a function of receiving light (a light-receiving function). For example, in the case where a pixel includes three subpixels of a red subpixel, a green subpixel, and a blue subpixel, at least one of the subpixels includes a light-emitting and light-receiving element, and the other subpixels each include a light-emitting element. Thus, the light-emitting and light-receiving portion of the display apparatus of one embodiment of the present invention has a function of displaying an image using both light-emitting and light-receiving elements and light-emitting elements.

The light-emitting and light-receiving element functions as both a light-emitting element and a light-receiving element, whereby the pixel can have a light-receiving function without an increase in the number of subpixels included in the pixel. Thus, the light-emitting and light-receiving portion of the display apparatus can be provided with one or both of an image capturing function and a sensing function while keeping the aperture ratio of the pixel (aperture ratio of each subpixel) and the resolution of the display apparatus. Accordingly, in the display apparatus of one embodiment of the present invention, the aperture ratio of the pixel can be more increased and the resolution can be increased more easily than in a display apparatus provided with a subpixel including a light-receiving element separately from a subpixel including a light-emitting element.

In the light-emitting and light-receiving portion of the display apparatus of one embodiment of the present invention, the light-emitting and light-receiving elements and the light-emitting elements are arranged in a matrix, and an image can be displayed on the light-emitting and light-receiving portion. The light-emitting and light-receiving portion can be used as an image sensor, a touch sensor, or the like. In the display apparatus of one embodiment of the present invention, the light-emitting elements can be used as a light source of the sensor. Thus, image capturing, touch operation detection, or the like is possible even in a dark place.

The light-emitting and light-receiving element can be manufactured by combining an organic EL element and an organic photodiode. For example, by adding an active layer of an organic photodiode to a stacked-layer structure of an organic EL element, the light-emitting and light-receiving element can be manufactured. Furthermore, in the light-emitting and light-receiving element manufactured by combining an organic EL element and an organic photodiode, concurrently forming layers that can be shared by the organic EL element can inhibit an increase in the number of film formation steps.

For example, one of a pair of electrodes (a common electrode) can be a layer shared by the light-emitting and light-receiving element and the light-emitting element. For example, at least one of a hole-injection layer, a hole-transport layer, an electron-transport layer, and an electron-injection layer may be a layer shared by the light-emitting and light-receiving element and the light-emitting element.

Note that a layer included in the light-emitting and light-receiving element might have a different function between the case where the light-emitting and light-receiving element functions as a light-receiving element and the case where the light-emitting and light-receiving element functions as a light-emitting element. In this specification, the name of a component is based on the function of the case where the light-emitting and light-receiving element functions as a light-emitting element.

The display apparatus of this embodiment has a function of displaying an image with the use of the light-emitting elements and the light-emitting and light-receiving elements. That is, the light-emitting elements and the light-emitting and light-receiving elements function as display elements.

The display apparatus of this embodiment has a function of detecting light with the use of the light-emitting and light-receiving elements. The light-emitting and light-receiving element can detect light having a shorter wavelength than light emitted from the light-emitting and light-receiving element itself.

When the light-emitting and light-receiving elements are used as an image sensor, the display apparatus of this embodiment can capture an image using the light-emitting and light-receiving elements. When the light-emitting and light-receiving elements are used as a touch sensor, the display apparatus of this embodiment can detect touch operation of an object with the use of the light-emitting and light-receiving elements.

The light-emitting and light-receiving element functions as a photoelectric conversion element. The light-emitting and light-receiving element can be manufactured by adding an active layer of the light-receiving element to the above-described structure of the light-emitting element. For the light-emitting and light-receiving element, an active layer of a pn photodiode or a pin photodiode can be used, for example.

It is particularly preferable to use, for the light-emitting and light-receiving element, an active layer of an organic photodiode including a layer containing an organic compound. An organic photodiode, which is easily made thin, lightweight, and large in area and has a high degree of freedom for shape and design, can be used in a variety of devices.

The display apparatus that is an example of the display apparatus of one embodiment of the present invention is specifically described below with reference to drawings.

Structure Example 1 of Display Apparatus

Structure Example 1-1

Figure 15A:
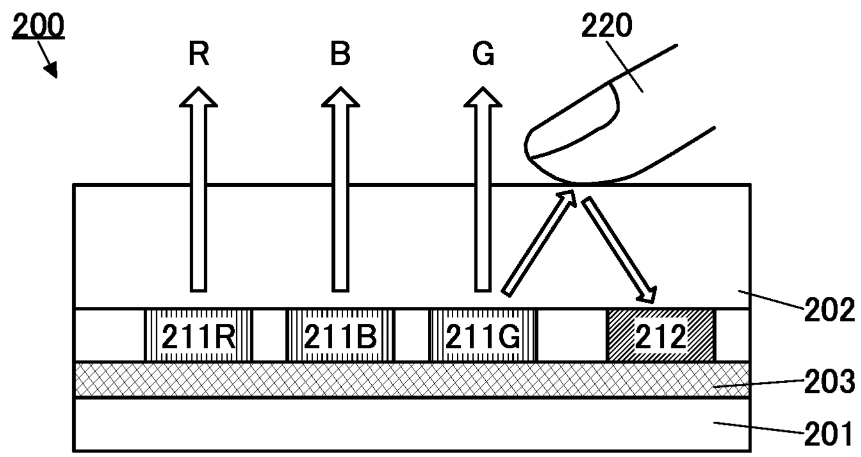
FIG. 15A, FIG. 15B, and FIG. 15D are cross-sectional views illustrating an example of a display apparatus.

FIG. 15A illustrates a schematic view of a display panel 200. The display panel 200 includes a substrate 201, a substrate 202, a light-receiving element 212, a light-emitting element 211R, a light-emitting element 211G, a light-emitting element 211B, a functional layer 203, and the like.

The light-emitting element 211R, the light-emitting element 211G, the light-emitting element 211B, and the light-receiving element 212 are provided between the substrate 201 and the substrate 202. The light-emitting element 211R, the light-emitting element 211G, and the light-emitting element 211B emit red (R) light, green (G) light, and blue (B) light, respectively. Note that in the following description, the term "light-emitting element 211" may be used when the light-emitting element 211R, the light-emitting element 211G, and the light-emitting element 211B are not distinguished from one other.

The display panel 200 includes a plurality of pixels arranged in a matrix. One pixel includes one or more subpixels. One subpixel includes one light-emitting element. For example, the pixel can have a structure including three subpixels (e.g., three colors of R, G, and B or three colors of yellow (Y), cyan (C), and magenta (M)) or four subpixels (e.g., four colors of R, G, B, and white (W) or four colors of R, G, B, and Y). The pixel further includes the light-receiving element 212. The light-receiving element 212 may be provided in all the pixels or may be provided in some of the pixels. In addition, one pixel may include a plurality of light-receiving elements 212.

FIG. 15A illustrates a state where a finger 220 touches a surface of the substrate 202. Part of light emitted from the light-emitting element 211G is reflected at a contact portion of the substrate 202 and the finger 220. In the case where part of the reflected light is incident on the light-receiving element 212, the contact of the finger 220 with the substrate 202 can be detected. That is, the display panel 200 can function as a touch panel.

The functional layer 203 includes a circuit for driving the light-emitting element 211R, the light-emitting element 211G, and the light-emitting element 211B and a circuit for driving the light-receiving element 212. The functional layer 203 is provided with a switch, a transistor, a capacitor, a wiring, and the like. Note that in the case where the light-emitting element 211R, the light-emitting element 211G, the light-emitting element 211B, and the light-receiving element 212 are driven by a passive-matrix method, a structure not provided with a switch, a transistor, or the like may be employed.

Figure 15B:
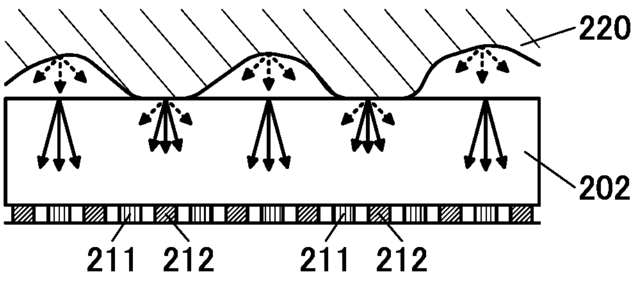

The display panel 200 preferably has a function of detecting a fingerprint of the finger 220. FIG. 15B schematically illustrates an enlarged view of the contact portion in a state where the finger 220 touches the substrate 202. FIG. 15B illustrates the light-emitting elements 211 and the light-receiving elements 212 that are alternately arranged.

The fingerprint of the finger 220 is formed of depressed portions and projecting portions. Therefore, as illustrated in FIG. 15B, the projecting portions of the fingerprint touch the substrate 202.

Reflection of light from a surface, an interface, or the like is categorized into regular reflection and diffuse reflection. Regularly reflected light is highly directional light with an angle of reflection equal to the angle of incidence. Diffusely reflected light has low directionality and low angular dependence of intensity. As for regular reflection and diffuse reflection, diffuse reflection components are dominant in the light reflected from the surface of the finger 220. Meanwhile, regular reflection components are dominant in the light reflected from the interface between the substrate 202 and the air.

The intensity of light that is reflected from contact surfaces or non-contact surfaces between the finger 220 and the substrate 202 and is incident on the light-receiving elements 212 positioned directly below the contact surfaces or the non-contact surfaces is the sum of intensities of regularly reflected light and diffusely reflected light. As described above, regularly reflected light (indicated by solid arrows) is dominant near the depressed portions of the finger 220, where the finger 220 is not in contact with the substrate 202; whereas diffusely reflected light (indicated by dashed arrows) from the finger 220 is dominant near the projecting portions of the finger 220, where the finger 220 is in contact with the substrate 202. Thus, the intensity of light received by the light-receiving element 212 positioned directly below the depressed portion is higher than the intensity of light received by the light-receiving element 212 positioned directly below the projecting portion. Accordingly, a fingerprint image of the finger 220 can be captured.

In the case where an arrangement interval between the light-receiving elements 212 is smaller than a distance between two projecting portions of a fingerprint, preferably a distance between a depressed portion and a projecting portion adjacent to each other, a clear fingerprint image can be obtained. The interval between a depressed portion and a projecting portion of a human's fingerprint is approximately 200 μm; thus, the arrangement interval between the light-receiving elements 212 is, for example, less than or equal to 400 μm, preferably less than or equal to 200 μm, further preferably less than or equal to 150 μm, still further preferably less than or equal to 100 μm, even still further preferably less than or equal to 50 μm and greater than or equal to 1 μm, preferably greater than or equal to 10 μm, further preferably greater than or equal to 20 μm.

Figure 15C:
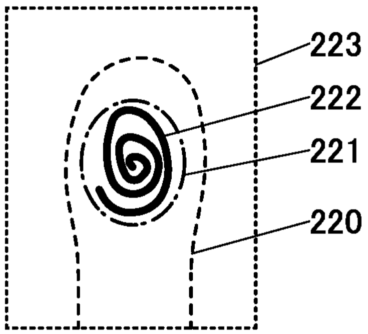
FIG. 15C and FIG. 15E are diagrams illustrating examples of images.

FIG. 15C illustrates an example of a fingerprint image captured by the display panel 200. In an image capturing range 223 in FIG. 15C, the outline of the finger 220 is indicated by a dashed line and the outline of a contact portion 221 is indicated by a dashed-dotted line. In the contact portion 221, a high-contrast image of a fingerprint 222 can be captured owing to a difference in the amount of light incident on the light-receiving elements 212.

Figure 15D:
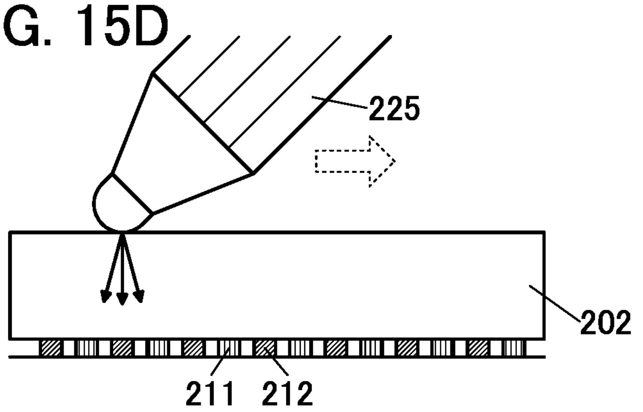

The display panel 200 can also function as a touch panel or a pen tablet. FIG. 15D illustrates a state where a tip of a stylus 225 slides in a direction indicated with a dashed arrow while the tip of the stylus 225 touches the substrate 202.

As illustrated in FIG. 15D, when diffusely reflected light that is diffused at the contact surface of the tip of the stylus 225 and the substrate 202 is incident on the light-receiving element 212 positioned in a portion overlapping with the contact surface, the position of the tip of the stylus 225 can be detected with high accuracy.

Figure 15E:
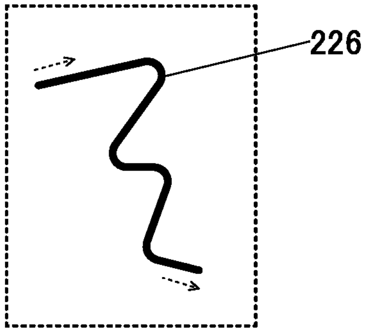

FIG. 15E illustrates an example of a path 226 of the stylus 225 that is detected by the display panel 200. The display panel 200 can detect the position of a detection target, such as the stylus 225, with high position accuracy, so that high-resolution drawing can be performed using a drawing application or the like. Unlike the case of using a capacitive touch sensor, an electromagnetic induction touch pen, or the like, the display panel 200 can detect even the position of a highly insulating detection target, the material of a tip portion of the stylus 225 is not limited, and a variety of writing materials (e.g., a brush, a glass pen, a quill pen, and the like) can be used.

Figure 15F:
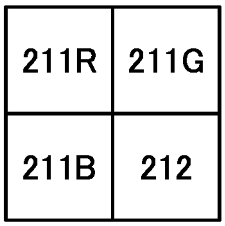
FIG. 15F to FIG. 15H are top views illustrating examples of a pixel.
Figure 15G:
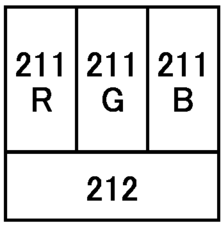
Figure 15H:
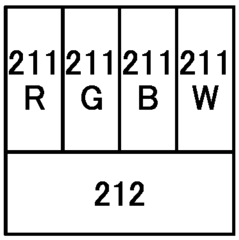

Here, FIG. 15F to FIG. 15H illustrate examples of a pixel that can be used in the display panel 200.

The pixels illustrated in FIG. 15F and FIG. 15G each include the light-emitting element 211R for red (R), the light-emitting element 211G for green (G), the light-emitting element 211B for blue (B), and the light-receiving element 212. The pixels each include a pixel circuit for driving the light-emitting element 211R, the light-emitting element 211G, the light-emitting element 211B, and the light-receiving element 212.

FIG. 15F illustrates an example in which three light-emitting elements and one light-receiving element are provided in a matrix of 2×2. FIG. 15G illustrates an example in which three light-emitting elements are arranged in one line and one laterally long light-receiving element 212 is provided below the three light-emitting elements.

The pixel illustrated in FIG. 15H is an example including a light-emitting element 211W for white (W). Here, four light-emitting elements are arranged in one line and the light-receiving element 212 is provided below the four light-emitting elements.

Note that the pixel structure is not limited to the above structure, and a variety of arrangement methods can be employed.

Structure Example 1-2

An example of a structure including light-emitting elements emitting visible light, a light-emitting element emitting infrared light, and a light-receiving element is described below.

Figure 16A:
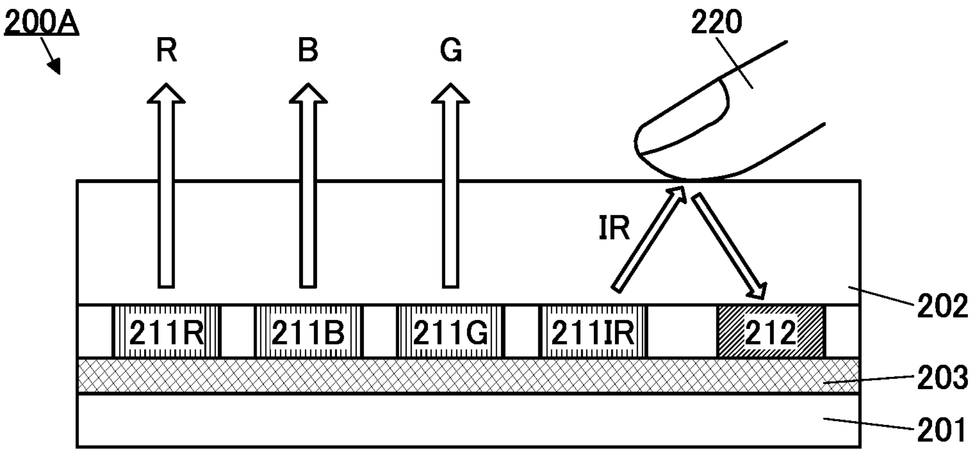
FIG. 16A is a cross-sectional view illustrating a structure example of a display apparatus.

A display panel 200A illustrated in FIG. 16A includes a light-emitting element 211IR in addition to the components illustrated in FIG. 15A as an example. The light-emitting element 211IR is a light-emitting element emitting infrared light IR. Moreover, in that case, an element capable of receiving at least the infrared light IR emitted from the light-emitting element 211IR is preferably used as the light-receiving element 212. As the light-receiving element 212, an element capable of receiving both visible light and infrared light is further preferably used.

As illustrated in FIG. 16A, when the finger 220 touches the substrate 202, the infrared light IR emitted from the light-emitting element 211IR is reflected by the finger 220 and part of the reflected light is incident on the light-receiving element 212, so that the positional information of the finger 220 can be obtained.

Figure 16B:
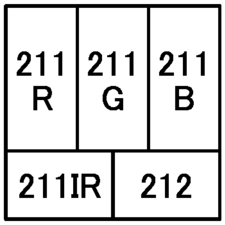
FIG. 16B to FIG. 16D are top views illustrating examples of a pixel.
Figure 16C:
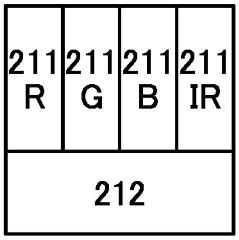
Figure 16D:
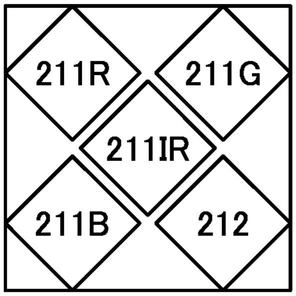

FIG. 16B to FIG. 16D illustrate examples of a pixel that can be used in the display panel 200A.

FIG. 16B illustrates an example in which three light-emitting elements are arranged in one line and the light-emitting element 211IR and the light-receiving element 212 are arranged below the three light-emitting elements in a horizontal direction. FIG. 16C illustrates an example in which four light-emitting elements including the light-emitting element 211IR are arranged in one line and the light-receiving element 212 is provided below the four light-emitting elements.

FIG. 16D illustrates an example in which the light-emitting element 211IR at the center is surrounded on all four sides by three light-emitting elements and the light-receiving element 212.

Note that in the pixels illustrated in FIG. 16B to FIG. 16D, the positions of the light-emitting elements can be interchangeable, or the positions of the light-emitting element and the light-receiving element can be interchangeable.

Structure Example 1-3

An example of a structure including a light-emitting element emitting visible light and a light-emitting and light-receiving element emitting and receiving visible light is described below.

Figure 17A:
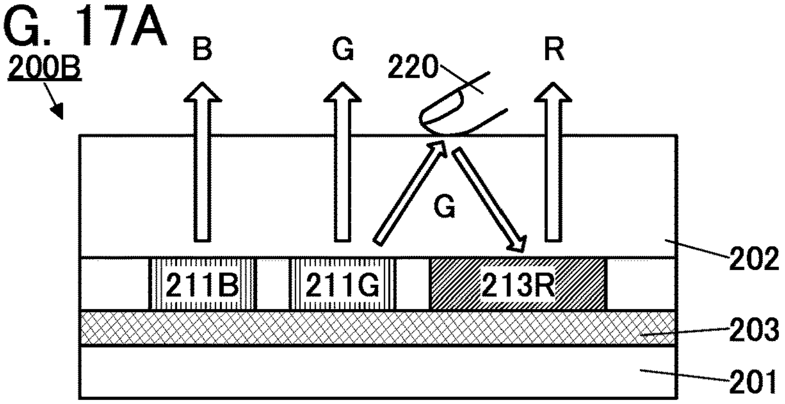
FIG. 17A is a cross-sectional view illustrating a structure example of a display apparatus.

A display panel 200B illustrated in FIG. 17A includes the light-emitting element 211B, the light-emitting element 211G, and a light-emitting and light-receiving element 213R. The light-emitting and light-receiving element 213R has a function of a light-emitting element that emits red (R) light, and a function of a photoelectric conversion element that receives visible light. FIG. 17A illustrates an example in which the light-emitting and light-receiving element 213R receives green (G) light emitted from the light-emitting element 211G. Note that the light-emitting and light-receiving element 213R may receive blue (B) light emitted from the light-emitting element 211B. The light-emitting and light-receiving element 213R may receive both green light and blue light.

For example, the light-emitting and light-receiving element 213R preferably receives light having a shorter wavelength than light emitted from itself. Alternatively, the light-emitting and light-receiving element 213R may receive light (e.g., infrared light) having a longer wavelength than light emitted from itself. The light-emitting and light-receiving element 213R may receive light having approximately the same wavelength as light emitted from itself; however, in that case, the light-emitting and light-receiving element 213R also receives light emitted from itself, whereby its emission efficiency might be decreased. Therefore, the peak of the emission spectrum and the peak of the absorption spectrum of the light-emitting and light-receiving element 213R preferably overlap as little as possible.

Here, light emitted from the light-emitting and light-receiving element is not limited to red light. Furthermore, the light emitted from the light-emitting elements is not limited to the combination of green light and blue light. For example, the light-emitting and light-receiving element can be an element that emits green light or blue light and receives light having a different wavelength from light emitted from itself.

The light-emitting and light-receiving element 213R serves as both a light-emitting element and a light-receiving element as described above, whereby the number of elements provided in one pixel can be reduced. Thus, higher resolution, a higher aperture ratio, higher definition, and the like can be easily achieved.

FIG. 17B to FIG. 17I illustrate examples of a pixel that can be used in the display panel 200B.

Figure 17B:
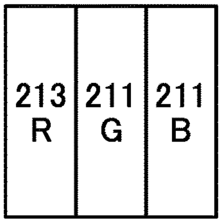
FIG. 17B to FIG. 17I are top views each illustrating an example of a pixel.
Figure 17C:
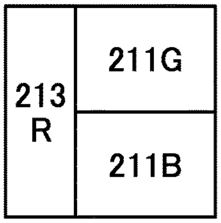

FIG. 17B illustrates an example in which the light-emitting and light-receiving element 213R, the light-emitting element 211G, and the light-emitting element 211B are arranged in one column. FIG. 17C illustrates an example in which the light-emitting element 211G and the light-emitting element 211B are alternately arranged in the vertical direction and the light-emitting and light-receiving element 213R is provided alongside the light-emitting elements.

Figure 17D:
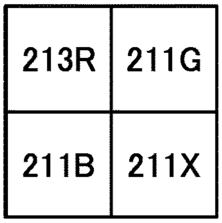

FIG. 17D illustrates an example in which three light-emitting elements (the light-emitting element 211G, the light-emitting element 211B, and a light-emitting element 211X) and one light-emitting and light-receiving element are arranged in a matrix of 2×2. The light-emitting element 211X is an element that emits light of a color other than R, G, and B. The light of a color other than R, G, and B can be white (W) light, yellow (Y) light, cyan (C) light, magenta (M) light, infrared light (IR), ultraviolet light (UV), or the like. In the case where the light-emitting element 211X emits infrared light, the light-emitting and light-receiving element preferably has a function of detecting infrared light or a function of detecting both visible light and infrared light. The wavelength of light detected by the light-emitting and light-receiving element can be determined depending on the application of a sensor.

Figure 17E:
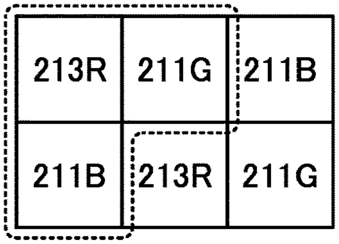

FIG. 17E illustrates two pixels. A region that includes three elements and is enclosed by a dotted line corresponds to one pixel. Each of the pixels includes the light-emitting element 211G, the light-emitting element 211B, and the light-emitting and light-receiving element 213R. In the left pixel illustrated in FIG. 17E, the light-emitting element 211G is provided in the same row as the light-emitting and light-receiving element 213R, and the light-emitting element 211B is provided in the same column as the light-emitting and light-receiving element 213R. In the right pixel illustrated in FIG. 17E, the light-emitting element 211G is provided in the same row as the light-emitting and light-receiving element 213R, and the light-emitting element 211B is provided in the same column as the light-emitting element 211G. In the pixel layout illustrated in FIG. 17E, the light-emitting and light-receiving element 213R, the light-emitting element 211G, and the light-emitting element 211B are repeatedly arranged in both the odd-numbered row and the even-numbered row, and in each column, the light-emitting element or the light-emitting and light-receiving element arranged in the odd-numbered row emits light of a different color from that of the light-emitting element or the light-emitting and light-receiving element arranged in the even-numbered row.

Figure 17F:
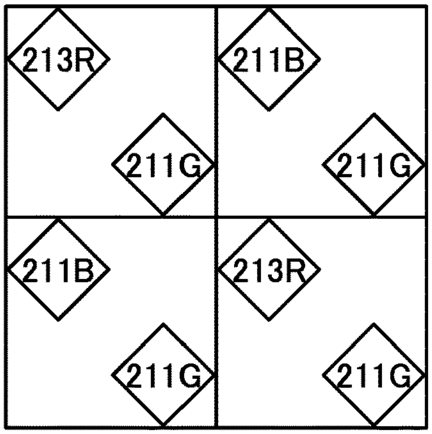

FIG. 17F illustrates four pixels which employ a PenTile arrangement; adjacent two pixels have different combinations of light-emitting elements or light-emitting and light-receiving elements that emit light of two different colors. FIG. 17F illustrates top surface shapes of the light-emitting elements or the light-emitting and light-receiving elements.

The upper left pixel and the lower right pixel illustrated in FIG. 17F each include the light-emitting and light-receiving element 213R and the light-emitting element 211G. The upper right pixel and the lower left pixel each include the light-emitting element 211G and the light-emitting element 211B. That is, in the example illustrated in FIG. 17F, the light-emitting element 211G is provided in each pixel.

The top surface shapes of the light-emitting elements and the light-emitting and light-receiving elements are not particularly limited and can be a circular shape, an elliptical shape, a polygonal shape, a polygonal shape with rounded corners, or the like. FIG. 17F and the like illustrate examples in which the top surface shapes of the light-emitting elements and the light-emitting and light-receiving elements are each a square tilted at approximately 45 degrees (a diamond shape). Note that the top surface shapes of the light-emitting elements and the light-emitting and light-receiving elements may vary depending on the color thereof, or the light-emitting elements and the light-emitting and light-receiving elements of some colors or every color may have the same top surface shape.

The sizes of light-emitting regions (or light-emitting and light-receiving regions) of the light-emitting elements and the light-emitting and light-receiving elements may vary depending on the color thereof, or the light-emitting elements and the light-emitting and light-receiving elements of some colors or every color may have light-emitting regions of the same size. For example, in FIG. 17F, the light-emitting region of the light-emitting element 211G provided in each pixel may have a smaller area than the light-emitting region (or the light-emitting and light-receiving region) of the other elements.

Figure 17H:
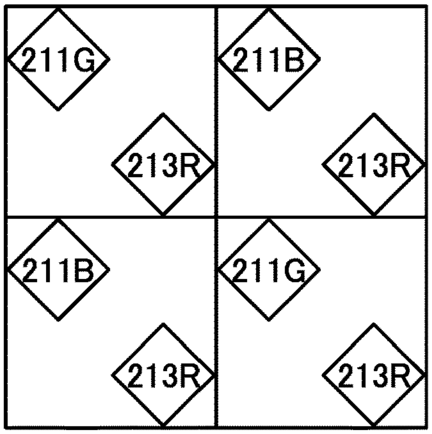
Figure 17G:
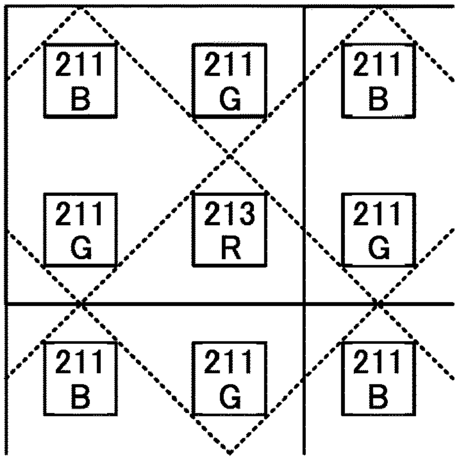

FIG. 17G is a modification example of the pixel arrangement illustrated in FIG. 17F. Specifically, the structure of FIG. 17G is obtained by rotating the structure of FIG. 17F by 45 degrees. Although one pixel is regarded as including two elements in FIG. 17F, one pixel can be regarded as being formed of four elements as illustrated in FIG. 17G.

FIG. 17H is a modification example of the pixel arrangement illustrated in FIG. 17F. The upper left pixel and the lower right pixel illustrated in FIG. 17H each include the light-emitting and light-receiving element 213R and the light-emitting element 211G. The upper right pixel and the lower left pixel each include the light-emitting and light-receiving element 213R and the light-emitting element 211B. That is, in the example illustrated in FIG. 17H, the light-emitting and light-receiving element 213R is provided in each pixel. The structure illustrated in FIG. 17H achieves higher-resolution image capturing than the structure illustrated in FIG. 17F because of having the light-emitting and light-receiving element 213R in each pixel. Thus, the accuracy of biometric authentication can be increased, for example.

Figure 17I:
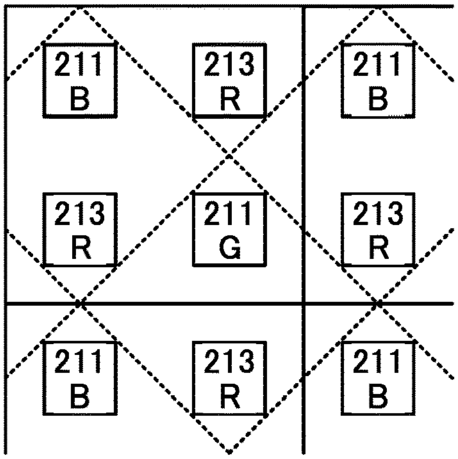

FIG. 17I is a modification example of the pixel arrangement illustrated in FIG. 17H, obtained by rotating the pixel arrangement in FIG. 17H by 45 degrees.

In FIG. 17I, one pixel is described as being formed of four elements (two light-emitting elements and two light-emitting and light-receiving elements). One pixel including a plurality of light-emitting and light-receiving elements having a light-receiving function allows high-resolution image capturing. Accordingly, the accuracy of biometric authentication can be increased. For example, the resolution of image capturing can be the square root of 2 times the resolution of display.

A display apparatus that employs the structure illustrated in FIG. 17H or FIG. 17I includes p (p is an integer greater than or equal to 2) first light-emitting elements, q (q is an integer greater than or equal to 2) second light-emitting elements, and r (r is an integer greater than p and q) light-emitting and light-receiving elements. As for p and r, r=2p is satisfied. As for p, q, and r, r=p+q is satisfied. Either the first light-emitting elements or the second light-emitting elements emit green light, and the other light-emitting elements emit blue light. The light-emitting and light-receiving elements emit red light and have a light-receiving function.

In the case where touch operation is detected with the light-emitting and light-receiving elements, for example, it is preferable that light emitted from a light source be hard for a user to recognize. Since blue light has lower visibility than green light, light-emitting elements that emit blue light are preferably used as a light source. Accordingly, the light-emitting and light-receiving elements preferably have a function of receiving blue light. Note that without limitation to the above, light-emitting elements used as a light source can be selected as appropriate depending on the sensitivity of the light-emitting and light-receiving elements.

As described above, the display apparatus of this embodiment can employ any of various types of pixel arrangements.

At least part of this embodiment can be implemented in appropriate combination with the other embodiments described in this specification.

Embodiment 4

In this embodiment, a light-emitting element (also referred to as a light-emitting device) and a light-receiving element (also referred to as a light-receiving device) that can be used in a light-emitting and light-receiving apparatus of one embodiment of the present invention will be described.

In this specification and the like, a device manufactured using a metal mask or an FMM (a fine metal mask, a high-resolution metal mask) may be referred to as a device having an MM (a metal mask) structure. In this specification and the like, a device manufactured without using a metal mask or an FMM may be referred to as a device having an MML (a metal maskless) structure.

In this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display apparatus.

Light-emitting devices can be classified roughly into a single structure and a tandem structure. A device with a single structure includes one light-emitting unit between a pair of electrodes, and the light-emitting unit preferably includes one or more light-emitting layers. To obtain white light emission in the single structure, two or more light-emitting layers are selected such that emission colors of the light-emitting layers can produce a white color. For example, when two colors are used, by making the emission color of a first light-emitting layer and the emission color of a second light-emitting layer complementary colors, the light-emitting device can be configured to emit white light as a whole. To obtain white light emission by using three or more light-emitting layers, the light-emitting device is configured to emit white light as a whole by combining emission colors of the three or more light-emitting layers.

A device with a tandem structure includes two or more light-emitting units between a pair of electrodes, and each light-emitting unit preferably includes one or more light-emitting layers. When light-emitting layers that emit light of the same color are used in each light-emitting unit, luminance per predetermined current can be increased, and the light-emitting device can have higher reliability than that with a single structure. To obtain white light emission in the tandem structure, the structure is made so that light from light-emitting layers of the plurality of light-emitting units can be combined to be white light. Note that a combination of emission colors for obtaining white light emission is similar to that in the case of a single structure. In the device with a tandem structure, an intermediate layer such as a charge-generation layer is suitably provided between the plurality of light-emitting units.

When the above white-light-emitting device (with a single structure or a tandem structure) and the above light-emitting device having an SBS structure are compared to each other, the light-emitting device having an SBS structure can have lower power consumption than the white-light-emitting device. To reduce power consumption, a light-emitting device having an SBS structure is suitably used. Meanwhile, the white-light-emitting device is suitable in terms of lower manufacturing cost or higher manufacturing yield because the manufacturing process of the white-light-emitting device is simpler than that of the light-emitting device having an SBS structure.

[Device Structure]

Next, detailed structures of the light-emitting element, the light-receiving element, and the light-emitting and light-receiving element which can be used in the display apparatus of one embodiment of the present invention will be described.

The display apparatus of one embodiment of the present invention can have any of the following structures: a top-emission structure in which light is emitted in a direction opposite to the substrate where the light-emitting elements are formed, a bottom-emission structure in which light is emitted toward the substrate where the light-emitting elements are formed, and a dual-emission structure in which light is emitted toward both surfaces.

In this embodiment, a top-emission display apparatus is described as an example.

In this specification and the like, unless otherwise specified, in describing a structure including a plurality of components (e.g., light-emitting elements or light-emitting layers), alphabets are omitted when a common part of the components is described. For example, the term "light-emitting layer 383" is sometimes used to describe a common part of a light-emitting layer 383R, a light-emitting layer 383G, and the like.

Figure 18A:
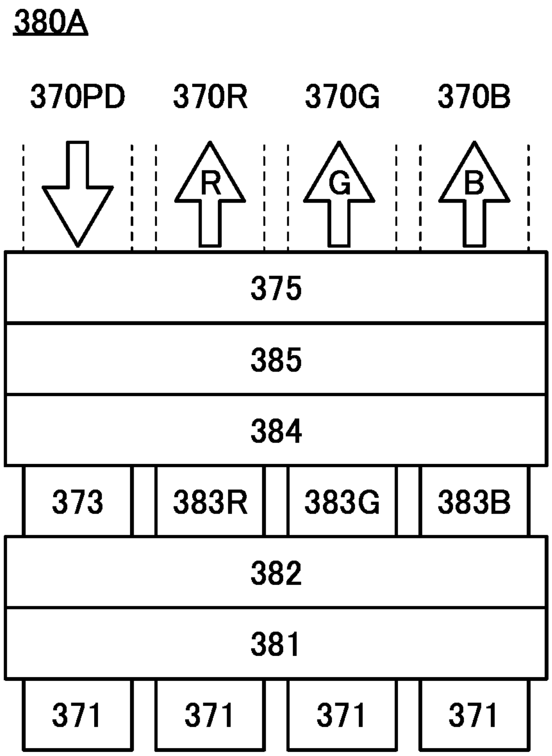
FIG. 18A and FIG. 18B are diagrams illustrating structure examples of a display apparatus.

A display apparatus 380A illustrated in FIG. 18A includes a light-receiving element 370PD, a light-emitting element 370R that emits red (R) light, a light-emitting element 370G that emits green (G) light, and a light-emitting element 370B that emits blue (B) light.

Each of the light-emitting elements includes a pixel electrode 371, a hole-injection layer 381, a hole-transport layer 382, a light-emitting layer, an electron-transport layer 384, an electron-injection layer 385, and a common electrode 375 that are stacked in this order. The light-emitting element 370R includes the light-emitting layer 383R, the light-emitting element 370G includes the light-emitting layer 383G, and the light-emitting element 370B includes a light-emitting layer 383B. The light-emitting layer 383R contains a light-emitting substance that emits red light, the light-emitting layer 383G contains a light-emitting substance that emits green light, and the light-emitting layer 383B contains a light-emitting substance that emits blue light.

The light-emitting elements are electroluminescent elements that emit light to the common electrode 375 side by voltage application between the pixel electrode 371 and the common electrode 375.

The light-receiving element 370PD includes the pixel electrode 371, the hole-injection layer 381, the hole-transport layer 382, an active layer 373, the electron-transport layer 384, the electron-injection layer 385, and the common electrode 375 that are stacked in this order.

The light-receiving element 370PD is a photoelectric conversion element that receives light entering from the outside of the display apparatus 380A and converts the light into an electric signal.

This embodiment is described assuming that the pixel electrode 371 functions as an anode and the common electrode 375 functions as a cathode in both of the light-emitting element and the light-receiving element. In other words, the light-receiving element is driven by application of reverse bias between the pixel electrode 371 and the common electrode 375, whereby light incident on the light-receiving element can be detected and charge can be generated and extracted as current.

In the display apparatus of this embodiment, an organic compound is used for the active layer 373 of the light-receiving element 370PD. In the light-receiving element 370PD, the layers other than the active layer 373 can have structures in common with the layers in the light-emitting elements. Therefore, the light-receiving element 370PD can be formed concurrently with the formation of the light-emitting elements only by adding a step of forming the active layer 373 in the formation step of the light-emitting elements. The light-emitting elements and the light-receiving element 370PD can be formed over the same substrate. Accordingly, the light-receiving element 370PD can be incorporated into the display apparatus without a significant increase in the number of manufacturing steps.

The display apparatus 380A is an example in which the light-receiving element 370PD and the light-emitting elements have a common structure except that the active layer 373 of the light-receiving element 370PD and the light-emitting layers 383 of the light-emitting elements are separately formed. Note that the structures of the light-receiving element 370PD and the light-emitting elements are not limited thereto. The light-receiving element 370PD and the light-emitting elements may include separately formed layers in addition to the active layer 373 and the light-emitting layers 383. The light-receiving element 370PD and the light-emitting elements preferably include at least one layer used in common (common layer). Thus, the light-receiving element 370PD can be incorporated into the display apparatus without a significant increase in the number of manufacturing steps.

A conductive film that transmits visible light is used for the electrode through which light is extracted, which is either the pixel electrode 371 or the common electrode 375. A conductive film that reflects visible light is preferably used for the electrode through which light is not extracted.

The light-emitting elements included in the display apparatus of this embodiment preferably employ a micro-optical resonator (microcavity) structure. Therefore, one of the pair of electrodes included in the light-emitting element preferably includes an electrode having properties of transmitting and reflecting visible light (a transflective electrode), and the other is preferably an electrode having a property of reflecting visible light (a reflective electrode). When the light-emitting element has a microcavity structure, light obtained from the light-emitting layer can be resonated between the electrodes, whereby light emitted from the light-emitting element can be intensified.

Note that the transflective electrode can have a stacked-layer structure of a reflective electrode and an electrode having a property of transmitting visible light (also referred to as a transparent electrode).

The light transmittance of the transparent electrode is higher than or equal to 40%. For example, an electrode having a visible light (light with a wavelength greater than or equal to 400 nm and less than 750 nm) transmittance higher than or equal to 40% is preferably used in the light-emitting elements. The transflective electrode has a visible light reflectance higher than or equal to 10% and lower than or equal to 95%, preferably higher than or equal to 30% and lower than or equal to 80%. The reflective electrode has a visible light reflectance higher than or equal to 40% and lower than or equal to 100%, preferably higher than or equal to 70% and lower than or equal to 100%. These electrodes preferably have a resistivity less than or equal to $1\times10^{-2}$ Ωcm. Note that in the case where any of the light-emitting elements emits near-infrared light (light with a wavelength greater than or equal to 750 nm and less than or equal to 1300 nm), the near-infrared light transmittance and reflectance of these electrodes preferably satisfy the above-described numerical ranges of the visible light transmittance and reflectance.

The light-emitting element includes at least the light-emitting layer 383. In addition to the light-emitting layer 383, the light-emitting element may further include a layer containing a substance with a high hole-injection property, a substance with a high hole-transport property, a hole-blocking material, a substance with a high electron-transport property, a substance with a high electron-injection property, an electron-blocking material, a substance with a bipolar property (a substance with a high electron- and hole-transport property), and the like.

For example, the light-emitting elements and the light-receiving element can share at least one of the hole-injection layer, the hole-transport layer, the electron-transport layer, and the electron-injection layer. Furthermore, at least one of the hole-injection layer, the hole-transport layer, the electron-transport layer, and the electron-injection layer can be separately formed for the light-emitting elements and the light-receiving element.

The hole-injection layer is a layer that injects holes from an anode to the hole-transport layer and contains a material with a high hole-injection property. As the material with a high hole-injection property, an aromatic amine compound or a composite material containing a hole-transport material and an acceptor material (an electron-accepting material) can be used.

In the light-emitting elements, the hole-transport layer is a layer that transports holes, which are injected from the anode by the hole-injection layer, to the light-emitting layer. In the light-receiving element, the hole-transport layer is a layer that transports holes, which are generated in the active layer on the basis of incident light, to the anode. The hole-transport layer is a layer that contains a hole-transport material. As the hole-transport material, a substance having a hole mobility greater than or equal to $1\times10^{-6}$ $cm^2/Vs$ is preferable. Note that other substances can also be used as long as they have a property of transporting more holes than electrons. As the hole-transport material, materials with a high hole-transport property, such as a π-electron rich heteroaromatic compound (e.g., a carbazole derivative, a thiophene derivative, and a furan derivative) and an aromatic amine (a compound having an aromatic amine skeleton), are preferable.

In the light-emitting element, the electron-transport layer is a layer that transports electrons, which are injected from the cathode by the electron-injection layer, to the light-emitting layer. In the light-receiving element, the electron-transport layer is a layer that transports electrons, which are generated in the active layer on the basis of incident light, to the cathode. The electron-transport layer is a layer that contains an electron-transport material. As the electron-transport material, a substance having an electron mobility greater than or equal to $1\times10^{-6}$ $cm^2/Vs$ is preferable. Note that other substances can also be used as long as they have a property of transporting more electrons than holes. As the electron-transport material, it is possible to use a material with a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer that injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The light-emitting layer 383 is a layer that contains a light-emitting substance. The light-emitting layer 383 can contain one or more kinds of light-emitting substances. As the light-emitting substance, a substance that exhibits an emission color of blue, violet, bluish violet, green, yellowish green, yellow, orange, red, or the like is used as appropriate. Alternatively, as the light-emitting substance, a substance that emits near-infrared light can be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer 383 may contain one or more kinds of organic compounds (e.g., a host material and an assist material) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer 383 preferably contains a phosphorescent material and a combination of a hole-transport material and an electron-transport material that easily forms an exciplex, for example. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting element can be achieved at the same time.

In a combination of materials for forming an exciplex, the HOMO level (the highest occupied molecular orbital level) of the hole-transport material is preferably higher than or equal to the HOMO level of the electron-transport material. The LUMO level (the lowest unoccupied molecular orbital level) of the hole-transport material is preferably higher than or equal to the LUMO level of the electron-transport material. The LUMO levels and the HOMO levels of the materials can be derived from the electrochemical characteristics (the reduction potentials and the oxidation potentials) of the materials that are measured by cyclic voltammetry (CV).

The formation of an exciplex can be confirmed by a phenomenon in which the emission spectrum of a mixed film in which the hole-transport material and the electron-transport material are mixed is shifted to the longer wavelength side than the emission spectrum of each of the materials (or has another peak on the longer wavelength side), observed by comparison of the emission spectrum of the hole-transport material, the emission spectrum of the electron-transport material, and the emission spectrum of the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of the transient PL of the hole-transport material, the transient PL of the electron-transport material, and the transient PL of the mixed film of these materials. The transient PL can be rephrased as transient electroluminescence (EL). That is, the formation of an exciplex can also be confirmed by a difference in transient response observed by comparison of the transient EL of the hole-transport material, the transient EL of the electron-transport material, and the transient EL of the mixed film of these materials.

The active layer 373 contains a semiconductor. Examples of the semiconductor include an inorganic semiconductor such as silicon and an organic semiconductor including an organic compound. This embodiment illustrates an example in which an organic semiconductor is used as the semiconductor included in the active layer 373. An organic semiconductor is preferably used, in which case the light-emitting layer 383 and the active layer 373 can be formed by the same method (e.g., a vacuum evaporation method) and thus the same manufacturing apparatus can be used.

Examples of an n-type semiconductor material contained in the active layer 373 are electron-accepting organic semiconductor materials such as fullerene (e.g., $C_{60}$ and $C_{70}$) and a fullerene derivative. Fullerene has a soccer ball-like shape, which is energetically stable. Both the HOMO level and the LUMO level of fullerene are deep (low). Having a deep LUMO level, fullerene has an extremely high electron-accepting property (acceptor property). In general, when π-electron conjugation (resonance) spreads in a plane as in benzene, an electron-donating property (donor property) becomes high; however, since fullerene has a spherical shape, fullerene has a high electron-accepting property even when I-electron conjugation widely spreads. The high electron-accepting property efficiently causes rapid charge separation and is useful for a light-receiving element. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of fullerene derivatives include [6,6]-Phenyl-$C_{71}$-butyric acid methyl ester (abbreviation: PC70BM), [6,6]-Phenyl-$C_{61}$-butyric acid methyl ester (abbreviation: PC60BM), and 1',1",4',4"-Tetrahydro-di[1,4]methanonaphthaleno[1,2: 2',3',56,60: 2",3"][5,6]fullerene-$C_{60}$ (abbreviation: ICBA).

Another example of an n-type semiconductor material includes a perylenetetracarboxylic derivative such as N,N'-dimethyl-3,4,9,10-perylenetetracarboxylic diimide (abbreviation: Me-PTCDI).

Another example of an n-type semiconductor material includes 2,2'-(5,5'-(thieno[3,2-b]thiophene-2,5-diyl)bis(thiophene-5,2-diyl))bis(methan-1-yl-1-ylidene)dimalononitrile (abbreviation: FT2TDMN).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer 373 include electron-donating organic semiconductor materials such as copper (II) phthalocyanine (CuPc), tetraphenyldibenzoperiflanthene (DBP), zinc phthalocyanine (ZnPc), tin phthalocyanine (SnPc), quinacridone, and rubrene.

Other examples of a p-type semiconductor material include a carbazole derivative, a thiophene derivative, a furan derivative, and a compound having an aromatic amine skeleton. Other examples of a p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a rubrene derivative, a tetracene derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer 373 is preferably formed by co-evaporation of an n-type semiconductor and a p-type semiconductor. Alternatively, the active layer 373 may be formed by stacking an n-type semiconductor and a p-type semiconductor.

Either a low molecular compound or a high molecular compound can be used for the light-emitting element and the light-receiving element, and an inorganic compound may also be contained. Each of the layers included in the light-emitting element and the light-receiving element can be formed by an evaporation method (including a vacuum evaporation method), a transfer method, a printing method, an inkjet method, a coating method, or the like.

As the hole-transport material or the electron-blocking material, a high molecular compound such as poly(3,4-ethylenedioxythiophene)/poly(styrenesulfonic acid) (PEDOT/PSS), or an inorganic compound such as molybdenum oxide or copper iodide (CuI) can be used, for example. As the electron-transport material or the hole-blocking material, an inorganic compound such as zinc oxide (ZnO), or an organic compound such as polyethylenimine ethoxylate (PEIE) can be used. The light-receiving device may include a mixed film of PEIE and ZnO, for example.

For the active layer 373, a high molecular compound such as Poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

Figure 18B:
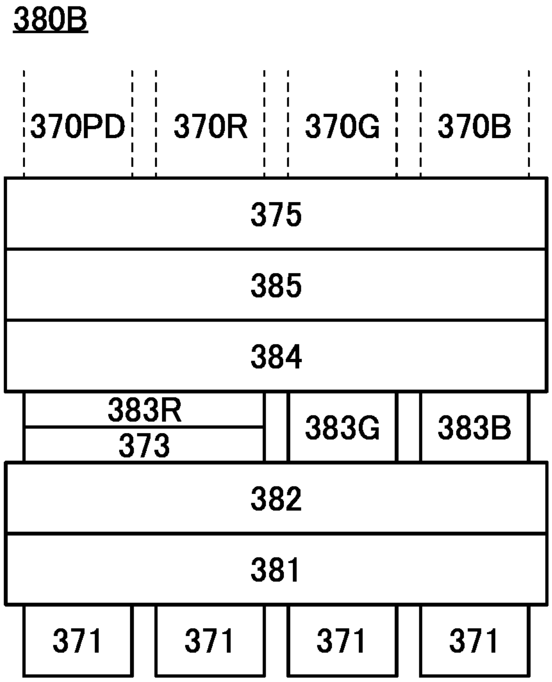

A display apparatus 380B illustrated in FIG. 18B is different from the display apparatus 380A in that the light-receiving element 370PD and the light-emitting element 370R have the same structure.

The light-receiving element 370PD and the light-emitting element 370R share the active layer 373 and the light-emitting layer 383R.

Here, it is preferable that the light-receiving element 370PD have the same structure as the light-emitting element that emits light with a wavelength longer than that of the light desired to be detected. For example, the light-receiving element 370PD with a structure for detecting blue light can have the same structure as one or both of the light-emitting element 370R and the light-emitting element 370G. For example, the light-receiving element 370PD with a structure for detecting green light can have the same structure as the light-emitting element 370R.

When the light-receiving element 370PD and the light-emitting element 370R have a common structure, the number of film formation steps and the number of masks can be reduced from those used in the structure where the light-receiving element 370PD and the light-emitting element 370R include separately formed layers. As a result, the number of manufacturing steps and the manufacturing cost of the display apparatus can be reduced.

When the light-receiving element 370PD and the light-emitting element 370R have a common structure, a margin for misalignment can be narrower than that for the structure in which the light-receiving element 370PD and the light-emitting element 370R include separately formed layers. Accordingly, the aperture ratio of a pixel can be increased, so that the light extraction efficiency of the display apparatus can be increased. This can extend the life of the light-emitting element. Furthermore, the display apparatus can exhibit a high luminance. Moreover, the resolution of the display apparatus can also be increased.

The light-emitting layer 383R contains a light-emitting material that emits red light. The active layer 373 contains an organic compound that absorbs light with a wavelength shorter than that of red light (e.g., one or both of green light and blue light). The active layer 373 preferably contains an organic compound that does not easily absorb red light and that absorbs light with a wavelength shorter than that of red light. In that case, red light can be efficiently extracted from the light-emitting element 370R, and the light-receiving element 370PD can detect light with a wavelength shorter than that of red light with high accuracy.

Although the light-emitting element 370R and the light-receiving element 370PD have the same structure in an example of the display apparatus 380B, the light-emitting element 370R and the light-receiving element 370PD may include optical adjustment layers with different thicknesses.

Figure 19A:
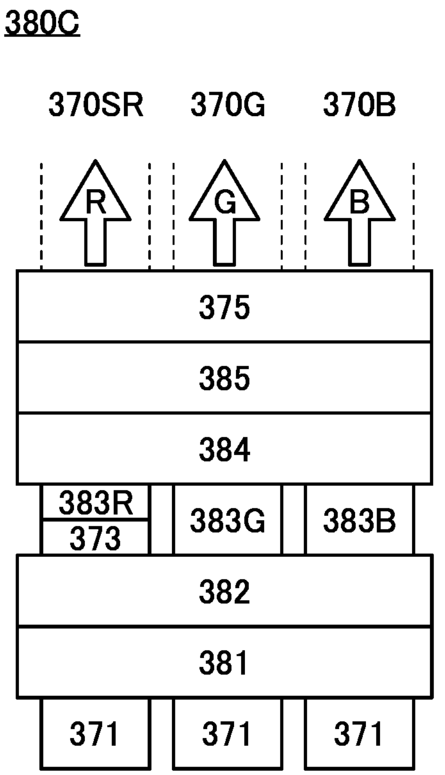
FIG. 19A to FIG. 19G are diagrams illustrating structure examples of a display apparatus.
Figure 19B:
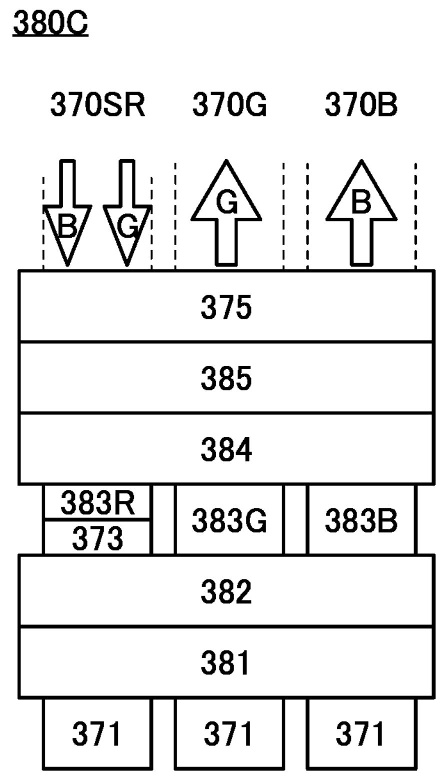

A display apparatus 380C illustrated in FIG. 19A and FIG. 19B includes a light-emitting and light-receiving element 370SR that emits red (R) light and has a light-receiving function, the light-emitting element 370G, and the light-emitting element 370B. The above-described display apparatus 380A and the like can be referred to for the structures of the light-emitting element 370G and the light-emitting element 370B.

The light-emitting and light-receiving element 370SR includes the pixel electrode 371, the hole-injection layer 381, the hole-transport layer 382, the active layer 373, the light-emitting layer 383R, the electron-transport layer 384, the electron-injection layer 385, and the common electrode 375 which are stacked in this order. The light-emitting and light-receiving element 370SR has the same structure as the light-emitting element 370R and the light-receiving element 370PD illustrated in the display apparatus 380B.

FIG. 19A illustrates the case where the light-emitting and light-receiving element 370SR functions as a light-emitting element. FIG. 19A illustrates an example in which the light-emitting element 370B emits blue light, the light-emitting element 370G emits green light, and the light-emitting and light-receiving element 370SR emits red light.

FIG. 19B illustrates the case where the light-emitting and light-receiving element 370SR functions as a light-receiving element. FIG. 19B illustrates an example in which the light-emitting and light-receiving element 370SR receives blue light emitted by the light-emitting element 370B and green light emitted by the light-emitting element 370G.

The light-emitting element 370B, the light-emitting element 370G, and the light-emitting and light-receiving element 370SR each include the pixel electrode 371 and the common electrode 375. In this embodiment, the case where the pixel electrode 371 functions as an anode and the common electrode 375 functions as a cathode is described as an example. The light-emitting and light-receiving element 370SR is driven by application of reverse bias between the pixel electrode 371 and the common electrode 375, whereby light incident on the light-emitting and light-receiving element 370SR can be detected and charge can be generated and extracted as current.

It can be said that the light-emitting and light-receiving element 370SR has a structure in which the active layer 373 is added to the light-emitting element. That is, the light-emitting and light-receiving element 370SR can be formed concurrently with the light-emitting elements only by adding a step of forming the active layer 373 in the formation step of the light-emitting element. The light-emitting element and the light-emitting and light-receiving element can be formed over the same substrate. Thus, the display portion can be provided with one or both of an image capturing function and a sensing function without a significant increase in the number of manufacturing steps.

The stacking order of the light-emitting layer 383R and the active layer 373 is not limited. FIG. 19A and FIG. 19B each illustrate an example in which the active layer 373 is provided over the hole-transport layer 382 and the light-emitting layer 383R is provided over the active layer 373. The stacking order of the light-emitting layer 383R and the active layer 373 may be reversed.

The light-emitting and light-receiving element may exclude at least one layer of the hole-injection layer 381, the hole-transport layer 382, the electron-transport layer 384, and the electron-injection layer 385. Furthermore, the light-emitting and light-receiving element may include another functional layer such as a hole-blocking layer or an electron-blocking layer.

In the light-emitting and light-receiving element, a conductive film that transmits visible light is used as the electrode through which light is extracted. A conductive film that reflects visible light is preferably used for the electrode through which light is not extracted.

The functions and materials of the layers constituting the light-emitting and light-receiving element are similar to those of the layers constituting the light-emitting elements and the light-receiving element and are not described in detail.

FIG. 19C to FIG. 19G illustrate examples of stacked-layer structures of light-emitting and light-receiving elements.

Figures 19C, 19D, 19E, 19F, 19G:
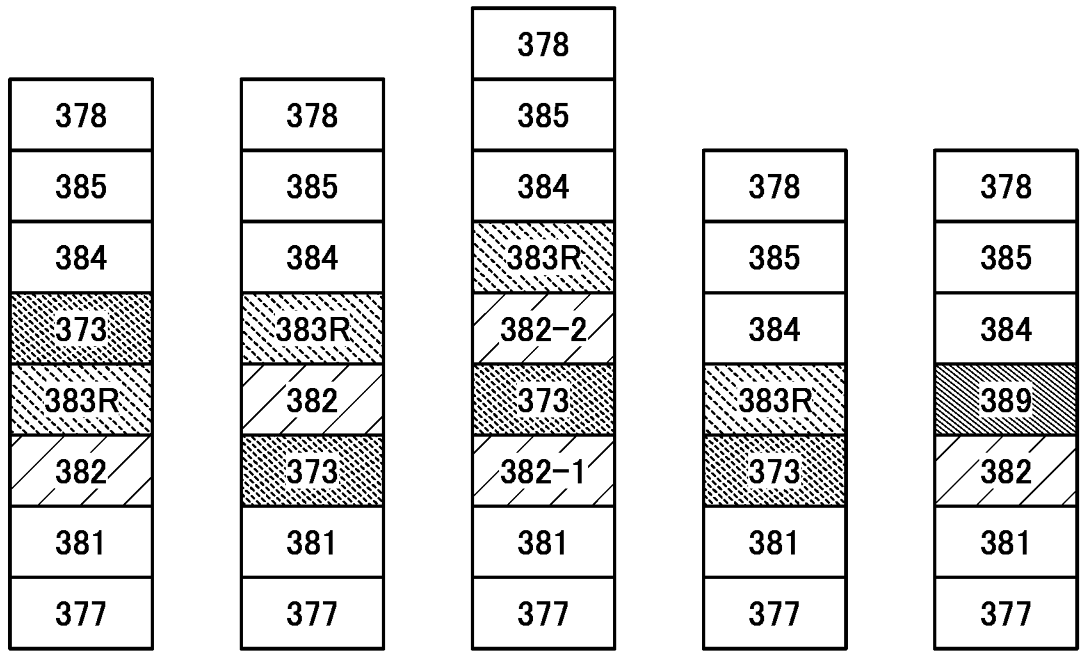

The light-emitting and light-receiving element illustrated in FIG. 19C includes a first electrode 377, the hole-injection layer 381, the hole-transport layer 382, the light-emitting layer 383R, the active layer 373, the electron-transport layer 384, the electron-injection layer 385, and a second electrode 378.

FIG. 19C illustrates an example in which the light-emitting layer 383R is provided over the hole-transport layer 382 and the active layer 373 is stacked over the light-emitting layer 383R.

As illustrated in FIG. 19A to FIG. 19C, the active layer 373 and the light-emitting layer 383R may be in contact with each other.

A buffer layer is preferably provided between the active layer 373 and the light-emitting layer 383R. In that case, the buffer layer preferably has a hole-transport property and an electron-transport property. For example, a substance with a bipolar property is preferably used for the buffer layer. Alternatively, as the buffer layer, at least one layer of a hole-injection layer, a hole-transport layer, an electron-transport layer, an electron-injection layer, a hole-blocking layer, an electron-blocking layer, and the like can be used. FIG. 19D illustrates an example in which the hole-transport layer 382 is used as the buffer layer.

The buffer layer provided between the active layer 373 and the light-emitting layer 383R can inhibit transfer of excitation energy from the light-emitting layer 383R to the active layer 373. Furthermore, the optical path length (cavity length) of the microcavity structure can be adjusted with the buffer layer. Thus, high emission efficiency can be obtained from the light-emitting and light-receiving element including the buffer layer between the active layer 373 and the light-emitting layer 383R.

FIG. 19E illustrates an example of a stacked-layer structure in which a hole-transport layer 382-1, the active layer 373, a hole-transport layer 382-2, and the light-emitting layer 383R are stacked in this order over the hole-injection layer 381. The hole-transport layer 382-2 functions as a buffer layer. The hole-transport layer 382-1 and the hole-transport layer 381-2 may contain the same material or different materials. Instead of the hole-transport layer 381-2, any of the above layers that can be used as the buffer layer may be used. The positions of the active layer 373 and the light-emitting layer 383R may be interchanged.

The light-emitting and light-receiving element illustrated in FIG. 19F is different from the light-emitting and light-receiving element illustrated in FIG. 19A in not including the hole-transport layer 382. In this manner, the light-emitting and light-receiving element may exclude at least one of the hole-injection layer 381, the hole-transport layer 382, the electron-transport layer 384, and the electron-injection layer 385. Furthermore, the light-emitting and light-receiving element may include another functional layer such as a hole-blocking layer or an electron-blocking layer.

The light-emitting and light-receiving element illustrated in FIG. 19G is different from the light-emitting and light-receiving element illustrated in FIG. 19A in including a layer 389 serving as both a light-emitting layer and an active layer instead of including the active layer 373 and the light-emitting layer 383R.

As the layer serving as both a light-emitting layer and an active layer, it is possible to use, for example, a layer containing three materials which are an n-type semiconductor that can be used for the active layer 373, a p-type semiconductor that can be used for the active layer 373, and a light-emitting substance that can be used for the light-emitting layer 383R.

Note that an absorption band on the lowest energy side of an absorption spectrum of a mixed material of the n-type semiconductor and the p-type semiconductor and a maximum peak of an emission spectrum (PL spectrum) of the light-emitting substance preferably do not overlap with each other and are further preferably positioned fully apart from each other.

Although the cases where common layers are provided for the light-emitting elements and the light-receiving element or for the light-emitting elements and the light-emitting and light-receiving element are described above, a case where the common layers are not provided is described below.

Figure 20A:
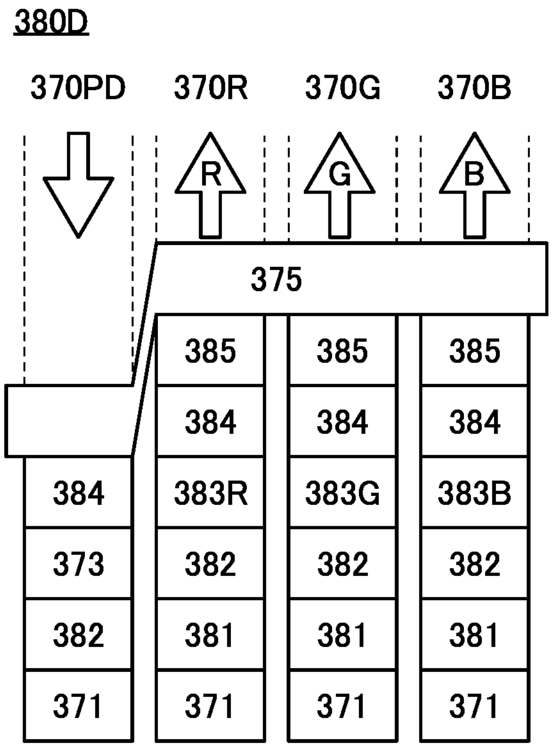
FIG. 20A to FIG. 20C are diagrams illustrating structure examples of a display apparatus.

A display apparatus 380D illustrated in FIG. 20A is an example in which only the common electrode 375 is shared among the light-receiving element 370PD, the light-emitting element 370R, the light-emitting element 370G, and the light-emitting element 370B.

The hole-injection layers 381, the hole-transport layers 382, the electron-transport layers 384, and the electron-injection layers 385 that are provided in the light-emitting element 370R, the light-emitting element 370G, and the light-emitting element 370B are each formed in different steps, and they may differ in thickness, material, density, and the like from each other on the light-emitting element basis or may have the same thickness, material, density, and the like.

The light-receiving element 370PD has a structure in which the pixel electrode 371, the hole-transport layer 382, the active layer 373, the electron-transport layer 384, and the common electrode 375 are stacked, and the stacked-layer structure is simplified as compared with the case of the display apparatus 380A. Thus, the driving voltage of the light-receiving element 370PD can be reduced.

Figure 20B:
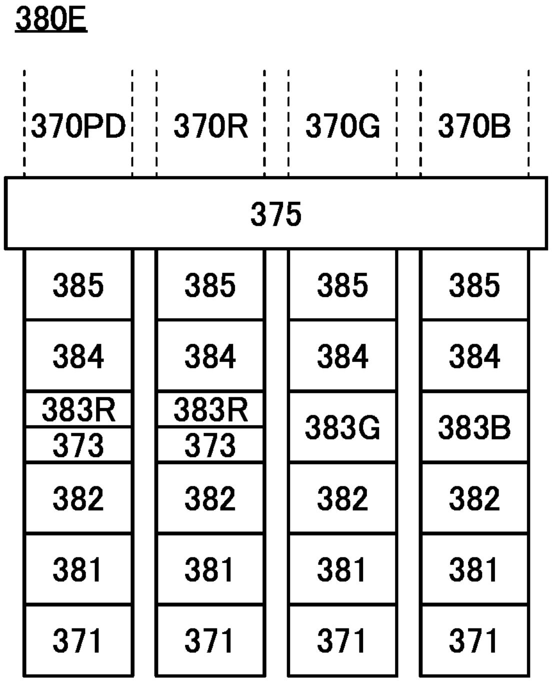

A display apparatus 380E illustrated in FIG. 20B is an example of the case where the light-receiving element 370PD and the light-emitting element 370R have the same stacked-layer structure and the light-emitting element 370G and the light-emitting element 370B have different stacked-layer structures from each other.

Figure 20C:
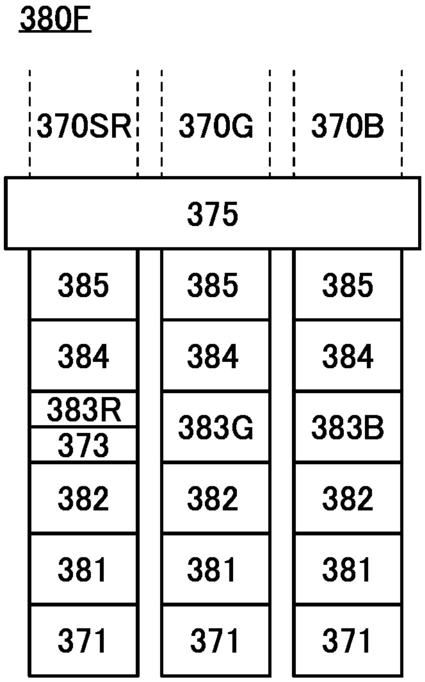

A display apparatus 380F illustrated in FIG. 20C is an example of the case where the light-emitting and light-receiving element 370SR, the light-emitting element 370G, and the light-emitting element 370B have different stacked-layer structures from each other.

With these structures without the common layers, the light-emitting elements, the light-receiving element, and the light-emitting and light-receiving element can have different stacked-layer structures from each other; thus, the material, thickness, density, and the like of each layer can be easily and individually optimized. When the common layers are not provided for the light-emitting elements and the light-receiving element or for the light-emitting elements and the light-emitting and light-receiving element, generation of a leakage current through the common layers can be prevented; thus, the S/N ratio can be improved and a more clear image can be captured.

Embodiment 5

In this embodiment, an example of a display apparatus including a light-receiving device and the like of one embodiment of the present invention will be described.

In the display apparatus of this embodiment, a pixel can include a plurality of types of subpixels including light-emitting devices that emit light of different colors. For example, the pixel can include three types of subpixels. As the three subpixels, subpixels of three colors of red (R), green (G), and blue (B) and subpixels of three colors of yellow (Y), cyan (C), and magenta (M) can be given. Alternatively, the pixel can include four types of subpixels. As the four subpixels, subpixels of four colors of R, G, B, and white (W) and subpixels of four colors of R, G, B, and Y can be given.

There is no particular limitation on the arrangement of subpixels, and a variety of methods can be employed. Examples of the arrangement of subpixels include a stripe arrangement, an S-stripe arrangement, a matrix arrangement, a delta arrangement, a Bayer arrangement, and a PenTile arrangement.

Examples of a top surface shape of the subpixel include polygons such as a triangle, a tetragon (including a rectangle and a square), and a pentagon; polygons with rounded corners; an ellipse; and a circle. Here, a top surface shape of the subpixel corresponds to a top surface shape of a light-emitting region of the light-emitting device.

In the display apparatus including light-emitting devices and a light-receiving device in each pixel, the pixel has a light-receiving function; thus, the display apparatus can detect a contact or approach of an object while displaying an image. For example, an image can be displayed by using all the subpixels included in the display apparatus; or light can be emitted by some of the subpixels as a light source and an image can be displayed by using the other subpixels.

Figure 21A:
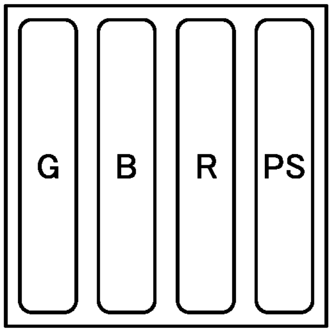
FIG. 21A to FIG. 21F are diagrams each illustrating an example of a pixel.
Figure 21B:
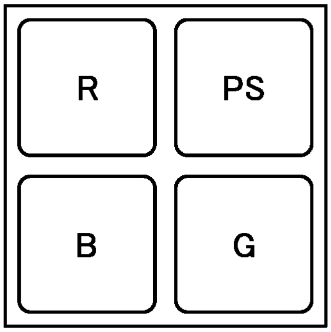
Figure 21C:
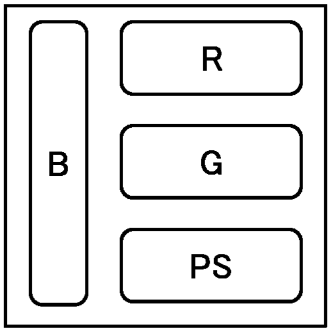

Pixels illustrated in FIG. 21A, FIG. 21B, and FIG. 21C each include a subpixel G, a subpixel B, a subpixel R, and a subpixel PS.

The pixel illustrated in FIG. 21A employs a stripe arrangement. The pixel illustrated in FIG. 21B employs a matrix arrangement.

In the pixel arrangement illustrated in FIG. 21C, three subpixels (the subpixel R, the subpixel G, and a subpixel S) are vertically arranged next to one subpixel (the subpixel B).

Figure 21D:
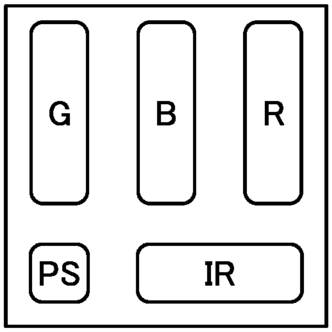
Figure 21E:
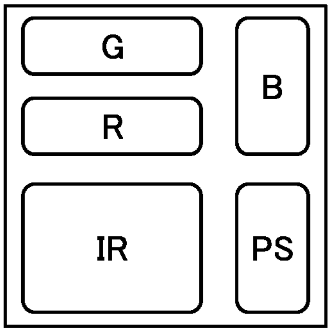
Figure 21F:
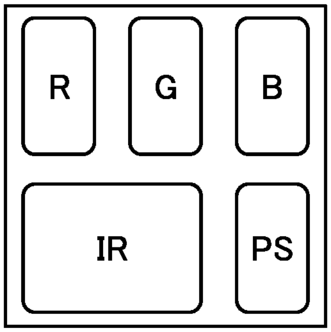

Pixels illustrated in FIG. 21D, FIG. 21E, and FIG. 21F each include the subpixel G, the subpixel B, the subpixel R, a subpixel IR, and the subpixel PS.

FIG. 21D, FIG. 21E, and FIG. 21F illustrate examples in which one pixel is provided across two rows. Three subpixels (the subpixel G, the subpixel B, and the subpixel R) are provided in the upper row (first row), and two subpixels (one subpixel PS and one subpixel IR) are provided in the lower row (second row).

In FIG. 21D, the three vertically oriented subpixel G, subpixel B, and subpixel R are arranged laterally, and the subpixel PS and the horizontally oriented subpixel IR are arranged laterally below the three subpixels. In FIG. 21E, the two horizontally oriented subpixel G and subpixel R are arranged in the vertical direction; the vertically oriented subpixel B is arranged laterally next to the subpixels G and R; and the horizontally oriented subpixel IR and the vertically oriented subpixel PS are arranged laterally below the subpixels R, G, and B. In FIG. 21F, the three vertically oriented subpixel R, subpixel G, and subpixel B are arranged laterally, and the horizontally oriented subpixel IR and the vertically oriented subpixel PS are arranged laterally below the subpixels R, G, and B. In FIG. 21E and FIG. 21F, the area of the subpixel IR is the largest, and the area of the subpixel PS is substantially the same as that of the subpixel and the like.

Note that the layout of the subpixels is not limited to the structures illustrated in FIG. 21A to FIG. 21F.

The subpixel R includes a light-emitting device that emits red light. The subpixel G includes a light-emitting device that emits green light. The subpixel B includes a light-emitting device that emits blue light. The subpixel IR includes a light-emitting device that emits infrared light. The subpixel PS includes a light-receiving device. Although there is no particular limitation on the wavelength of light that the subpixel PS detects, the light-receiving device included in the subpixel PS preferably has sensitivity to light emitted from the light-emitting device included in the subpixel R, the subpixel G, the subpixel B, or the subpixel IR. The light-receiving device preferably detects one or more of light in blue, violet, bluish violet, green, yellow green, yellow, orange, red, and infrared wavelength ranges, for example.

The light-receiving area of the subpixel PS is smaller than the light-emitting area of each of the other subpixels. A smaller light-receiving area leads to a narrower image-capturing range, inhibits a blur in an image capturing result, and improves the definition. Thus, by using the subpixel PS, high-resolution or high-definition image capturing is possible. For example, image capturing for personal authentication with the use of a fingerprint, a palm print, the iris, the shape of a blood vessel (including the shape of a vein and the shape of an artery), a face, or the like is possible by using the subpixel PS.

Moreover, the subpixel PS can be used in a touch sensor (also referred to as a direct touch sensor), a near touch sensor (also referred to as a hover sensor, a hover touch sensor, a contactless sensor, or a touchless sensor), or the like. For example, the subpixel PS preferably detects infrared light. Thus, touch detection is possible even in a dark place.

Here, the touch sensor or the near touch sensor can detect an approach or contact of an object (e.g., a finger, a hand, or a pen). The touch sensor can detect an object when the display apparatus and the object come in direct contact with each other. The near touch sensor can detect an object even when the object is not in contact with the display apparatus. For example, the display apparatus can preferably detect an object when the distance between the display apparatus and the object is more than or equal to 0.1 mm and less than or equal to 300 mm, preferably more than or equal to 3 mm and less than or equal to 50 mm. With this structure, the display apparatus can be controlled without an object directly contacting with the display apparatus. In other words, the display apparatus can be controlled in a contactless (touchless) manner. With the above structure, the display apparatus can have a reduced risk of being dirty or damaged, or can be operated without the object directly touching a dirt (e.g., dust or a virus) attached to the display apparatus.

For high-resolution image capturing, the subpixel PS is preferably provided in every pixel included in the display apparatus. Meanwhile, in the case where the subpixel PS is used in a touch sensor, a near touch sensor, or the like, high accuracy is not required as compared to the case of capturing an image of a fingerprint or the like; accordingly, the subpixel PS is provided in some of the pixels in the display apparatus. When the number of subpixels PS included in the display apparatus is smaller than the number of subpixels R, for example, higher detection speed can be achieved.

Figure 21G:
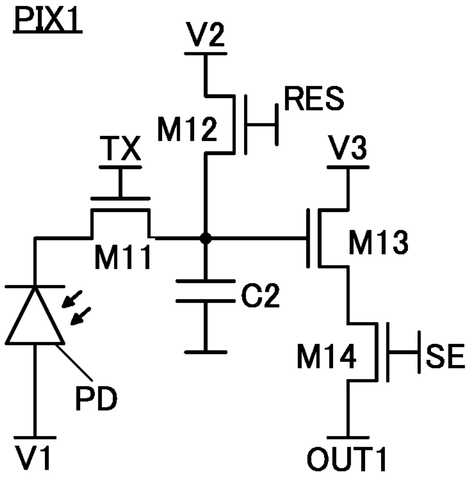
FIG. 21G and FIG. 21H are diagrams each illustrating a circuit diagram example of a pixel.
Figure 21H:
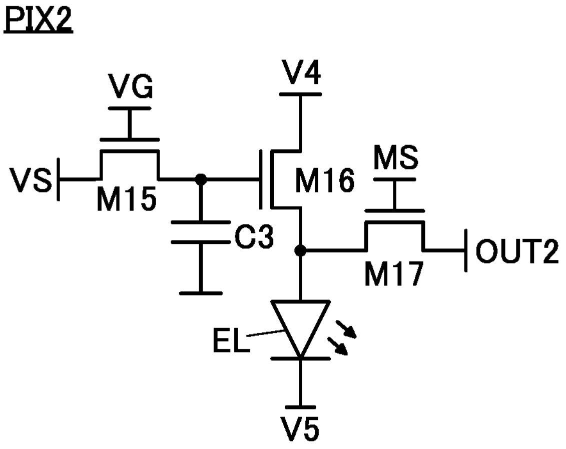

FIG. 21G illustrates an example of a pixel circuit for a subpixel including a light-receiving device. FIG. 21H illustrates an example of a pixel circuit for a subpixel including a light-emitting device.

A pixel circuit PIX1 illustrated in FIG. 21G includes a light-receiving device PD, a transistor M11, a transistor M12, a transistor M13, a transistor M14, and a capacitor C2. Here, a photodiode is used as an example of the light-receiving device PD.

An anode of the light-receiving device PD is electrically connected to a wiring V1, and a cathode of the light-receiving device PD is electrically connected to one of a source and a drain of the transistor M11. A gate of the transistor M11 is electrically connected to a wiring TX, and the other of the source and the drain of the transistor M11 is electrically connected to one electrode of the capacitor C2, one of a source and a drain of the transistor M12, and a gate of the transistor M13. A gate of the transistor M12 is electrically connected to a wiring RES, and the other of the source and the drain of the transistor M12 is electrically connected to a wiring V2. One of a source and a drain of the transistor M13 is electrically connected to a wiring V3, and the other of the source and the drain of the transistor M13 is electrically connected to one of a source and a drain of the transistor M14. A gate of the transistor M14 is electrically connected to a wiring SE, and the other of the source and the drain of the transistor M14 is electrically connected to a wiring OUT1.

A constant potential is supplied to each of the wiring V1, the wiring V2, and the wiring V3. When the light-receiving device PD is driven with a reverse bias, the wiring V2 is supplied with a potential higher than the potential of the wiring V1. The transistor M12 is controlled by a signal supplied to the wiring RES and has a function of resetting a potential of a node connected to the gate of the transistor M13 to a potential supplied to the wiring V2. The transistor M11 is controlled by a signal supplied to the wiring TX and has a function of controlling the timing at which the potential of the node changes, in accordance with current flowing through the light-receiving device PD. The transistor M13 functions as an amplifier transistor for performing an output corresponding to the potential of the node. The transistor M14 is controlled by a signal supplied to the wiring SE and functions as a selection transistor for reading an output corresponding to the potential of the node by an external circuit connected to the wiring OUT1.

A pixel circuit PIX2 illustrated in FIG. 21H includes a light-emitting device EL, a transistor M15, a transistor M16, a transistor M17, and a capacitor C3. Here, a light-emitting diode is used as an example of the light-emitting device EL. In particular, an organic EL element is preferably used as the light-emitting device EL.

A gate of the transistor M15 is electrically connected to a wiring VG, one of a source and a drain of the transistor M15 is electrically connected to a wiring VS, and the other of the source and the drain of the transistor M15 is electrically connected to one electrode of the capacitor C3 and a gate of the transistor M16. One of a source and a drain of the transistor M16 is electrically connected to a wiring V4, and the other of the source and the drain of the transistor M16 is electrically connected to an anode of the light-emitting device EL and one of a source and a drain of the transistor M17. A gate of the transistor M17 is electrically connected to a wiring MS, and the other of the source and the drain of the transistor M17 is electrically connected to a wiring OUT2. A cathode of the light-emitting device EL is electrically connected to a wiring V5.

A constant potential is supplied to each of the wiring V4 and the wiring V5. The anode of the light-emitting device EL can be set to a high potential, and the cathode can be set to a lower potential than the anode. The transistor M15 is controlled by a signal supplied to the wiring VG and functions as a selection transistor for controlling a selection state of the pixel circuit PIX2. The transistor M16 functions as a driving transistor that controls current flowing through the light-emitting device EL in accordance with a potential supplied to the gate of the transistor M16. When the transistor M15 is on, a potential supplied to the wiring VS is supplied to the gate of the transistor M16, and the luminance of the light-emitting device EL can be controlled in accordance with the potential. The transistor M17 is controlled by a signal supplied to the wiring MS and has a function of outputting a potential between the transistor M16 and the light-emitting device EL to the outside through the wiring OUT2.

Here, a transistor in which a metal oxide (an oxide semiconductor) is used in a semiconductor layer where a channel is formed is preferably used as each of the transistor M11, the transistor M12, the transistor M13, and the transistor M14 included in the pixel circuit PIX1 and the transistor M15, the transistor M16, and the transistor M17 included in the pixel circuit PIX2.

A transistor using a metal oxide having a wider band gap and a lower carrier density than silicon achieves extremely low off-state current. Therefore, owing to the low off-state current, charge accumulated in a capacitor that is connected in series to the transistor can be retained for a long time. Hence, it is particularly preferable to use transistors containing an oxide semiconductor as the transistor M11, the transistor M12, and the transistor M15 each of which is connected in series with the capacitor C2 or the capacitor C3. Moreover, the use of transistors using an oxide semiconductor as the other transistors can reduce the manufacturing cost.

For example, the off-state current per micrometer of channel width of an OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current per micrometer of channel width of a Si transistor at room temperature is higher than or equal to 1 fA ($1\times10^{-15}$ A) and lower than or equal to 1 pA ($1\times10^{-12}$ A). In other words, the off-state current of an OS transistor is lower than that of a Si transistor by approximately ten orders of magnitude.

Alternatively, transistors using silicon as a semiconductor in which a channel is formed can be used as the transistor M11 to the transistor M17. It is particularly preferable to use silicon with high crystallinity, such as single crystal silicon or polycrystalline silicon, because high field-effect mobility can be achieved and higher-speed operation can be performed.

Alternatively, a transistor containing an oxide semiconductor may be used as at least one of the transistor M11 to the transistor M17, and transistors containing silicon may be used as the other transistors.

Although n-channel transistors are illustrated in FIG. 21G and FIG. 21H, p-channel transistors can alternatively be used.

The transistors included in the pixel circuit PIX1 and the transistors included in the pixel circuit PIX2 are preferably formed side by side over the same substrate. It is particularly preferable that the transistors included in the pixel circuit PIX1 and the transistors included in the pixel circuit PIX2 be cyclically arranged in one region.

One or more layers including one or both of the transistor and the capacitor are preferably provided at a position overlapping with the light-receiving device PD or the light-emitting device EL. Thus, the effective area occupied by each pixel circuit can be reduced, and a high-resolution light-receiving portion or display portion can be achieved.

To increase the luminance of the light-emitting device EL included in the pixel circuit, the amount of current fed through the light-emitting device EL needs to be increased. To increase the current amount, the source-drain voltage of a driving transistor included in the pixel circuit needs to be increased. An OS transistor has higher withstand voltage between a source and a drain than a Si transistor; hence, high voltage can be applied between the source and the drain of the OS transistor. Accordingly, when an OS transistor is used as the driving transistor included in the pixel circuit, the amount of current flowing through the light-emitting device can be increased, so that the luminance of the light-emitting device can be increased.

When transistors operate in a saturation region, a change in source-drain current relative to a change in gate-source voltage can be smaller in an OS transistor than in a Si transistor. Accordingly, when an OS transistor is used as the driving transistor included in the pixel circuit, current flowing between the source and the drain can be set minutely by a change in gate-source voltage; hence, the amount of current flowing through the light-emitting device can be controlled. Consequently, the number of gray levels expressed by the pixel circuit can be increased.

Regarding saturation characteristics of current flowing when transistors operate in a saturation region, even in the case where the source-drain voltage of an OS transistor increases gradually, more stable current (saturation current) can be fed through the OS transistor than through a Si transistor. Thus, by using an OS transistor as the driving transistor, stable current can be fed through light-emitting devices that contain an EL material even when the current-voltage characteristics of the light-emitting devices vary, for example. In other words, when the OS transistor operates in the saturation region, the source-drain current hardly changes with an increase in the source-drain voltage; hence, the luminance of the light-emitting device can be stable.

As described above, by using an OS transistor as the driving transistor included in the pixel circuit, it is possible to achieve “inhibition of black-level degradation”, “increase in emission luminance”, “increase in gray level”, “inhibition of variation in light-emitting devices”, and the like.

The refresh rate can be variable in the display apparatus of one embodiment of the present invention. For example, the refresh rate can be adjusted in accordance with the contents displayed on the display apparatus (e.g., adjusted in the range from 0.01 Hz to 240 Hz inclusive), whereby power consumption can be reduced. The driving with a lowered refresh rate for reducing power consumption of a display apparatus may be referred to as idling stop (IDS) driving.

The driving frequency of the touch sensor or the near touch sensor may be changed in accordance with the refresh rate. For example, when the refresh rate of the display apparatus is 120 Hz, the driving frequency of the touch sensor or the near touch sensor can be higher than 120 Hz (typically, 240 Hz). With this structure, low power consumption can be achieved, and the response speed of the touch sensor or the near touch sensor can be increased.

At least part of this embodiment can be implemented in appropriate combination with the other embodiments described in this specification.

Embodiment 6

In this embodiment, electronic devices of one embodiment of the present invention will be described with reference to FIG. 22 to FIG. 25.

An electronic device of this embodiment includes the display apparatus of one embodiment of the present invention. In the display apparatus of one embodiment of the present invention, increases in resolution, definition, and sizes are easily achieved. Thus, the display apparatus of one embodiment of the present invention can be used for a display portion of a variety of electronic devices.

The display apparatus of one embodiment of the present invention can be manufactured at low cost, which leads to a reduction in the manufacturing cost of an electronic device.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or notebook personal computer, a monitor of a computer or the like, digital signage, and a large game machine such as a pachinko machine.

In particular, the display apparatus of one embodiment of the present invention can have a high resolution, and thus can be suitably used for an electronic device including a relatively small display portion. Examples of the electronic devices include information terminals (wearable devices) such as watch-type and bracelet-type information terminals and wearable devices capable of being worn on the head, such as a VR device like a head-mounted display and a glasses-type AR device. Examples of wearable devices include an SR (Substitutional Reality) device and an MR (Mixed Reality) device.

The definition of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680×4320). In particular, definition of 4K2K, 8K4K, or higher is preferable. Furthermore, the pixel density (resolution) of the display apparatus of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With the display apparatus with such high definition or high resolution, higher realistic sensation, sense of depth, and the like can be achieved.

The electronic device of this embodiment can be incorporated along a curved surface of an inside wall or an outside wall of a house or a building or the interior or the exterior of a car.

The electronic device of this embodiment may include an antenna. When a signal is received by the antenna, the electronic device can display a video, data, and the like on a display portion. When the electronic device includes the antenna and a secondary battery, the antenna may be used for contactless power transmission.

The electronic device of this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, power, radiation, flow rate, humidity, gradient, oscillation, a smell, or infrared rays).

The electronic device of this embodiment can have a variety of functions. For example, the electronic device can have a function of displaying a variety of kinds of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 22A:
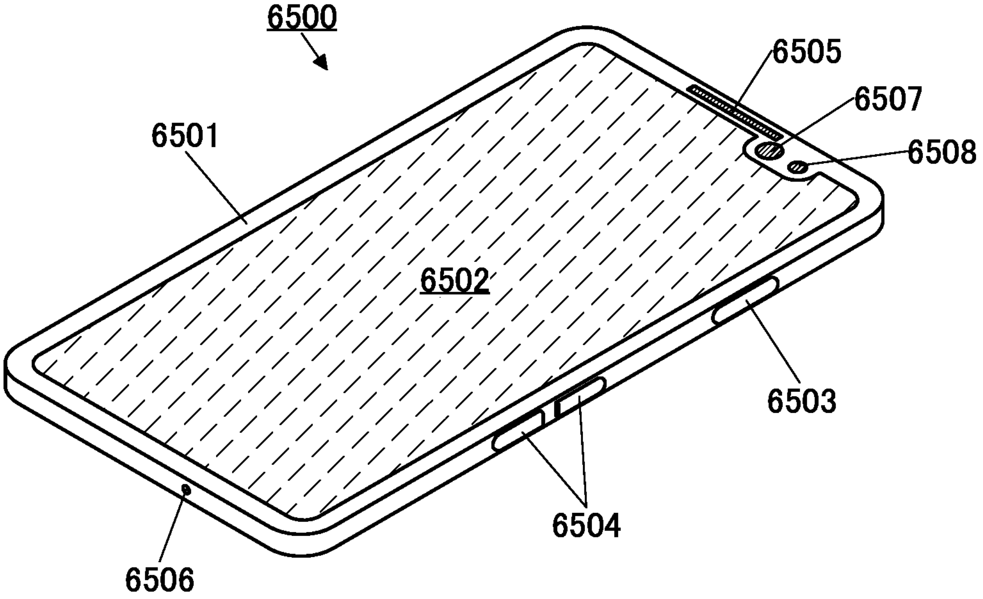
FIG. 22A and FIG. 22B are diagrams illustrating an example of an electronic device.

An electronic device 6500 illustrated in FIG. 22A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 22B:
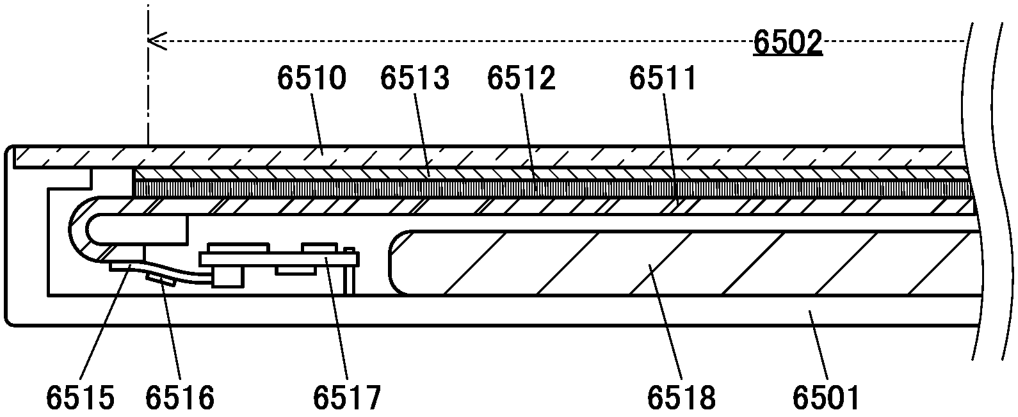

FIG. 22B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display (a display apparatus having flexibility) of one embodiment of the present invention can be used for the display panel 6511. Thus, an extremely lightweight electronic device can be achieved. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is positioned on the rear side of a pixel portion.

Figure 23A:
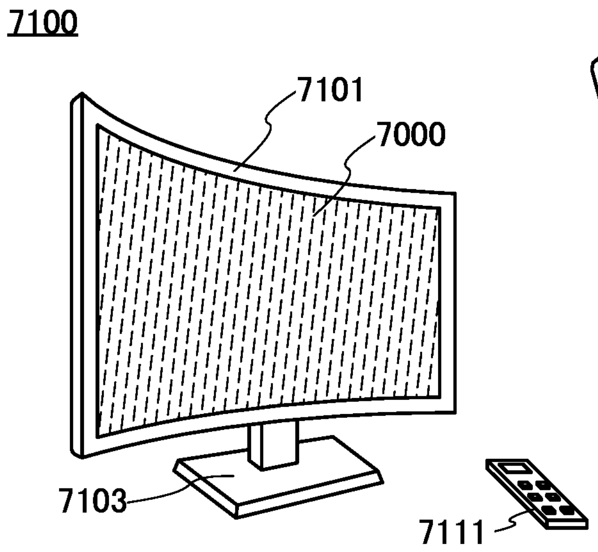
FIG. 23A to FIG. 23D are diagrams illustrating examples of electronic devices.

FIG. 23A illustrates an example of a television device. In a television device 7100, a display portion 7000 is incorporated in a housing 7101. Here, a structure in which the housing 7101 is supported by a stand 7103 is illustrated.

The display apparatus of one embodiment of the present invention can be used in the display portion 7000.

Operation of the television device 7100 illustrated in FIG. 23A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be controlled and videos displayed on the display portion 7000 can be controlled.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 23B:
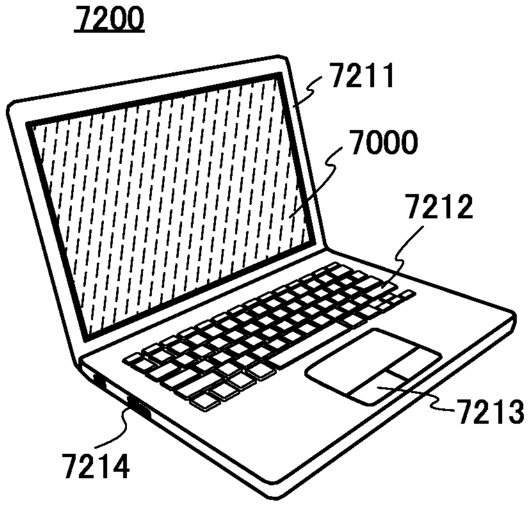

FIG. 23B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display apparatus of one embodiment of the present invention can be used in the display portion 7000.

Figure 23C:
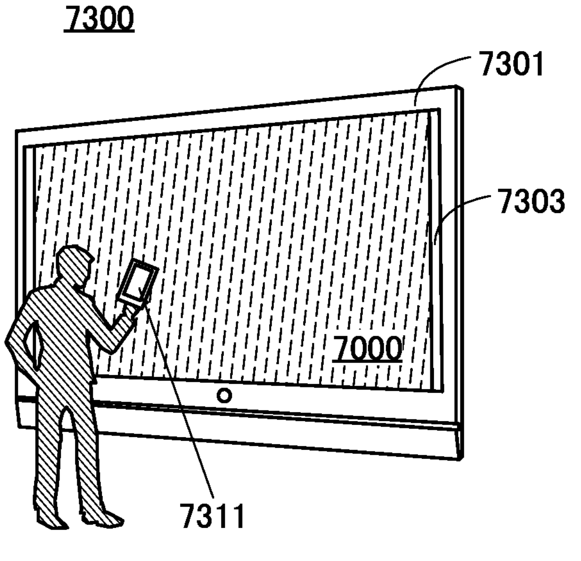
Figure 23D:
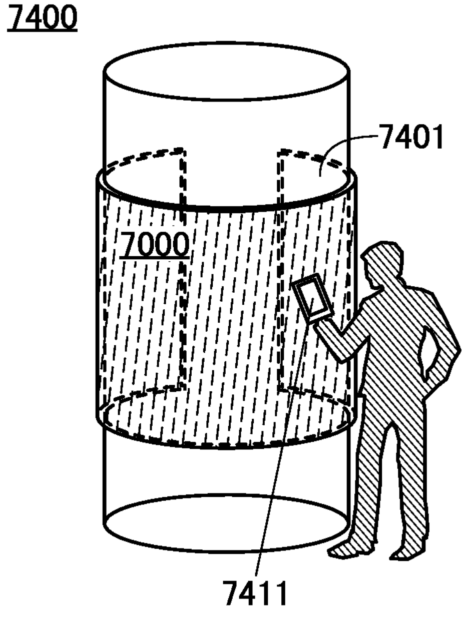

FIG. 23C and FIG. 23D illustrate examples of digital signage.

Digital signage 7300 illustrated in FIG. 23C includes a housing 7301, the display portion 7000, a speaker 7303, and the like. Furthermore, the digital signage 7300 can include an LED lamp, an operation key (including a power switch or an operation switch), a connection terminal, a variety of sensors, a microphone, and the like.

FIG. 23D is digital signage 7400 attached to a cylindrical pillar 7401. The digital signage 7400 includes the display portion 7000 provided along a curved surface of the pillar 7401.

The display apparatus of one embodiment of the present invention can be used for the display portion 7000 in FIG. 23C and FIG. 23D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of an image or a moving image on the display portion 7000, intuitive operation by a user is possible. Moreover, for an application for providing information such as route information or traffic information, usability can be enhanced by intuitive operation.

As illustrated in FIG. 23C and FIG. 23D, it is preferable that the digital signage 7300 or the digital signage 7400 can work with an information terminal 7311 or an information terminal 7411, such as a smartphone a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Figure 24A:
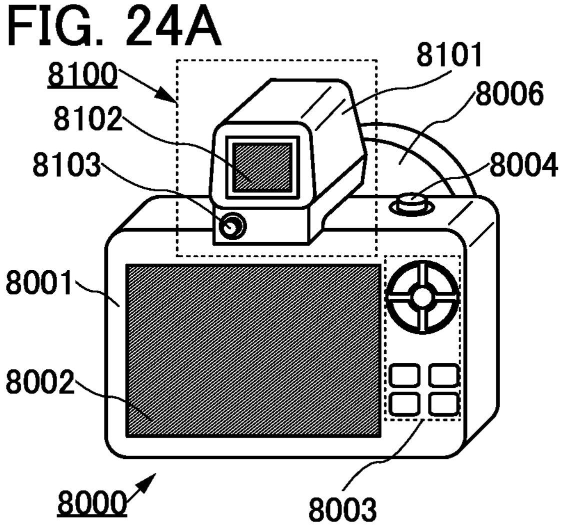
FIG. 24A to FIG. 24F are diagrams illustrating examples of electronic devices.

FIG. 24A is a diagram illustrating the appearance of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000. Note that the lens 8006 and the housing may be integrated with each other in the camera 8000.

The camera 8000 can take images by the press of the shutter button 8004 or touch on the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with the mount engaging with a mount of the camera 8000. In the finder 8100, a video or the like received from the camera 8000 can be displayed on the display portion 8102.

The button 8103 has a function of a power button or the like.

The display apparatus of one embodiment of the present invention can be used for the display portion 8002 of the camera 8000 and the display portion 8102 of the finder 8100. Note that a finder may be incorporated in the camera 8000.

Figure 24B:
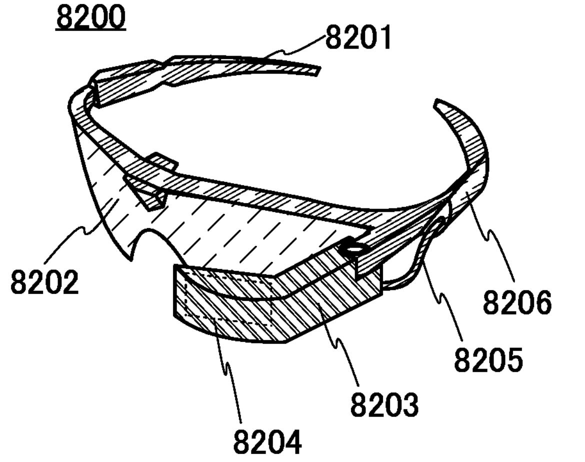

FIG. 24B is a diagram illustrating the appearance of a head-mounted display 8200.

The head-mounted display 8200 includes a wearing portion 8201, a lens 8202, a main body 8203, a display portion 8204, a cable 8205, and the like. A battery 8206 is incorporated in the wearing portion 8201.

The cable 8205 supplies power from the battery 8206 to the main body 8203. The main body 8203 includes a wireless receiver or the like and can display received video information on the display portion 8204. In addition, the main body 8203 is provided with a camera, and information on the movement of the user's eyeball or eyelid can be used as an input means.

The mounting portion 8201 may be provided with a plurality of electrodes capable of sensing current flowing in response to the movement of the user's eyeball in a position in contact with the user to have a function of recognizing the user's sight line. Furthermore, the mounting portion 8201 may have a function of monitoring the user's pulse with the use of current flowing through the electrodes. Moreover, the mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, or the like.

The display apparatus of one embodiment of the present invention can be used in the display portion 8204.

Figure 24C:
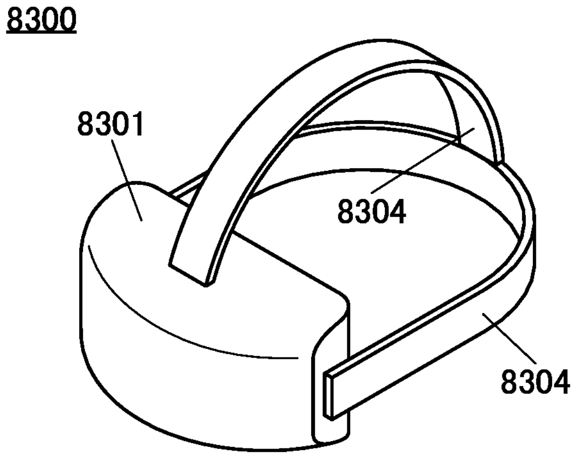
Figure 24D:
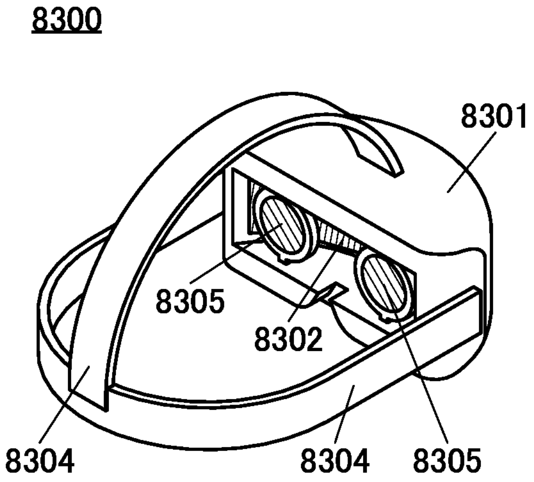
Figure 24E:
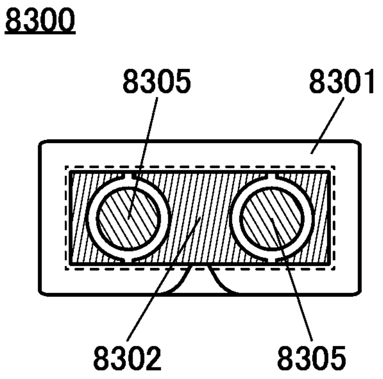

FIG. 24C to FIG. 24E are diagrams illustrating the appearance of a head-mounted display 8300. The head-mounted display 8300 includes a housing 8301, a display portion 8302, a fixing unit 8304, and a pair of lenses 8305.

A user can perceive display on the display portion 8302 through the lenses 8305. Note that the display portion 8302 is preferably curved and placed because the user can feel a high realistic sensation. In addition, when another image displayed on a different region of the display portion 8302 is perceived through the lenses 8305, three-dimensional display using parallax, or the like can also be performed. Note that the number of display portions 8302 provided is not limited to one; two display portions 8302 may be provided so that one display portion is provided for one eye of the user.

The display apparatus of one embodiment of the present invention can be used for the display portion 8302. The display apparatus of one embodiment of the present invention can achieve extremely high resolution. For example, a pixel is not easily perceived by the user even when the user perceives display that is magnified by the use of the lenses 8305 as illustrated in FIG. 24E. In other words, a video with a strong sense of reality can be perceived by the user with the use of the display portion 8302.

Figure 24F:
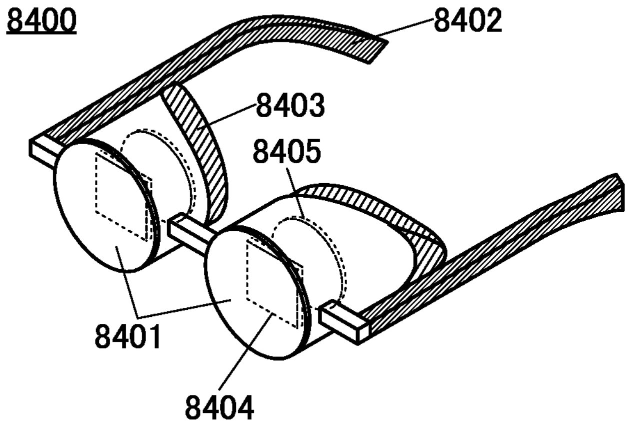

FIG. 24F is a diagram illustrating the appearance of a goggle-type head-mounted display 8400. The head-mounted display 8400 includes a pair of housings 8401, a mounting portion 8402, and a cushion 8403. A display portion 8404 and a lens 8405 are provided in each of the pair of housings 8401. The pair of display portions 8404 may display different images, whereby three-dimensional display using parallax can be performed.

A user can perceive display on the display portion 8404 through the lenses 8405. The lens 8405 has a focus adjustment mechanism and can adjust the position according to the user's eyesight. The display portion 8404 is preferably a square or a horizontal rectangle. Accordingly, realistic sensation can be increased.

The mounting portion 8402 preferably has plasticity and elasticity to be adjusted to fit the size of the user's face and not to slide down. In addition, part of the mounting portion 8402 preferably has a vibration mechanism functioning as a bone conduction earphone. Thus, without additionally requiring an audio device such as earphones or a speaker, the user can enjoy video and sound only by wearing. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered by cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable because cleaning or replacement can be easily performed.

Electronic devices illustrated in FIG. 25A to FIG. 25F include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, power, radiation, flow rate, humidity, gradient, oscillation, a smell, or infrared rays), a microphone 9008, and the like.

The electronic devices illustrated in FIG. 25A to FIG. 25F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. In addition, the electronic devices may each include a camera or the like and have a function of taking a still image or a moving image and storing the taken image in a recording medium (an external recording medium or a recording medium incorporated in the camera), a function of displaying the taken image on the display portion, or the like.

The display apparatus of one embodiment of the present invention can be used in the display portion 9001.

The details of the electronic devices illustrated in FIG. 25A to FIG. 25F are described below.

Figure 25A:
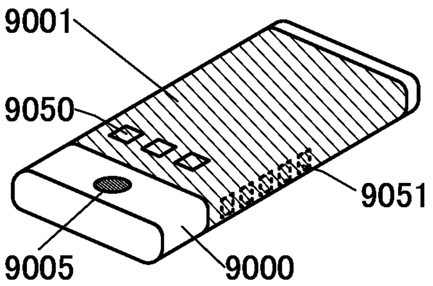
FIG. 25A to FIG. 25F are diagrams illustrating examples of electronic devices.

FIG. 25A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display letters and image information on its plurality of surfaces. FIG. 25A illustrates an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 25B:
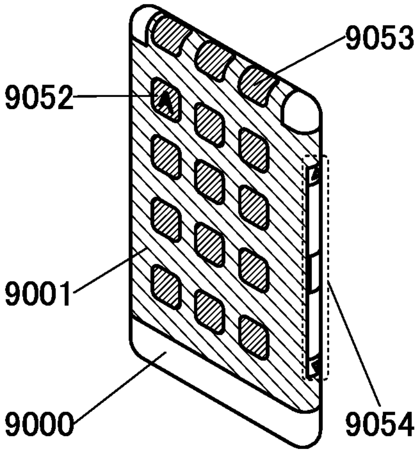

FIG. 25B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is illustrated. For example, the user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer a call, for example.

Figure 25C:
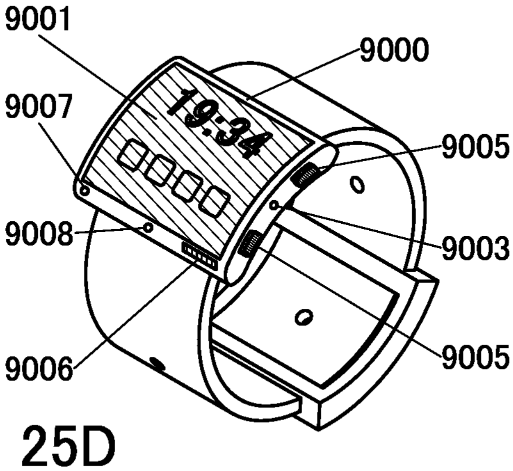

FIG. 25C is a perspective view illustrating a watch-type portable information terminal 9200. The portable information terminal 9200 can be used as a smartwatch (registered trademark), for example. The display surface of the display portion 9001 is curved, and display can be performed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and can be charged. Note that the charging operation may be performed by wireless power feeding.

Figure 25D:
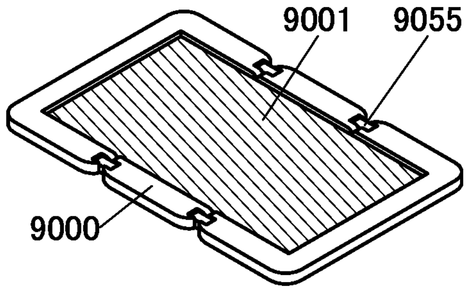
Figure 25E:
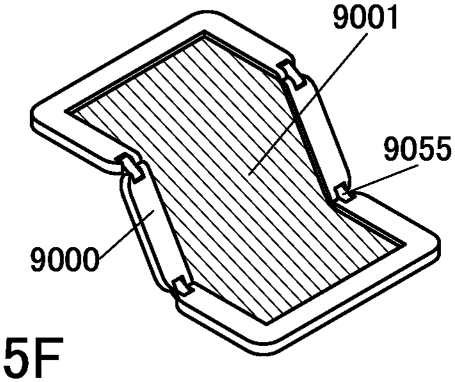
Figure 25F:
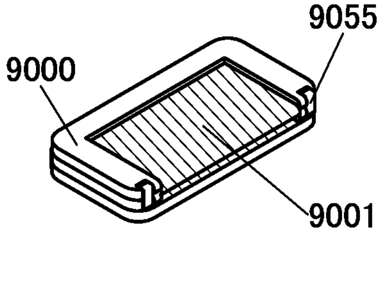

FIG. 25D to FIG. 25F are perspective views illustrating a foldable portable information terminal 9201. FIG. 25D is a perspective view of an opened state of the portable information terminal 9201, FIG. 25F is a perspective view of a folded state thereof, and FIG. 25E is a perspective view of a state in the middle of change from one of FIG. 25D and FIG. 25F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature greater than or equal to 0.1 mm and less than or equal to 150 mm.

At least part of the structure examples, the drawings corresponding thereto, and the like described in this embodiment can be combined with the other structure examples, the other drawings, and the like as appropriate.

At least part of this embodiment can be implemented in appropriate combination with the other embodiments described in this specification.

REFERENCE NUMERALS

100: display apparatus, 101: substrate, 102G: transistor, 102R: transistor, 102S: transistor, 102: transistor, 103: insulating layer, 110B: light-emitting element, 110G: light-emitting element, 110R: light-emitting element, 110S: light-receiving element, 110W: light-emitting element, 110: light-emitting element, 111B: pixel electrode, 111G: pixel electrode, 111R: pixel electrode, 111S: pixel electrode, 111: pixel electrode, 112B: organic layer, 112G: organic layer, 112R: organic layer, 112W: organic layer, 112: organic layer, 113: common electrode, 114: common layer, 121: protective layer, 125: insulating layer, 126: resin layer, 128: layer, 130: opening, 131: insulating layer, 135: spacer, 136: light-blocking layer, 137: lens, 138: lens, 155: organic layer, 160: image-capture target, 161: conductive layer, 163: planarization layer, 170: substrate, 171: adhesive layer, 174B: coloring layer, 174G: coloring layer, 174R: coloring layer, 181*a*: reflected light, 181*b*: reflected light, 181*c*: reflected light, 182: light, 200A: display panel, 200B: display panel, 200: display panel, 201: substrate, 202: substrate, 203: functional layer, 211B: light-emitting element, 211G: light-emitting element, 211IR: light-emitting element, 211R: light-emitting element, 211W: light-emitting element, 211X: light-emitting element, 211: light-emitting element, 212: light-receiving element, 213R: light-emitting and light-receiving element, 220: finger, 221: contact portion, 222: fingerprint, 223: image capturing range, 225: stylus, 226: path, 252: transistor, 254: connection portion, 258: transistor, 259: transistor, 260: transistor, 261: insulating layer, 262: insulating layer, 265: insulating layer, 268: insulating layer, 271: conductive layer, 272*a*: conductive layer, 272*b*: conductive layer, 273: conductive layer, 275: insulating layer, 278: connection portion, 281*i*: channel formation region, 281*n*: low-resistance region, 281: semiconductor layer, 292: connection layer, 294: insulating layer, 370B: light-emitting element, 370G: light-emitting element, 370PD: light-receiving element, 370R: light-emitting element, 370SR: light-emitting and light-receiving element, 371: pixel electrode, 373: active layer, 375: common electrode, 377: first electrode, 378: second electrode, 380A: display apparatus, 380B: display apparatus, 380C: display apparatus, 380D: display apparatus, 380E: display apparatus, 380F: display apparatus, 381: hole-injection layer, 382: hole-transport layer, 383B: light-emitting layer, 383G: light-emitting layer, 383R: light-emitting layer, 383: light-emitting layer, 384: electron-transport layer, 385: electron-injection layer, 389: layer, 400: display apparatus, 411*a*: conductive layer, 411*b*: conductive layer, 411*c*: conductive layer, 412G: organic layer, 412S: organic layer, 413: common electrode, 414: organic layer, 416: protective layer, 417: light-blocking layer, 418: spacer, 421: insulating layer, 422: resin layer, 430*b*: light-emitting element, 440: light-receiving element, 442: adhesive layer, 451: substrate, 452: substrate, 455: adhesive layer, 462: display portion, 464: circuit, 465: wiring, 466: conductive layer, 472: FPC, 473: IC, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing unit, 8305: lens, 8400: head-mounted display, 8401: housing, 8402: mounting portion, 8403: cushion, 8404: display portion, 8405: lens, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A display apparatus comprising:

a first pixel electrode over a first insulating layer;

a second pixel electrode over the first insulating layer;

a first organic layer over the first pixel electrode;

a second organic layer over the second pixel electrode;

a common electrode comprising a first portion overlapping with the first pixel electrode with the first organic layer positioned therebetween and a second portion overlapping with the second pixel electrode with the second organic layer positioned therebetween;

a protective layer covering the common electrode;

a spacer having a light-transmitting property with respect to visible light, the spacer comprising a portion overlapping with the first pixel electrode with the protective layer, the common electrode, and the first organic layer positioned therebetween; and a light-blocking layer over the spacer, the light-blocking layer having an opening overlapping with the first pixel electrode, wherein the first organic layer comprises a photoelectric conversion layer, and wherein the second organic layer comprises a light-emitting layer.

2. The display apparatus according to claim 1, wherein a top surface of the spacer has an island shape, and wherein the light-blocking layer is provided to cover part of the top surface of the spacer and a side surface of the spacer.

3. The display apparatus according to claim 1, wherein in a plan view, the opening of the light-blocking layer is positioned on an inner side than an outline of the first pixel electrode and positioned on an inner side than an outline of the first organic layer.

4. The display apparatus according to claim 1, further comprising a lens, wherein the lens is provided in a position that is over the spacer and overlaps with the first pixel electrode, wherein the lens overlaps with the opening of the light-blocking layer, and wherein the light-blocking layer covers an end portion of the lens.

5. The display apparatus according to claim 1, wherein the spacer is configured to transmit light of a first color and absorb light of a second color, and wherein the light-blocking layer is configured to absorb light of the first color and transmit light of the second color.

6. The display apparatus according to claim 5, wherein the light-blocking layer comprises a portion overlapping with the second organic layer, and wherein the second organic layer is configured to emit light including light of the second color.

7. The display apparatus according to claim 6, wherein the second organic layer is configured to emit white light.

8. The display apparatus according to claim 1, further comprising a second insulating layer, wherein the second insulating layer is provided to cover an end portion of the first pixel electrode and an end portion of the second pixel electrode, and wherein the first organic layer and the second organic layer each comprise a portion positioned over the second insulating layer.

9. The display apparatus according to claim 1, wherein a first side surface of the first organic layer and a second side surface of the second organic layer are provided to face each other, wherein an angle formed by the first side surface and a bottom surface of the first organic layer is greater than or equal to 45 degrees and less than or equal to 100 degrees, and wherein an angle formed by the second side surface and a bottom surface of the second organic layer is greater than or equal to 45 degrees and less than or equal to 100 degrees.

10. The display apparatus according to claim 9, further comprising a third insulating layer, wherein the third insulating layer comprises a first portion in contact with the first side surface and a second portion in contact with the second side surface, and wherein the third insulating layer comprises an inorganic insulating film.

11. The display apparatus according to claim 10, further comprising a resin layer, wherein the resin layer comprises a first portion overlapping with the first organic layer with the third insulating layer positioned therebetween and a second portion overlapping with the second organic layer with the third insulating layer positioned therebetween, and wherein the common electrode comprises a third portion positioned over the resin layer.

12. The display apparatus according to claim 11, wherein the spacer comprises a region positioned over the resin layer.

13. A display apparatus comprising:

a light-receiving element and a first light-emitting element over a substrate, wherein the light-receiving element comprises:

a first pixel electrode over a first insulating layer;

a first organic layer over the first pixel electrode;

a common electrode comprising a first portion overlapping with the first pixel electrode with the first organic layer positioned therebetween;

a protective layer covering the first portion of the common electrode;

a spacer having a light-transmitting property with respect to visible light, the spacer comprising a portion overlapping with the first pixel electrode with the protective layer, the common electrode, and the first organic layer positioned therebetween; and a light-blocking layer over the spacer, the light-blocking layer having an opening overlapping with the first pixel electrode, wherein the first light-emitting element comprises:

a second pixel electrode over the first insulating layer;

a second organic layer over the second pixel electrode;

the common electrode comprising a second portion overlapping with the second pixel electrode with the second organic layer positioned therebetween; and the protective layer covering the second portion of the common electrode, wherein the first organic layer comprises a photoelectric conversion layer, and wherein the second organic layer comprises a light-emitting layer.

* * * * *